(12) United States Patent
Twigg et al.

(10) Patent No.: US 7,439,764 B2
(45) Date of Patent: Oct. 21, 2008

(54) SYSTEMS AND METHODS FOR PROGRAMMING LARGE-SCALE FIELD-PROGRAMMABLE ANALOG ARRAYS

(75) Inventors: Christopher M. Twigg, Atlanta, GA (US); Paul E. Hasler, Atlanta, GA (US); Jordan D. Gray, Atlanta, GA (US); Ravi Chawla, Austin, TX (US)

(73) Assignee: Georgia Tech Research Corporation, Atlanta, GA (US)

( * ) Notice: Subject to any disclaimer, the term of this patent is extended or adjusted under 35 U.S.C. 154(b) by 123 days.

(21) Appl. No.: 11/383,709

(22) Filed: May 16, 2006

(65) Prior Publication Data

US 2006/0261846 A1 Nov. 23, 2006

Related U.S. Application Data

(63) Continuation-in-part of application No. 11/382,640, filed on May 10, 2006, now Pat. No. 7,269,046.

(60) Provisional application No. 60/681,715, filed on May 16, 2005, provisional application No. 60/686,559, filed on Jun. 2, 2005.

(51) Int. Cl.
    *H03K 19/173* (2006.01)
(52) U.S. Cl. .......................... 326/38; 326/41
(58) Field of Classification Search .............. 326/37–41
    See application file for complete search history.

(56) References Cited

U.S. PATENT DOCUMENTS

| | | | |
|---|---|---|---|
| 4,056,807 A | 11/1977 | Thornber | |
| 4,870,304 A | 9/1989 | Bloker et al. | |
| 5,930,175 A | 7/1999 | Lakhani et al. | |
| 5,949,250 A | 9/1999 | Schmidt et al. | |
| 5,959,871 A | 9/1999 | Pierzchala et al. | |
| 6,459,296 B2* | 10/2002 | Bradl et al. | 326/37 |
| 6,898,097 B2* | 5/2005 | Dugger et al. | 365/45 |
| 2003/0080776 A1* | 5/2003 | Kohno et al. | 326/39 |
| 2003/0183871 A1 | 10/2003 | Dugger et al. | |
| 2003/0229877 A1 | 12/2003 | Bersch et al. | |
| 2007/0046325 A1* | 3/2007 | Balasubramanian et al. | 326/38 |

OTHER PUBLICATIONS

International Search Report & Written Opinion for PCT Application No. PCT/US2006/18307 dated Dec. 20, 2007.
International Search Report & Written Opinion for related PCT Application No. PCT/US2006/19010 dated Dec. 21, 2007.

* cited by examiner

*Primary Examiner*—Don P Le
(74) *Attorney, Agent, or Firm*—Ryan A. Schneider, Esq.; Troutman Sanders LLP

(57) ABSTRACT

A large-scale field-programmable analog array (FPAA) for rapidly prototyping analog systems and an arbitrary analog waveform generator. The large-scale FPAA includes a floating-gate transistor array and a plurality of computational analog blocks (CABs), which may be adapted to set bias voltages for operational transconductance amplifiers (OTAs), adjust corner frequencies on the capacitively coupled current conveyors, set multiplier coefficients in vector-matrix multipliers, and a variety of other operations. The floating-gate transistors may be used as switch elements, programmable resistor elements, precision current sources, and programmable transistors. Accordingly, the floating-gate transistors within the array allow on-chip programming of the characteristics of the computational elements, while still maintaining compact CABs. The arbitrary analog waveform generator may include programmable floating-gate MOS transistors for use as analog memory cells to store samples of the waveforms.

15 Claims, 45 Drawing Sheets

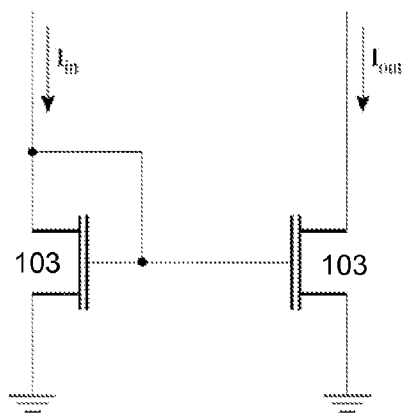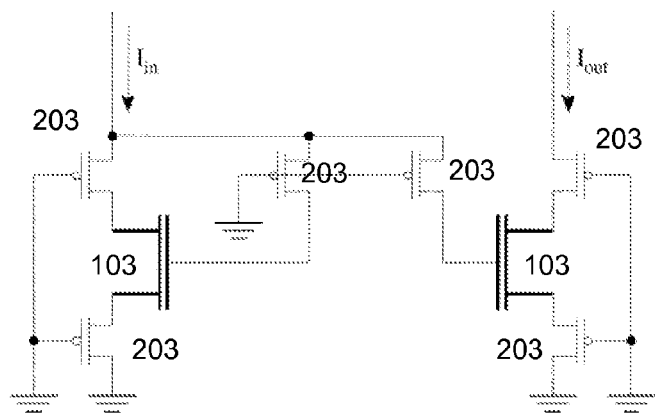
FIG. 2A  FIG. 2B

SYSTEMS AND METHODS FOR PROGRAMMING LARGE-SCALE FIELD-PROGRAMMABLE ANALOG ARRAYS

CROSS REFERENCE TO RELATED APPLICATIONS

This application is a continuation-in-part of U.S. patent application Ser. No. 11/382,640, filed on 10 May 2006, the entire contents of which are hereby incorporated by reference. This application also claims priority of U.S. Provisional Patent Application No. 60/681,715, filed 16 May 2005, and U.S. Provisional Patent Application No. 60/686,559, filed 2 Jun. 2005, the entire contents of which are hereby incorporated by reference.

BACKGROUND

1. Field of the Invention

The present invention relates to field-programmable analog arrays and, more particularly, to programming large-scale field-programmable analog arrays for use in analog circuitry.

2. Description of Related Art

Even in today's world of digital electronics, it is often desirable, or even necessary to use and process analog signals. For example, most audio files, while typically stored in digital form such as MP3s and compact disks, must be converted to an analog signal in order to be heard through a speaker. Additionally, many other types of equipment depend on analog signals.

Often it is desirable to process the analog signals, and it may even be desirable to store the analog signals electronically. Currently, circuits used for analog processing and storage have a long development cycle and are typically large. It would be useful to create analog circuitry that allows for flexible analog design in a compact package.

Generally, a field-programmable analog array (FPAA) is a programmable integrated circuit capable of implementing an enormous range of analog signal processing functions. The FPAA typically comprises a computational analog block (CAB) and an interconnect network, such that one FPAA may be distinguished from another by these two components. For the interconnect structure, an FPAA is most commonly connected by metal-oxide semiconductor (MOS) transistor switches driven by digital memory. Conventional alternatives to pass-FETs and transmission gates (T-gates) often provide increased bandwidth and include $G_m$-C amplifiers, 4-transistor transconductors, and current conveyors. Unfortunately, each of these alternatives trade area for improved switch characteristics and require an additional physical memory element for maintaining connectivity within the FPAA.

As the industry pushes toward shorter design cycles for analog integrated circuits, the need for an efficient and effective FPAA becomes paramount. Indeed, the role of analog integrated circuits in modern electronic systems remains important, even with the advent of digital circuits. Analog systems, for example, are often used to interface with digital electronics in applications such as biomedical measurements, industrial process control, and analog signal processing. More importantly, analog solutions may become increasingly competitive with digital circuits for applications requiring dense, low-power, and high-speed signal processing.

FPAAs provide a method for rapidly prototyping analog systems. FPAAs have been of interest for some time, but historically, these devices have had very few programmable elements and limited interconnect capabilities, making them limited in their usefulness and versatility. Currently available commercial and academic FPAAs are typically based on operational amplifiers (or other similar analog primitives) with only a few computational elements per chip. While specific architectures vary, their small sized and often restrictive interconnect designs leave current FPAAs limited in functionality and flexibility. For FPAAs to enter the realm of large-scale reconfigurable devices, such as modern field-programmable gate arrays (FPGAs), new technologies must be explored to provide area-efficient accurately programmable analog circuitry that may be easily integrated into a larger digital/mixed-signal system.

Indeed, the growing demand for complex information processing on portable devices has motivated significant research in the design of power efficient signal processing systems. One method for achieving low-power designs is to move processing on system inputs from the digital processor to analog hardware situated before the analog-to-digital converter (ADC). For analog systems to be desirable to digital signal processing engineers, however, the analog systems need to provide a significant advantage in terms of size and power and yet still remain relatively easy to use and integrate into a larger digital system. Reconfigurable analog arrays, dubbed field-programmable analog arrays (FPAAs), can speed the transition of systems from digital to analog by providing the ability to rapidly implement advanced, low-power signal processing systems, particularly signal processing utilizing programmable analog techniques.

Gene's law postulates that the power consumption in digital signal processing microprocessors, as measured in milliwatts per million multiply-accumulate (mW/MMAC) operations, is halved about every 18 months. These advances largely follow Moore's law, and they are achieved by using decreased feature size and other refinements, such as intelligent clock gating. Myriad applications only dreamed of a few years ago are possible because of these gains, and they have increased the demand for more advanced signal processing systems. Unfortunately, a problem looms on the horizon: the power consumption of the ADC does not follow Gene's law and will soon dominate the total power budget of digital systems. While ADC resolution has been increasing at roughly 1.5 bits every five years, the power performance has remained the same, and soon, physical limits will further slow progress. Most current signal processing systems that generate digital output place the ADC as close to the analog input signal as possible to take advantage of the computational flexibility available in digital processors.

For digital systems, an intermediate frequency signal processing system requires the use of an array of digital signal processors operating in parallel to meet desired speed requirements. This is a power intensive approach and makes use of certain communication schemes impractical in portable applications. The front-end analog-to-digital converter and back-end digital-to-analog converter required in these systems become expensive when the signal is of a wideband nature and high resolution is desired. One of the building blocks that would enable multiple analog signal processing applications is a programmable analog waveform generator. Unfortunately, no such analog waveform generator exists.

What is needed, therefore, is a system and method of effectively programming a floating-gate array, such as a large-scale FPAA, utilizing programmable floating-gate transistors as switches and/or computational elements. Further, what is needed is a system and method for building larger, more flexible FPAAs, so that reconfigurable analog devices will become more analogous to today's high-density field programmable gate array (FPGA) architectures. Moreover, what is needed is a programmable arbitrary waveform generator to enable implementation of more complex analog signal processing applications. It is to such systems and methods that the present invention is primarily directed.

BRIEF SUMMARY OF THE INVENTION

Briefly described, the present invention comprises a large-scale field-programmable analog array (FPAA) for rapidly prototyping analog systems. The present invention may be used in analog circuit development, for various methods of prototyping analog systems, and for analog modulator/demodulators using a programmable arbitrary waveform generator. The large-scale FPAA includes a floating-gate transistor array and a plurality of computational analog blocks (CABs), which may be adapted to set bias voltages for operational transconductance amplifiers (OTAs), adjust corner frequencies on the capacitively coupled current conveyors, set multiplier coefficients in vector-matrix multipliers, and a variety of other operations. The floating-gate transistors may be used as switch elements, programmable resistor elements, precision current sources, and programmable transistors. Accordingly, the floating-gate transistors within the array allow on-chip programming of the characteristics of the computational elements, while still maintaining compact CABs.

A notable feature of the present invention is the use of the transistors in the floating-gate transistor array as both switching elements for routing signals and as programmable elements for manipulating the signal being routed. By using the transistors as multi-purpose elements, greater flexibility may be achieved in implementing designs using the present invention.

In another embodiment of the present invention, a modulator/demodulator (PAMD) for analog signal processing applications is provided. The PAMD is implemented on a single chip architecture and is fully programmable, thereby allowing the PAMD to be used for a variety of communication schemes without specificity to a particular application. The PAMD includes an arbitrary analog waveform generator to generate waveforms, where programmable floating-gate MOS transistors may be used as analog memory cells to store samples of the waveforms.

These and other objects, features, and advantages of the present invention will become more apparent upon reading the following specification in conjunction with the accompanying drawings.

BRIEF DESCRIPTION OF THE FIGURES

FIGS. 2A-2B, collectively known as FIG. 2, are schematic diagrams illustrating a simple two-transistor current mirror and parasitic capacitance that results from using switches to form the current mirror in accordance with an exemplary embodiment of the present invention.

DETAILED DESCRIPTION OF PREFERRED EMBODIMENTS

Figure 1A:
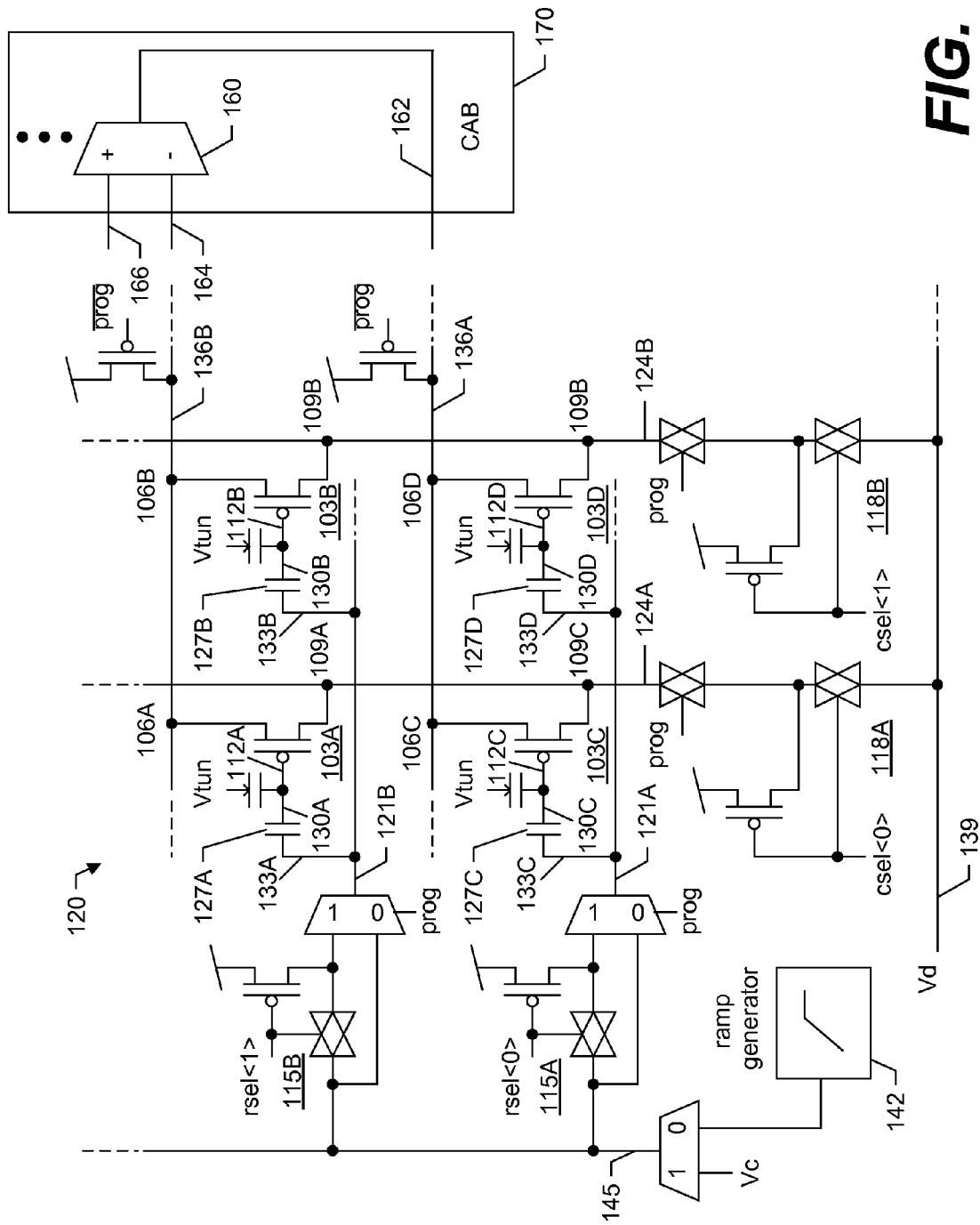
FIGS. 1A-1E, collectively known as FIG. 1, are diagrams illustrating a large-scale field-programmable analog array (FPAA) utilizing computational analog blocks (CAB) and floating-gate switches in accordance with an exemplary embodiment of the present invention.

Referring now in detail to the drawing figures, wherein like reference numerals represent like parts throughout the several views, FIG. 1 illustrates a large-scale field-programmable analog array (FPAA) 100 utilizing computational analog blocks (CAB) 170 and floating-gate switches 103 in accordance with an exemplary embodiment of the present invention. Traditionally, FPAAs are distinguished from one another by two basic components: a computational analog block (CAB) 170, and an interconnect network. A conventional FPAA's interconnect structure is most commonly connected by MOS transistor switches driven by digital memory. If T-gates are not introduced, the range of passable signals within an FPAA is dramatically smaller than the range of the power supply, because of the non-linear resistance of the MOSFET. Accordingly, in most conventional FPAAs, T-gate switches are introduced, thereby requiring additional space and potentially introducing parasitics. Although alternatives to pass-FETs exist to improve bandwidth, such as $G_m$-C amplifiers, 4-transistor transconductors, and current conveyors, these alternatives often trade area for improved switch characteristics and still require physical memory for maintaining connectivity.

Most conventional FPAA systems do not have programmable switches (i.e., adjustable conductance) and, therefore, a significant amount of space is required for a memory element for each switch device within the system. Conventional FPAA systems do not have programmable switches, because it would generally require that each transistor be surrounded with multiple programmable conductance switching components designed to isolate the transistor for programming. As the number of programmable transistors within an array increases, so would the number of switching components needed to isolate each of the transistors. Obviously, for each programmable transistor used within a conventional FPAA system, a predetermined and significant amount of space would be necessary on the chip for the multiple components.

By building larger, more flexible FPAAs 100, reconfigurable analog devices should become more analogous to today's high-density FPGA architectures. A large-scale FPAA 100 enables a very useful rapid prototyping system for analog circuit development. Indeed, analog floating-gate circuits have shown tremendous gains in efficiency (a factor as much as 10,000) compared with custom digital approaches for the same applications. Accordingly, analog floating-gate circuits may have tremendous gains in efficiency as compared with custom digital approaches for the same applications. These techniques not only off-load difficult tasks from the digital signal processor (DSP), but off-load the more difficult tasks from the analog-to-digital converter (ADC), which does not generally share the same scaling benefits as digital computation. Programmable analog techniques may be built upon floating-gate transistors utilizing FET transistors for non-volatile storage and references, programmable signal-path transistors, and signal processing algorithms.

The present invention removes the isolation switch components that would be coupled with each transistor and provides a single switch for each row and each column of an array 120, thereby greatly decreasing the amount of die space required to implement an FPAA system 100 with programmable switches. Programming a particular transistor, a row or column of transistors, or a subset of transistors may be accomplished using the present invention through selection programming.

The present invention also provides an improved FPAA system 100 utilizing a floating-gate programmable transistor 103 that may be used as a computational element, while maintaining a minimally sized switch element. The floating-gate transistor 103 described herein may be part of a floating-gate transistor array 120 used within the FPAA system 100.

As illustrated in FIG. 1A, the floating-gate transistor array 120 of the FPAA 100 may comprise a plurality of transistors 103, such that each transistor 103 includes a source 106, a drain 109, and a floating-gate 112. Generally, the floating-gate transistor array 120 may be configured to include at least two rows and at least two columns of transistors 103, thereby forming a traditional array configuration. Although FIG. 1A provides a floating-gate transistor array 120 having two columns of transistors 103 and two rows of transistors 103 (e.g., a 2×2 array of transistors 103), the present invention may include many additional rows and columns of transistors 103 or, alternatively, may include a two column, one row (2×1) or one column, two row (1×2) transistor configuration. Indeed, the dashed lines in FIG. 1A indicate that the illustrated floating-gate transistor array 120 is only a portion of a larger, more complete floating-gate transistor array 120. Accordingly, one skilled in the art will recognize that the present invention may be scaled to include many (e.g., millions) transistors 103.

The floating-gate transistor array 120 may also include a plurality of row programming switches 115 and a plurality of column programming switches 118, such that a row programming switch 115 exists for each row of transistors 103 within the floating-gate transistor array 120 and a column programming switch 118 exists for each column of transistors 103 within the floating-gate transistor array 120. Each row programming switch 115 includes an output 121 in communication with each transistor 103 of the corresponding row. Similarly, each column programming switch 118 includes an output 124 in communication with each transistor 103 of the corresponding column. More specifically, each drain 109 of each transistor 103 within a specific column is coupled to the output 124 of the corresponding column programming switch 118.

Further, the floating-gate transistor array 120 of the FPAA 100 may include a plurality of capacitors 127, for coupling the floating-gate 112 to the programming selection switch. Each capacitor 127 includes a first terminal 130 and a second terminal 133. The first terminal 130 of a capacitor 127 may be coupled with the floating-gate 112 of a corresponding transistor 103, while the second terminal 133 of the capacitor 127 may be coupled with the output 121 of the corresponding row programming switch 115. Accordingly, each floating-gate 112 of each transistor 103 within a specific row may be in communication with the output 121 of the corresponding row programming switch 115 via a capacitor 127.

The floating-gate transistor array 120 may additionally include a plurality of source lines 136, such that a source line 136 exists for each row of transistors 103. The source 106 of each transistor 103 within a specific row may be coupled to the corresponding source line 136, thereby connecting all of the sources 106 of the transistors 103 within a row.

A ramp generator 142 adapted to provide a voltage pulse or ramp may be incorporated within the floating-gate transistor array 120. The ramp generator 142 includes an output 145 that connects to the input of each row programming switch 115. The voltage pulse provided by the ramp generator 142, therefore, may be provided to selected rows of transistors 103 within the floating-gate transistor array 120. The ramp provided by the ramp generator 142 may be utilized by the saturation programming method (as described below) or sometimes by a rough programming method used to move the device into a proper programming range. Alternatively, an external ramp generator 142 may be used to supply a voltage pulse to the array.

An external voltage source, such as the voltage applied to the drain 109 of the transistor 103 (i.e., $V_D$), includes an output 139 coupled with the input of each column programming switch 118. Providing a pulse to this output 139 line is the usual method of programming, when given a fixed source voltage 106 and gate voltage 121. Accordingly, the drain 109 for each transistor 103 may be pulled to the external voltage source for selection purposes during programming (as described below).

The present invention provides for programming a single floating-gate transistor 103, a whole row or column of floating-gate transistors 103, or a subset of floating-gate transistors 103 within a row or column. For exemplary purposes only, to select a single floating-gate transistor 103A for programming (as shown in FIG. 1A), the row selection switch 115B having an output 121B coupled with the desired floating-gate transistor 103A is activated. Also, the column selection switch 118A having an output 124A coupled with the desired floating-gate transistor 103A is activated. The point where the output 121A of the row selection switch 115B intersects with the output 124A of the columns selection switch 118A is the location of the desired floating-gate transistor 103A within the array 120.

In another example using FIG. 1A, a complete row of floating-gate transistors 103C, 103D may be selected for programming by activating the row selection switch 115A corresponding to the row desired for programming. Alternatively, a complete column of floating-gate transistors 103B, 103D may be selected for programming by activating the column selection switch 118B corresponding to the column desired for programming.

A subset of floating-gate transistors 103 within a row or column may be selected for programming by first activating the row selection switch 115 or column selection switch 118 corresponding to the row or column including the subset of floating-gate transistors 103. This technique utilizes a combination of the methods described above. Next, a row or column selection switch 115, 118 is activated for every intersection of the selected row or column that represents the location of a floating-gate transistor 103 included in the subset.

The large-scale FPAA 100 may also include a CAB 170 having a first input terminal 166 and a second input terminal 164, such that the first input terminal 166 is coupled to a source line corresponding to a first row of floating-gate transistors 103 and the second input terminal 164 is coupled to a source line corresponding to a second row of floating-gate transistors 103. Further, the CAB 170 may include an output terminal 162 coupled with a source line corresponding with a third row of floating-gate transistors 103. As described more fully below, a CAB 170 generally includes a plurality of computational blocks. In the present invention, a CAB 170 typically includes a mixture of fine-grained, medium-grained, and course-grained computational blocks, thereby providing more enhanced functionality. As explained above, each terminal of each CAB 170 component is coupled to a unique row of the floating-gate transistor array 120.

The state in which the charge on the floating-gate transistors 103 may be modified is referred to as the "programming" mode. In programming mode, all of the source lines 106 are pulled up to the power supply by a pFET. The drain lines 109 are also pulled up to $V_{DD}$ by a pFET until selected for programming. If it is determined that the switch is desired for programming, then the drain line 109 of the switch is connected to an external voltage source 139, such as the drain voltage $V_D$. Next, the gate input lines are also switched between an external potential (e.g., the gate voltage $V_G$) and $V_{DD}$, depending upon the selection circuitry used for programming.

Figure 1B:
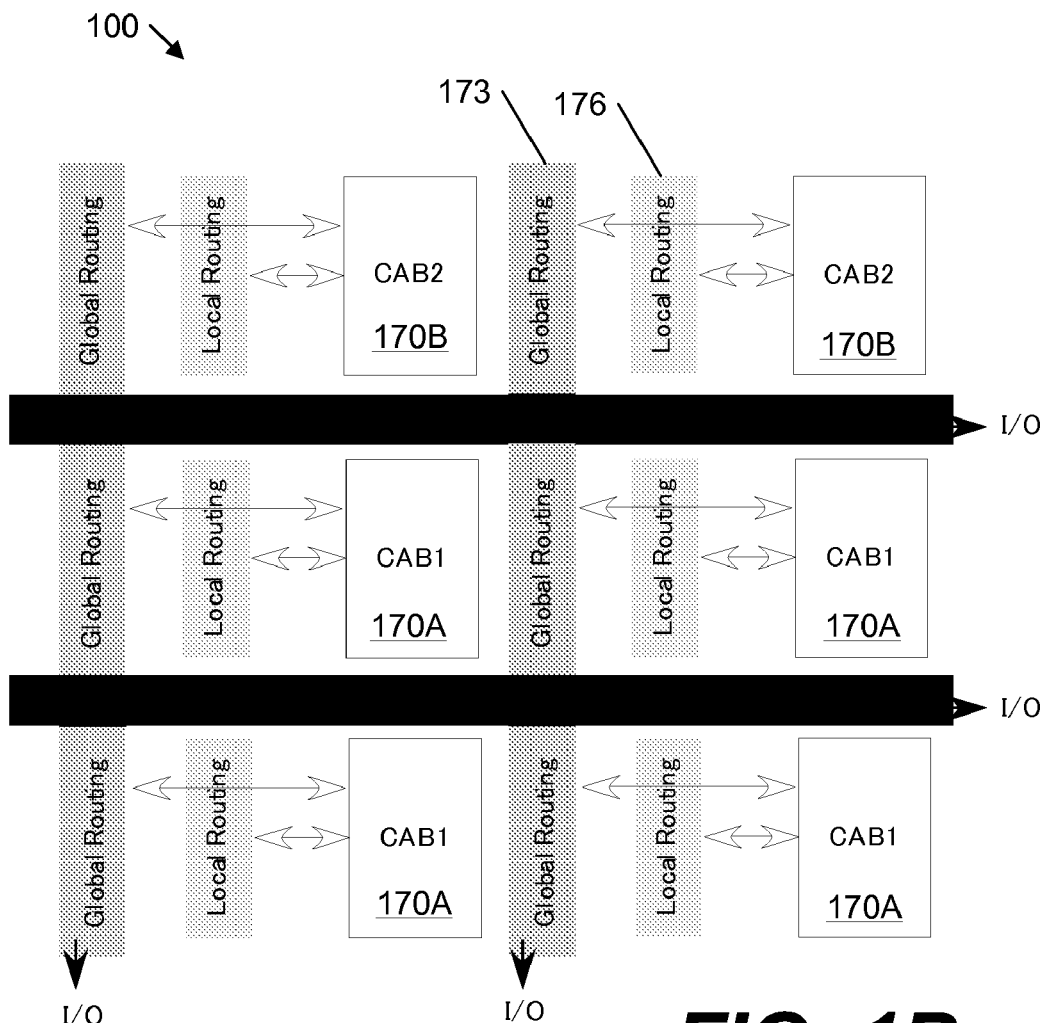

An important first step in injecting floating-gate pFET arrays is device isolation. Device isolation is achieved by driving only one pFET 103 at a time with both the source-drain voltage ($V_{SD}$) and the source-gate voltage ($V_{SG}$) necessary to turn the device "on". The transistor 103 of the selected switch may now be programmed using hot-electron injection. Given this architecture, isolation may be maintained until the conduction level of any pFET 103 along the column exceeds that which can be shut-off by connecting the gate input voltage to $V_{DD}$. FIG. 1D illustrates a programming timing diagram corresponding to the programming of a floating-gate transistor 103 within the FPAA 100.

The present invention also provides a unique method of programming the transistor components of the FPAA 100 by utilizing saturation techniques, instead of conventional pulse and measure methodology. Conventional hot-electron injection requires pulsing of the transistor 103 with a current for a short period of time and then measuring the programmed current to determine if the desired current has been reached. Such a process is slow and requires isolation of the transistor 103, thereby removing it from the operational circuitry.

The present invention, however, uses the relationship between the gate voltage and the saturation point of the transistor 103 to accurately program the desired current of the transistor 103. During use, the saturation programming method applies a predetermined voltage signal to the drain of the transistor 103 until a charge on the floating-gate 112 of the transistor 103 reaches a predetermined value that is within a relational tolerance of the original voltage applied to the floating-gate 112. No measuring of the current, therefore, is necessary during programming. FIG. 1E illustrates a programming timing diagram corresponding to the programming of a floating-gate transistor 103 within the FPAA 100 using the "saturation" methodology. Programming floating-gate transistors within a floating-gate array 120 is more fully described in U.S. patent application Ser. No. 11/382,640.

Large-Scale FPAAs 100 of the present invention provide for rapid prototyping of analog systems. Conventional methods of designing analog integrated circuits include lengthy processes which may take over a year, if multiple iterations of a design are fabricated. Rapid prototyping of analog circuits offers significant benefits in the design and testing of analog systems. As FPAAs 100 are functionally the analog equivalent to digital reconfigurable devices such as programmable logic devices (PLDs) and field-programmable gate arrays (FPGAs), FPAAs 100 provide a viable platform for rapid prototyping of analog systems.

While traditional FPAAs 100 closely resemble early PLDs by focusing on small systems such as low-order filtering, amplification, and signal conditioning, the large-scale FPAAs 100 of the present invention may be more analogous to modern FPGAs. The large-scale FPAAs 100 may include a significant number of basic analog blocks (e.g., operational transconductance amplifiers, transistor elements, capacitors, etc.) that assist in providing the functionality used to implement high-level system blocks such as programmable high-order filtering and Fourier processing.

As mentioned above, the CABs 170 of the large-scale FPAA 100 may have multiple computational blocks having different granularity. FIG. 1B illustrates the large-scale FPAA 100 having a CAB array that may be interconnected through local and global switch matrices. Generally, two types of CABs 170 comprise the array: a general purpose CAB 170A and a vector-matrix multiplier (VMM) CAB 170B. The components within the CAB 170 may be chosen to provide a mixture of analog granularity, from higher level processing circuits to basic transistors.

Figure 1C:
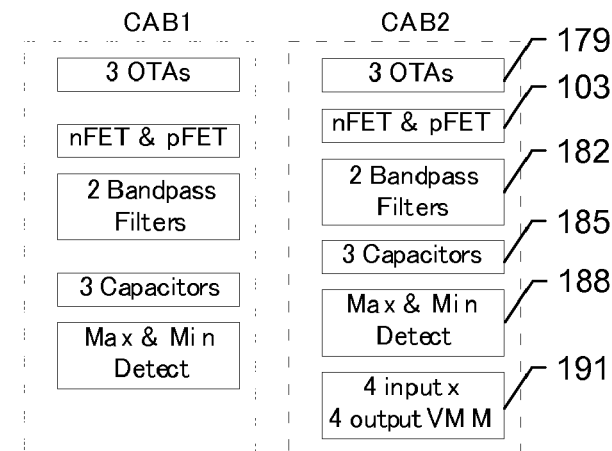
Figure 1D:
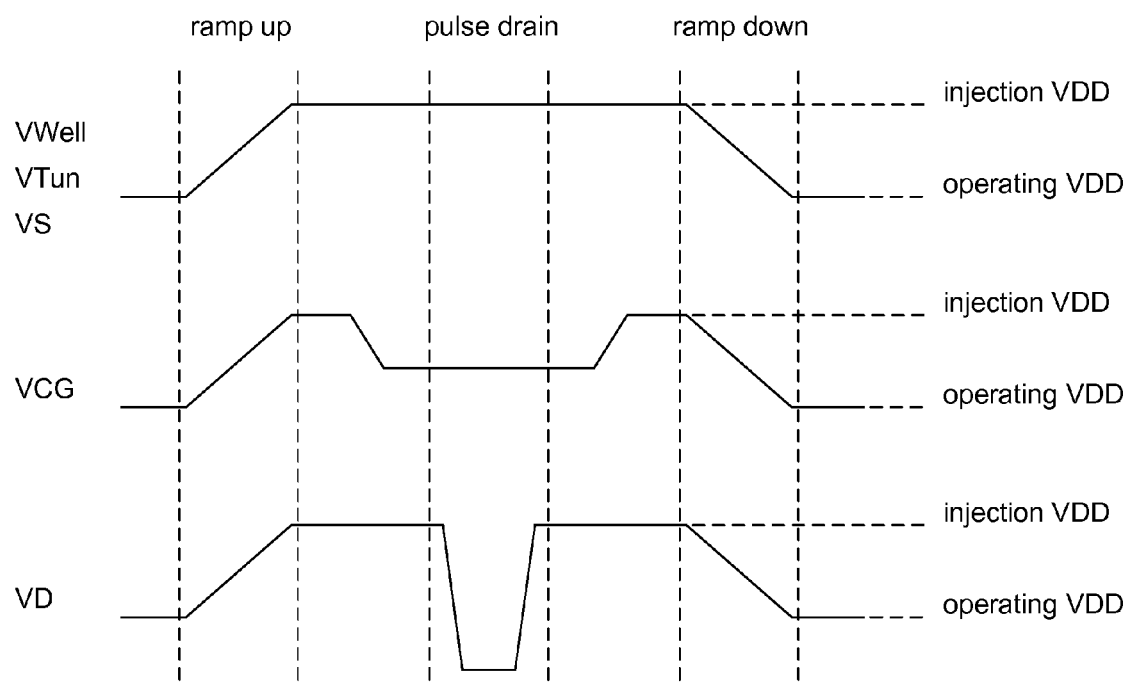
Figure 1E:
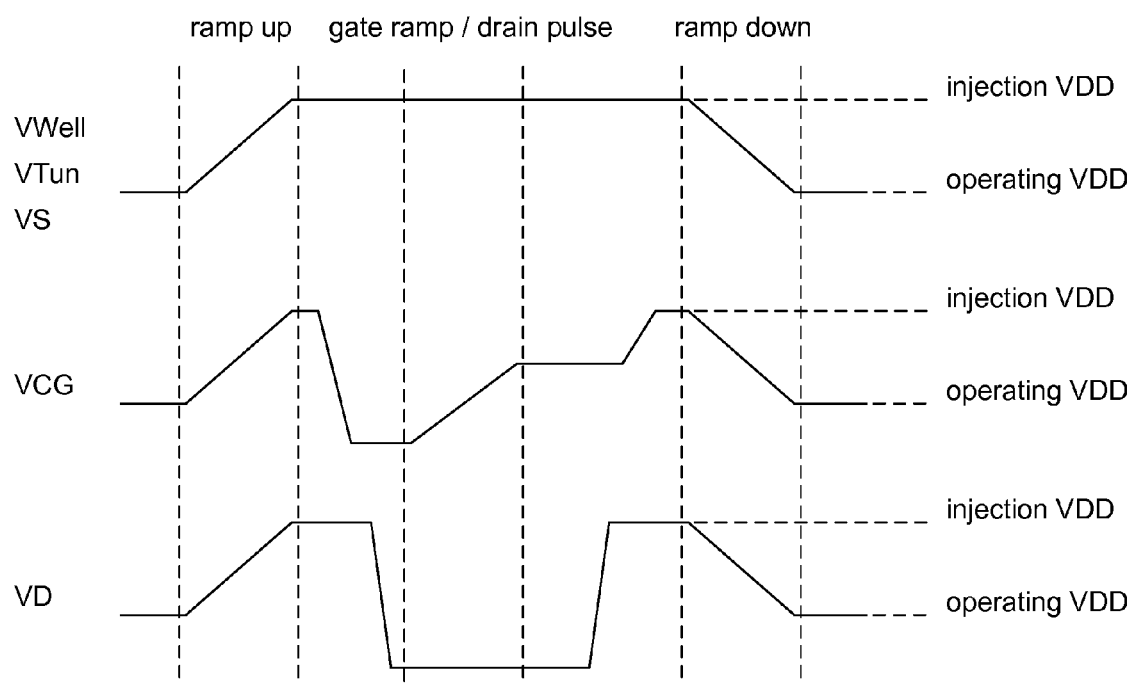

As shown in FIG. 1C, both CAB types may contain three capacitors 185 (two of which have a grounded terminal), an nFET transistor 103, a pFET transistor 103, three OTAs 179 with programmable bias currents, two $C^4$ programmable bandpass elements 182, and a programmable min/max amplitude detector 188. In addition to these components, the VMM CAB 170B may also comprise a 4×4 vector matrix multiplier 191.

The top and bottom CAB rows in the large-scale FPAA 100 may be composed of VMM CABs 170B, while the middle rows contain general purpose CABs 170A. Connections within and between the CABs 170 may be implemented through floating-gate switches, which connect the various component terminals to local and global routing lines 173, 176.

In run mode, the switches of the FPAA 100 connect the various components within desired circuits. Once characterized, these circuits may be used for rapid system prototyping. Rapid prototyping of analog systems, however, is not completely analogous to a corresponding digital system. Accordingly, the development of robust, programmable analog circuits presents a number of challenges not found in digital systems. For example, noise sensitivity including the effects of the switch network on the results of a computation, and the design space to which programmable devices are applicable present more complicated factors in designing large-scale FPAAs 100. Each of these issues needs to be addressed in order to provide a more useful large-scale FPAA 100.

Analog circuits tend to be more sensitive to noise than digital designs. Indeed, digital designs may tolerate a relatively large amount of noise in the system without affecting the precision of the result, because of the quantization and resulting representation of ones and zeros as discrete voltages. Rare problems arise in digital systems generally when noise levels are high enough to move a signal from a logical one to a logical zero or vice versa. For analog systems, however, values are generally represented as continuous voltages or currents. Accordingly, any noise introduced into the system directly affects the precision of the result. For reconfigurable analog systems that rely on networks of switches to set the internal signal paths, the parasitics introduced by the switches may affect the result of the signal, which directly influences the performance of the FPAA 100.

To illustrate noise sensitivity of analog systems, FIG. 2A provides a simple two-transistor current mirror. To incorporate this current mirror within a conventional FPAA, switches 203 are introduced at the gate, source, and floating-gate (e.g., signal paths) of each transistor 103, as shown in FIG. 2B. Adding switches 203 in the signal path of an analog system, however, may introduce adverse effects including the addition of parasitic capacitance, resistance, and transistor leakage currents to the path. Such increased capacitance and resistance on a signal line generally lowers the bandwidth of the system.

More specifically, FIG. 2B illustrates the current circuit of FIG. 2A with switches 203 added to the signal paths as would be configured if the current mirror were synthesized on an FPAA using MOSFET transistors in a computational analog block (CAB). In this case, there should not be any current flow between the gate nodes, so the voltage should remain equal on the two gate nodes even with the switches 203 in the signal path. Other circuits that have switches 203 in a signal path with current flowing through them may have a voltage drop across the transistor 103 that may vary nonlinearly. As the number of switches 203 in a given circuit increases, the performance and functionality of the circuit will degrade significantly.

To address noise sensitivity, the present invention provides for the addition of routing capacitance to the large-scale FPAA 100, by connecting additional routing lines 173, 176 to the signal path. Routing connectivity for each floating-gate transistor 103, therefore, includes a local and global routing line 173, 176.

With respect to design space, reconfigurable analog and digital devices may be encompassed with different design spaces. Functionality in the digital domain may be reduced to a basic set of combinational and sequential primitives. For example, a NAND gate may be configured to implement any of the other Boolean logic gates. Thus, with a sufficiently large number of NAND gates, any combinational logic function may be achieved. Similarly, an asynchronous read-only memory (ROM) primitive may be used to implement any combinational function. For sequential functions, any basic storage element (e.g., flip-flop or latch) may be used to provide the necessary memory. Most modern FPGAs use asynchronous ROMs to synthesize the combinational logic, while using D-type flip-flops for implementing the memory/sequential logic. Thus, by replicating these two basic primitives thousands of times across a chip (and a sufficient routing network), an FPGA may be created that synthesizes a very large number of different digital systems.

Unfortunately, a sufficiently generic set of medium-grained building blocks (on the same order of complexity as flip-flops or asynchronous ROMs) do not exist for synthesizing a wide-range of analog circuits. To achieve the desired generality in analog circuits, fine-grain building blocks, such as transistors, resistors, diodes, and capacitors are used. Indeed, a large number of analog systems are built with these basic blocks.

These primitives, however, are so fine-grained that it requires a large number of components—and thus a large number of switches—to implement a design. As explained above, the large number of switches introduces parasitics that significantly degrade the performance of the analog circuit.

Figure 3A:
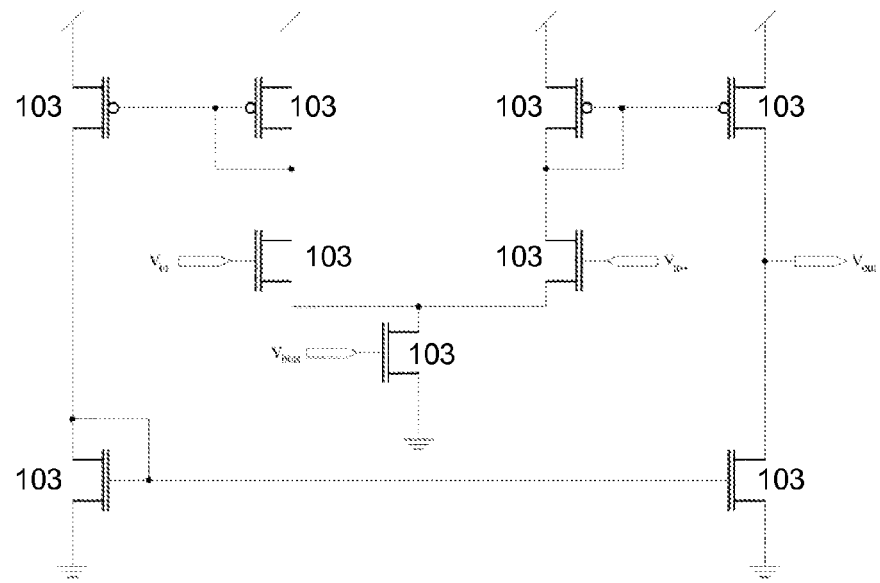
FIGS. 3A-3B, collectively known as FIG. 3, are schematic diagrams illustrating a basic operational transconductance amplifier (OTA) circuit and switches necessary to implement the circuit on a fine-grain FPAA with only transistors in accordance with an exemplary embodiment of the present invention.
Figure 3B:
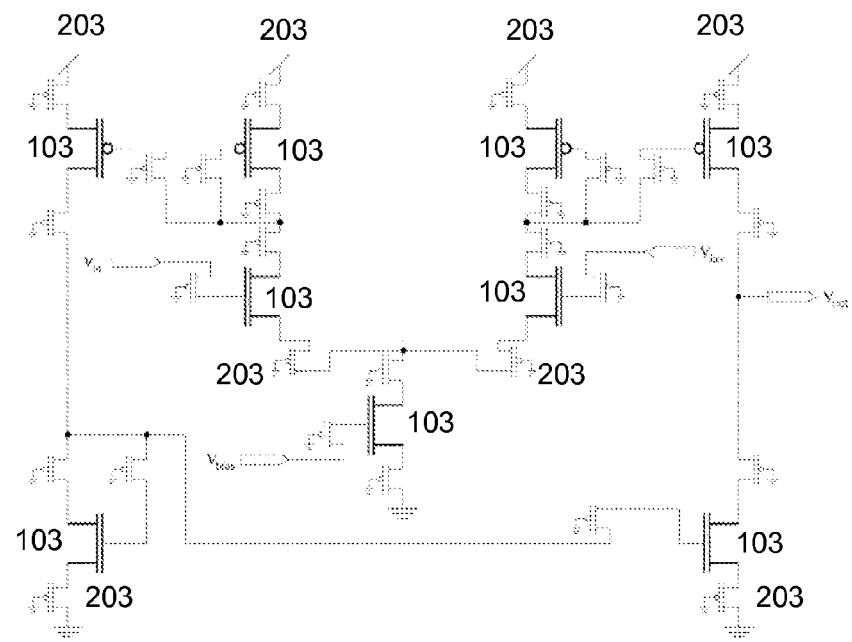

To illustrate the design space problem for analog systems, FIGS. 3A-3B provide a basic operational transconductance amplifier (OTA) 179 circuit and the switches 203 necessary to implement the circuit on a fine-grain FPAA 100 using only transistors 103. More specifically, FIG. 3A shows a circuit diagram for a basic 9-transistor OTA 179, while FIG. 3B illustrates the same OTA 179 with the switches 203 necessary to synthesize the circuit on a fine-grained FPAA 100. The fine-grained FPAA 100 design requires at least twenty-seven switches 203, in addition to the nine transistors 103, to implement the desired OTA 179. As described above, the switches 203 may drastically affect the performance and functionality of the OTA 179 and may break the analog circuit. In order to mitigate these effects, courser-grained blocks should be used. The use of course-grain blocks is implemented while still maintaining sufficient flexibility, functionality, and generality. Course-grain blocks may provide increases in performance and robustness, over fine-grain blocks, but if the basic building blocks of the FPAA 100 are of too high a level, then the flexibility may be greatly diminished.

To ensure flexibility, the CABs 170 of the present FPAA 100 includes a wide range of fine-grained, medium-grained, and course-grained components. Consequently, there will often be more than one way of synthesizing the same system on the FPAA 100. Such a configuration provides the most flexibility to end-users, because the levels of performance, utilization, flexibility, and complexity may be varied.

Conventional FPAAs are often of small size and lack generality, thereby making them somewhat limited in application. The switches 203 used in FPAAs are very important, because the signals are affected by any non-ideal characteristics. An ideal switch 203 has zero impedance when the switch 203 is "on" and infinite impedance when the switch 203 is "off." Also, for practical purposes, the switch should also be small and easily controlled.

The present invention provides for a large-scale FPAA 100 that address the complex design space that analog designs entail (including a wide-range of linear and nonlinear functions), while keeping switch parasitics (e.g., noise) minimized. The switches 203 used in the present invention are based on floating-gate transistors 103 and may be used to approximate the ideal switch. Additionally, the floating-gate switches 103 may be programmed to states between "on" and "off," thereby synthesizing a finite resistance. Such switches 103 of the present invention, therefore, may be used as a resistive circuit element within the design.

Figures 4A, 4B, 4C:
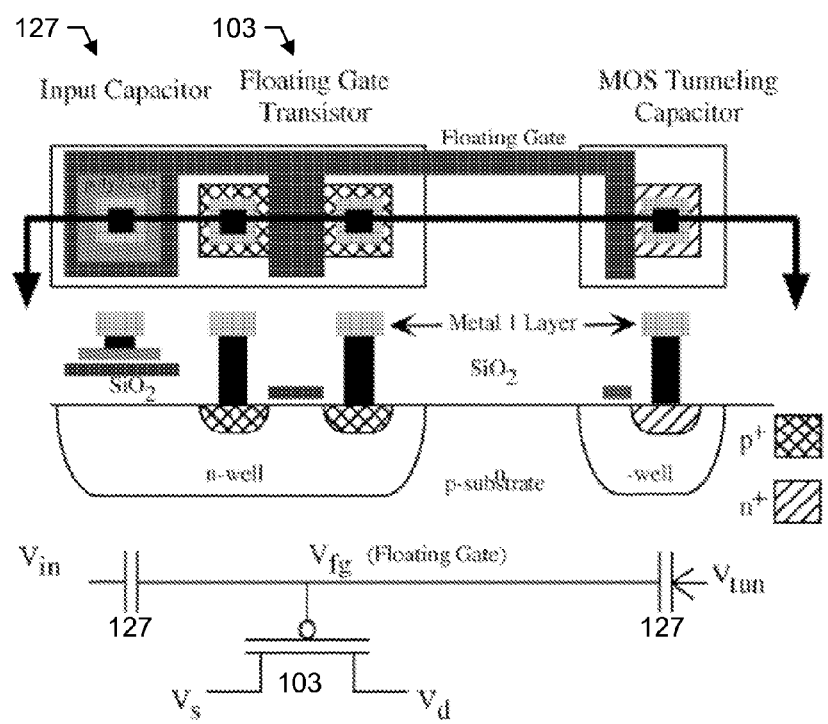
FIGS. 4A-4C, collectively known as FIG. 4, are diagrams illustrating a layout, cross-section, and circuit symbol for a floating-gate transistor device in accordance with an exemplary embodiment of the present invention.

The switches 103 used in the large-scale FPAA 100 may be standard pFET devices having gate terminals that are indirectly connected to signals through capacitors (e.g., no direct current path to a fixed potential). FIG. 4 shows a layout (FIG. 4A), cross-section (FIG. 4B), and schematic diagram (FIG. 4C) for a floating-gate transistor device 103. The gate terminal of the floating-gate pFET device may be well insulated from external signals. Such insulation allows the floating-gate pFET to maintain a permanent charge, and thus be used as an analog memory cell similar to an EEPROM cell. The current through the pFET channel is dependent on the charge of the floating-gate node. Accordingly, hot-electron injection and electron tunneling may be used to decrease or increase the charge on the floating-gate node, thereby accurately controlling the current flow through the pFET channel.

Figure 5:
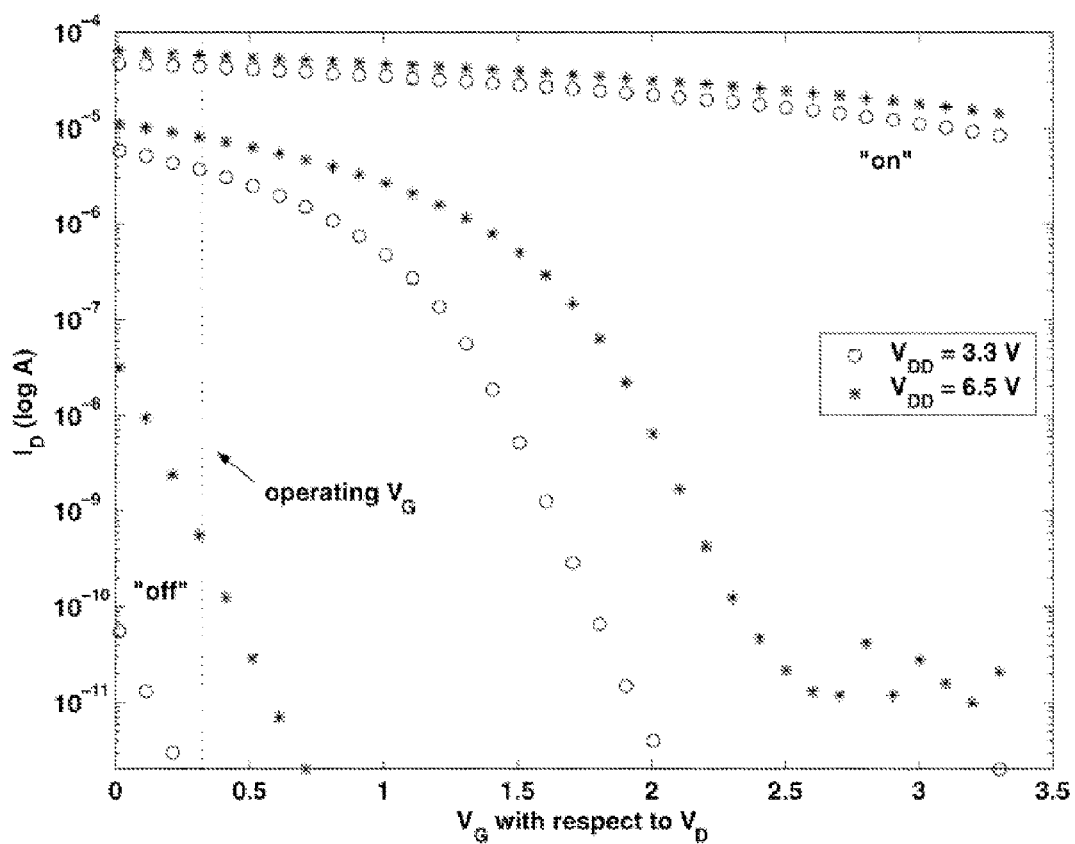
FIG. 5 is a chart illustrating current measurements for floating-gate switches in accordance with an exemplary embodiment of the present invention.

To increase the quality of each switch, the floating-gate transistors may be programmed to the far extremes of their range. When switches are being programmed to the "off" state, minimal currents, such as in the low femtoampere range, may be measurable. These measurements are generally near the limits of the standard laboratory equipment. Current measurements, therefore, are taken at a larger drain-to-source voltage, in order to extend the viable programming range. Typically, the drain-to-source voltage ($V_{DS}$) is set to the supply voltage ($V_{DD}$), and an increase in $V_{DS}$ is achieved by increasing $V_{DD}$. FIG. 5 illustrates current measurements for floating-gate switches. One skilled in the art will recognize that the current measurements provided in FIG. 5 are for exemplary purposes only and, therefore, the chart in FIG. 5 is intended to provide a better understanding of the invention, without limiting the scope of the invention. As shown in FIG. 5, measuring the currents with $V_{DD}$=6.5 V, allows the I-V curves to be visible to the programming infrastructure one volt below the point visible when $V_{DD}$=3.3V.

For simplicity, the voltages on the gate capacitors of all the switches may be set to a constant potential. This means that the voltage driving the gate capacitors should be the same for both "on" and "off" switches. To determine the appropriate gate voltage for run mode, the relative quality of "on" and "off" switches should be balanced. As illustrated in FIG. 5, the "off" switches do not pose a problem, because any gate voltage selected at or above 0.3V should provide sufficiently high impedance. The "on" switches, however, exhibit a decrease in quality as the gate voltage is increased to $V_{DD}$. Thus, an operating gate voltage of 0.3 V may be deemed appropriate for the current programming scheme. During programming, currents may be measured with V=3.3 V for large currents and V=6.5 V for small currents, such that the programming range of the device is effectively extended.

The FPAA 100 design of the present invention may use floating-gate elements as switch elements and as programmable resistor elements. Further, the FPAA 100 designs may include precision current sources and programmable transistors 103. Such a configuration, results in a very compact architecture that reduces the number of individual circuit elements, while simplifying the signal routing and retaining functionality.

When used as a switch, the floating-gate should be as transparent a part of the circuit as possible. FIG. 5 shows, however, that the floating-gate transistor 103 can also be used as an in-circuit element (e.g., a computational element). By adjusting the charge on the floating-gate node between the extremes used for the "on" and "off" states, the impedance of the switch can be varied over several orders of magnitude. Accordingly, a variable nonlinear resistor may be synthesized by the floating-gate switch.

Indeed, using the floating-gate switches as in-circuit elements allows for a very compact architecture. The physical design area needed for the CABs 170 is reduced greatly, because the present invention eliminates the need for resistors (which consume relatively large amounts of space on CMOS processes) as separate components. Also, by reducing the number of individual circuit elements, signal routing is simplified, while retaining functionality.

Conventional FPAA designs often rely on switches as the primary or sole programmable element on the chip. Biases, multiplier coefficients, resistances, and similar elements are set via off-chip components or with capacitor banks or current mirror banks. The ability to modify or program the actual analog computational logic, therefore, may be severely limited. The present invention utilizes floating-gate transistors 103 within the computational logic, thereby allowing direct modification of circuit characteristics.

Moreover, floating-gate transistors 103 may be used within the CABs 170 to set bias voltages for the OTAs 179, adjust the corner frequencies on the capacitively coupled current conveyors, and set multiplier coefficients in the vector-matrix multipliers 191. In this manner, the floating-gate transistors 103 allow the characteristics of the computational elements to be programmed on-chip, while still maintaining a compact CAB 170. By allowing both the switch networks and the computational logic to be programmable, the flexibility and usability of the FPAA 100 is greatly enhanced over previous designs.

The present invention may utilize floating-gate devices as the only programmable element on the chip, thereby greatly simplifying the configuration of the chip. Additionally, all of the floating-gate transistors 103 may be clustered together to aid in the programming logic and signal routing. Decoders on the periphery of the circuit may be connected to the drain, source, and (through a capacitor) gate terminals of the floating-gate matrix. During programming mode, these decoders allow each floating-gate transistor to be individually programmed using hot-electron injection.

Figures 6A, 6B:
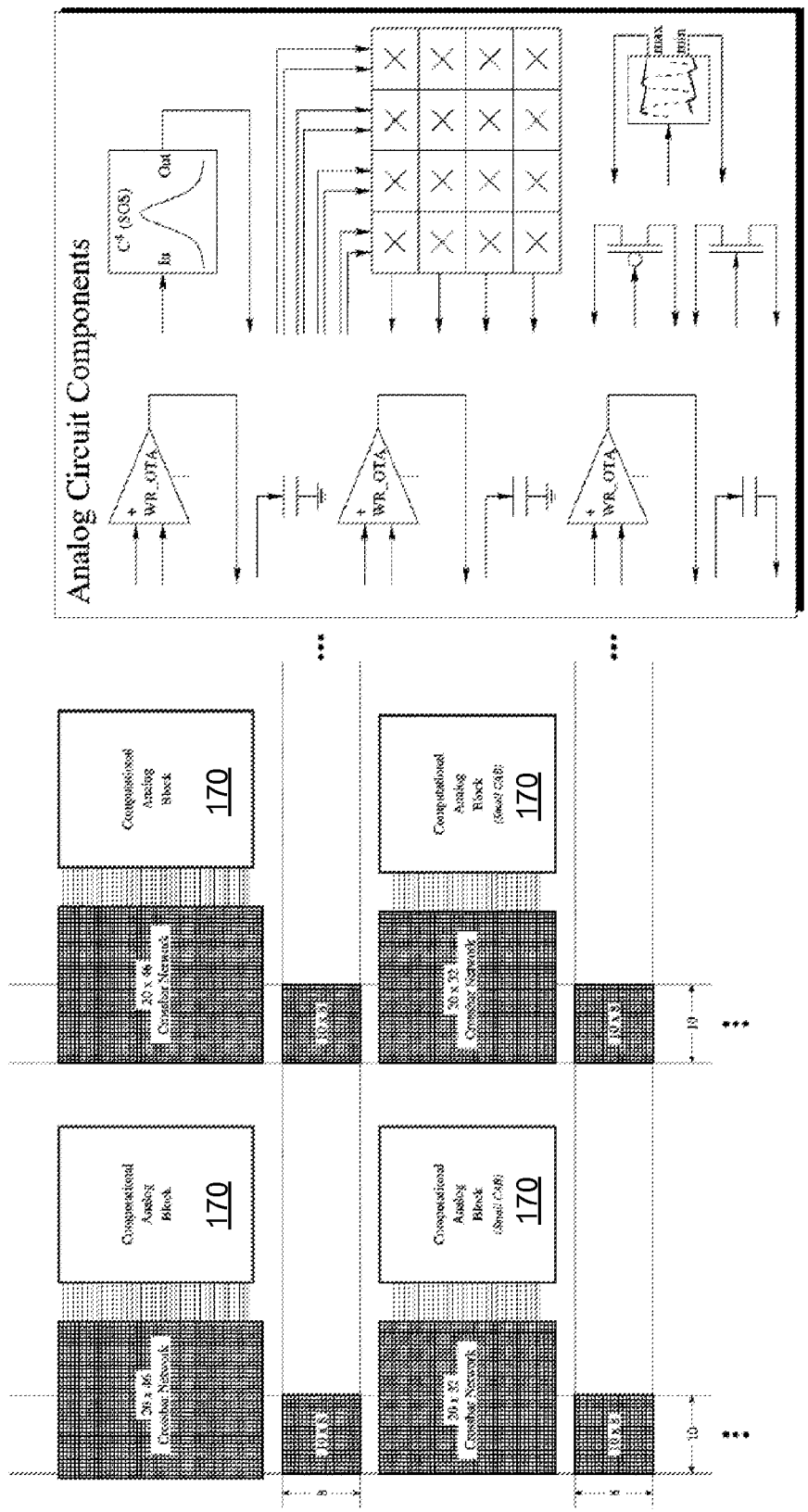
FIGS. 6A-6B, collectively known as FIG. 6, are a block diagram and schematic illustrating the routing architecture of a large-scale FPAA in accordance with an exemplary embodiment of the present invention.

FIGS. 6A-6B illustrate the routing architecture of large-scale FPAAs 100 as a combination of global and local switch networks. The routing architecture assists in the implementation of desired systems utilizing the FPAA 100. Each CAB 170 may have an associated local switch network for making connections within a single CAB 170. The switches' source lines may be routed along the rows and connect the inputs and outputs of each CAB 170 to the switch network. The drain lines of the switches may be connected along the columns. By turning a switch on, a single row (source) may be connected through the switch to a single column (drain).

The size of the switch network is dependent on the number of I/O lines in each CAB 170. For the design shown in FIG. 6, there are two exemplary types of CABs 170. For the larger CABs 170, the local switch networks may be comprised of a 10×42 matrix of switches, and for the smaller CABs 170, the local switch networks may be comprised of a 10×32 matrix of switches. Each local switch network may be integrated into a matching global routing switch network. The global routing switch network allows local signals from a CAB 170 to be connected to the global routing busses 173 and be routed off the chip or to another CAB 170. There may also be 10×8 switch networks at each junction of the horizontal and vertical global routing busses 173.

The computational logic of the present invention may be organized in a compact CAB 170 providing a naturally scalable architecture. CABs 170 may be tiled across the chip in a regular, mesh-type architecture with busses and local interconnects in-between, as shown in FIG. 6A.

Many exemplary CABs 170 may be imagined using this technology. For example, FIG. 6B shows one exemplary CAB 170 having enhanced functionality by a mixture of fine-grained, medium-grained, and coarse-grained computational blocks similar to many modern FPGA designs. The computational blocks should be carefully selected to provide a sufficiently flexible, generic architecture while optimizing certain frequently used signal processing blocks. For generality, three OTAs 179 are included in each CAB 170. An OTA 179 may be effective for implementing a large class of systems including amplification, integration, filtering, multiplication, exponentiation, modulation, and other linear and non-linear functions. In addition, the two FET devices may provide the ability to perform logarithmic and exponential functions as well as convert back and forth between current and voltage.

The three capacitors 185 may be fixed in value to minimize the size of the CAB 170 and may be primarily used on the outputs of the OTAs 179, but they can be available for any purpose. The variable capacitor and/or current mirror banks found in some designs are not needed here, because the use of floating-gate transistors in the OTAs 179 should give the user sufficient control in programming the transconductance of the amplifiers. Eliminating the need for large capacitor banks creates a large savings in the design area required for each CAB 170.

For example and not limitation, the high-level computational blocks used in the present invention may be second-order section (SOS) bandpass filter modules 182 comprised of two capacitively coupled current conveyors ($C^4$) and a 4×4 vector-matrix multiplier block 191. In general, the $C^4$ SOS module provides a straightforward method of subbanding an incoming signal. Accordingly, Fourier analysis may be performed with results analogous to performing a fast Fourier transform (FFT) in the digital domain. The vector-matrix multiplier block 191 allows the user to perform a matrix transformation on the incoming signals. Together these blocks can be used like a Fourier processor. In addition, a peak detector may be added to each CAB 170. The peak detector allows the amplitude to be extracted from the incoming waveform and is useful for doing static or dynamic gain adjustments on individual subbands of the incoming signal.

As illustrated in FIG. 6A, the architecture may be nonhomogeneous in that there are two different CABs 170 tiled across the chip. The small CAB 170 may be identical to the large CAB 170, except that the small CAB 170 does not include the vector-matrix multiplier module 191. Designs will typically only utilize one vector-matrix multiplier for every four CABs 170, because the vector-matrix multiplier 191 generally requires four inputs, wherein each input is often derived in a separate CAB 170 (from a separate subband created by the $C^4$ SOS module). FPAAs 100 that have 50 to 100 CABs 170, therefore, may be made more compact by removing the vector-matrix multiplier 191 from all the CABs 170 except those on the top and bottom rows (assuming the FPAA 100 is more or less square in design). Alternatively, the vector-matrix multipliers 191 in some of the CABs 170 may be replaced with other specialized circuits to increase functionality and performance for a targeted application.

An exemplary FPAA 100 design is provided to characterize the switches, computational logic, and programming infrastructure of the large-scale FPAAs 100 of the present invention. One skilled in the art will recognize, however, that the example FPAA 100 is provided for a better understanding of the invention, without limiting the scope of the invention, and that the present invention provides for the design of other large-scale FPAAs 100. The exemplary FPAA 100 design to be examined includes two CABs 170 connected by a floating-gate crossbar switch network. The CABs 170 are similar to the large CAB 170 illustrated in FIG. 6B.

Figure 7:
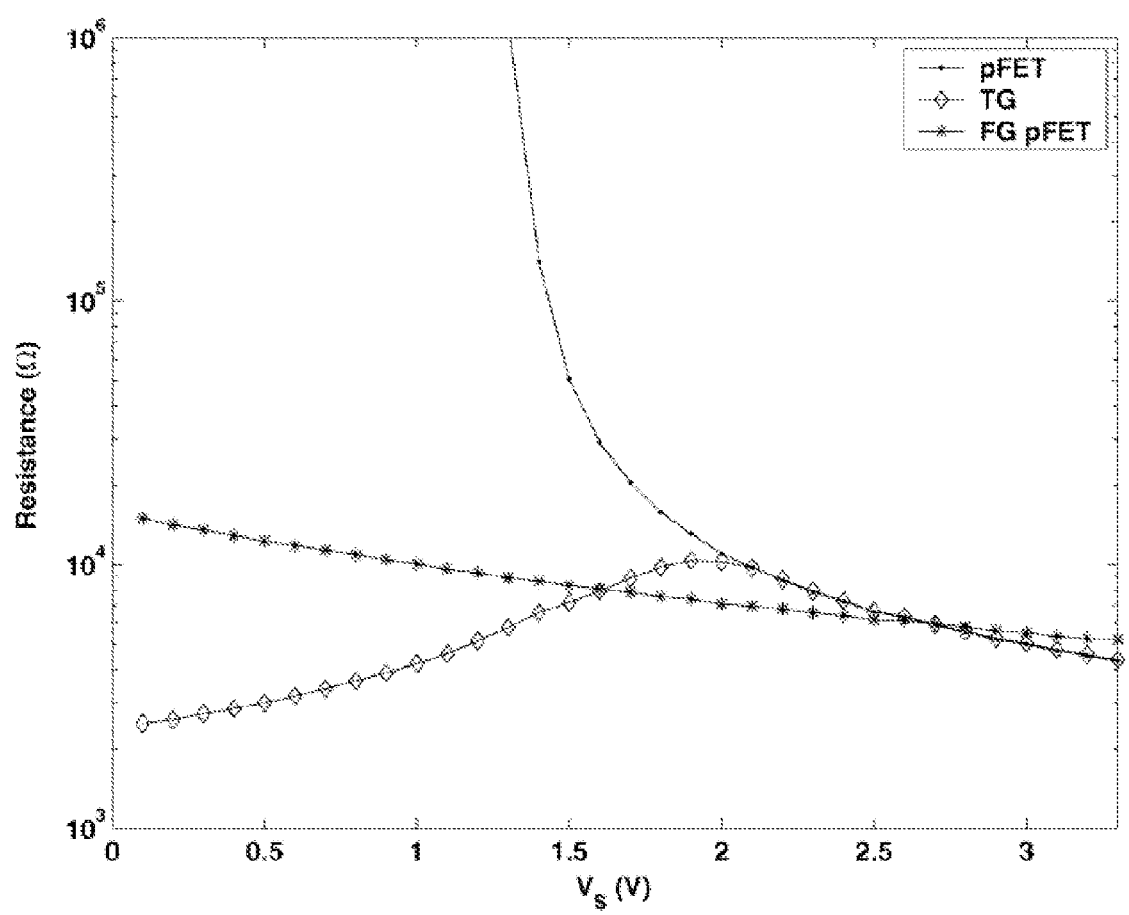
FIG. 7 is a chart illustrating switch resistances for a floating-gate pFET, standard pFET, and a standard two-transistor T-gate (TG) in accordance with an exemplary embodiment of the present invention.

As discussed above, the resistance and capacitance of the floating-gate switch are important characteristics. FIG. 7 illustrates switch resistances for a floating-gate pFET, standard pFET, and a standard two-transistor T-gate. One skilled in the art will recognize that the resistance measurements may vary depending on the quality of the floating-gate switch and, therefore, the chart in FIG. 7 is used to provide a better understanding of the invention, without limiting the scope of the invention.

For reference, FIG. 7 also shows the resistance of a standard pFET (with an SRAM memory bit setting the gate) and transmission gate (T-gate) (both an nFET and a pFET passing the signal). When programmed to a point that is not extremely "on", the floating-gate switch exhibits a resistance that is very similar to the standard pFET. By injecting the floating-gate switch further, however, the voltage on the isolated gate node may be pushed lower and thus the resistance curve shifts to the left. By programming the switch far enough, the resistance through the switch may maintain a more consistent level through the operating range (power rails) of the switch. This allows a single floating-gate pFET to exhibit a resistive characteristic that is similar to the resistance of a standard T-gate with two transistors. The resistance of the floating-gate switches may be approximately 10 Ωk, which is expected for relatively small (W/L=3) pFETs.

The "off" resistance is generally harder to measure given the limitations of standard test equipment. Even at a $V_{DS}$=3.3V, current through the "off" switches may be below the measurable range of standard picoammeters. Accordingly, the "off" resistance should preferably be in the gigaohm range or alternatively at least in the hundreds of megaohms range. Likewise, the parasitic capacitance of the switches may be difficult to measure when they are embedded in the switch network and accessible only through the programming infrastructure. A theoretical estimate based on the layout and fabrication parameters yields a value of approximately 1 fF for each switch on each column and row. Thus, for the exemplary FPAA, each column is approximated to contribute 96 fF of parasitic capacitance and 46 fF for each row.

For exemplary purposes, an analysis of a number of different analog systems on the example FPAA 100 is provided. These systems may vary from simple one and two element systems to more complex systems with as many as seven on-chip components. These systems may also use a range of different CAB 170 components, including fine-grained (transistors and capacitors), medium-grained (OTAs 179), and coarse-grained ($C^4$ SOS and peak detector) components. In each of these examples, floating-gate transistors 103 may be used as current sources to set biases. Depending on the circuit, these programmable biases may be shown to control filter corner frequencies, Q-peaks, and time constants.

Figures 8A, 8B:
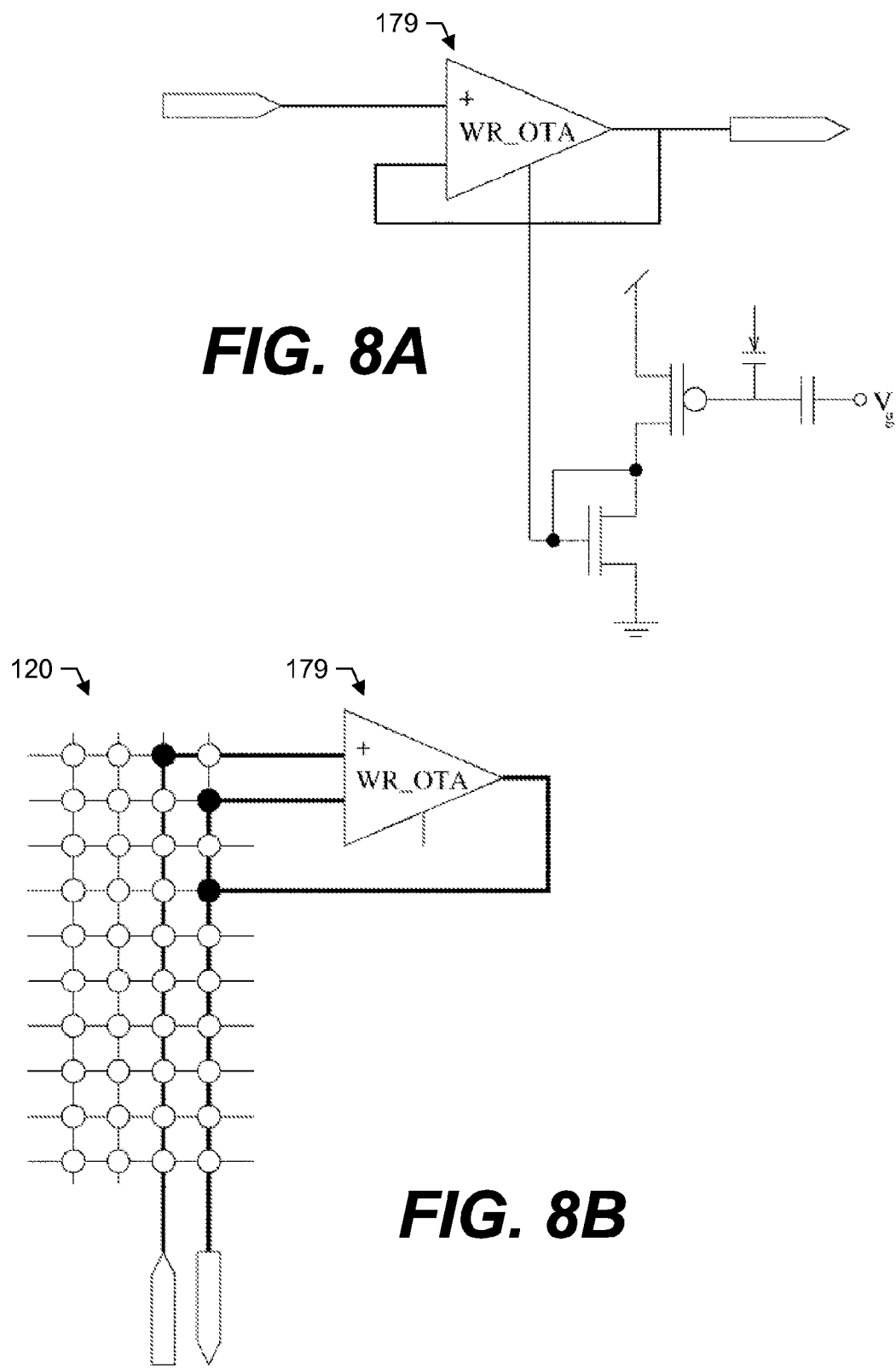
FIGS. 8A-8B, collectively known as FIG. 8, are schematic diagrams illustrating a circuit mapped onto an FPAA using floating-gate switches in accordance with an exemplary embodiment of the present invention.

In a first exemplary analog system, a first-order filter may be implemented in the FPAA 100 using an OTA 179 within one of the CABs 170. FIGS. 8A-8B illustrate a circuit mapped onto an FPAA 100 using floating-gate switches. By programming the floating-gate charge, the current may be set in the current mirror (the other half of the current mirror is internal to the wide-range OTA 179). The effective conductance, therefore, may be modified for each of the OTAs 179 on the chip. Using the switch matrix, an OTA 179 located in one of the CABs 170 may be connected in a source-follower configuration, and two external pins may be routed to the OTA 179 as the input and output signals. Further, each OTA 170 may have a current mirror and floating-gate current source that sets its biases.

Figure 9A:
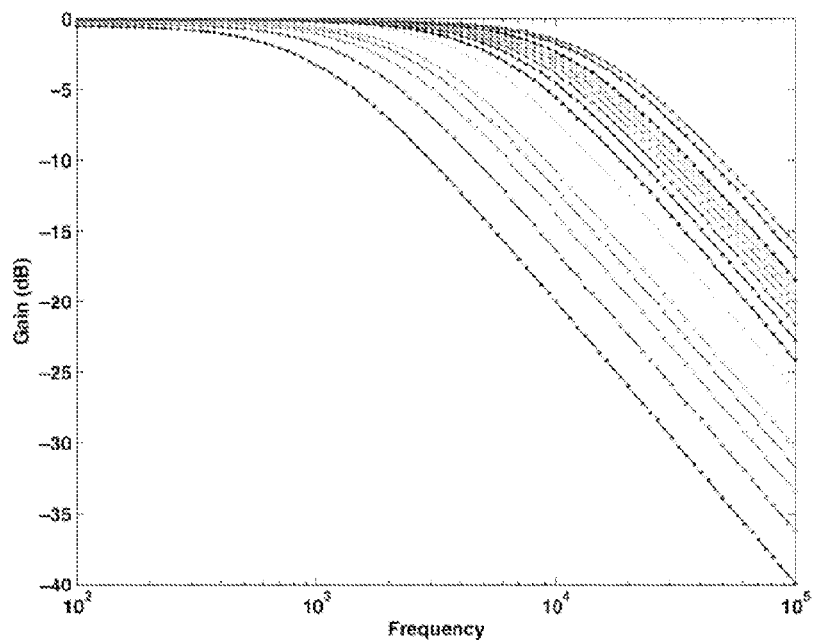
FIGS. 9A-9B, collectively known as FIG. 9, are charts illustrating frequency measurements of a source-follower circuit for several bias currents in accordance with an exemplary embodiment of the present invention.
Figure 9B:
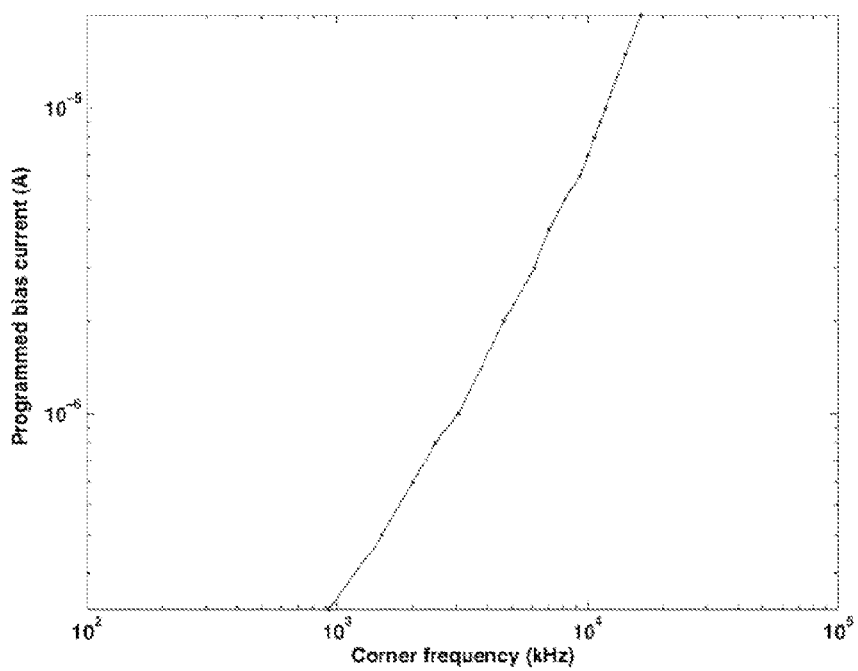

FIGS. 9A-9B provide frequency measurements of a source-follower circuit for several bias currents. One skilled in the art will recognize that the frequency measurements are for exemplary purposes only and, therefore, the charts in FIG. 9 provide a better understanding of the invention, without limiting the scope of the invention. Once the switch network is configured, the biasing floating-gate transistor 103 may be programmed to vary the corner frequency of this first order filter. FIG. 9A illustrates the frequency response for several programmed corner frequencies within the first exemplary analog system. FIG. 9B illustrates the correlation between programmed bias current and measured corner frequency. By fitting a curve to this data, the ability to predict the necessary bias current for a desired corner frequency may be achieved. This is important, because the designer will typically want to specify the system parameters in terms of corner frequency, Q-peak, time constants, offsets, etc. and then let the programming interface make the translation to the appropriate bias currents to generate these currents while programming the floating-gate transistors.

Figure 10A:
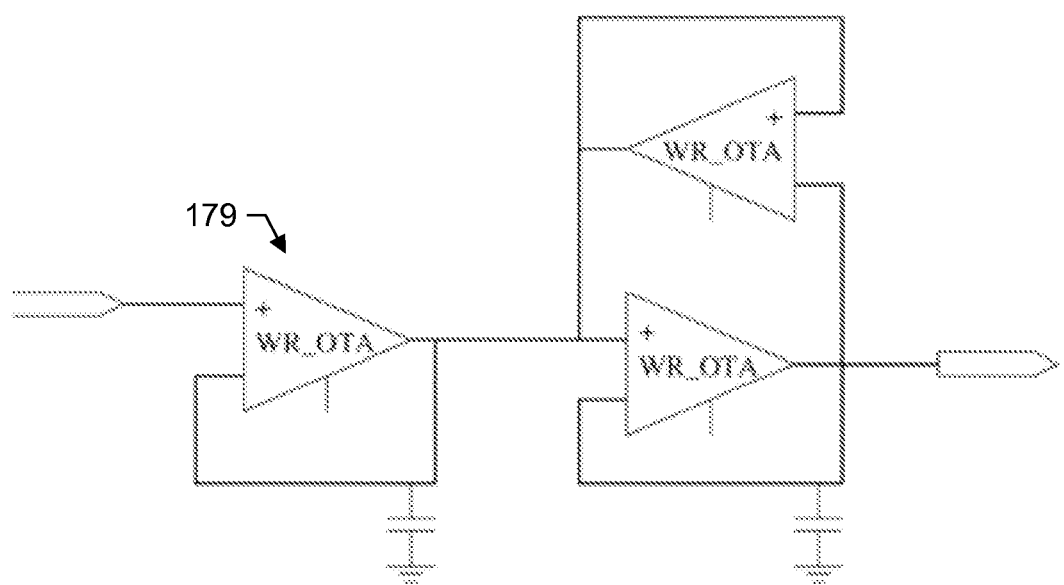
FIGS. 10A-10C, collectively known as FIG. 10, are schematic diagrams and charts illustrating a second-order section (SOS) filter together with an FPAA and associated frequency in accordance with an exemplary embodiment of the present invention.
Figure 10B:
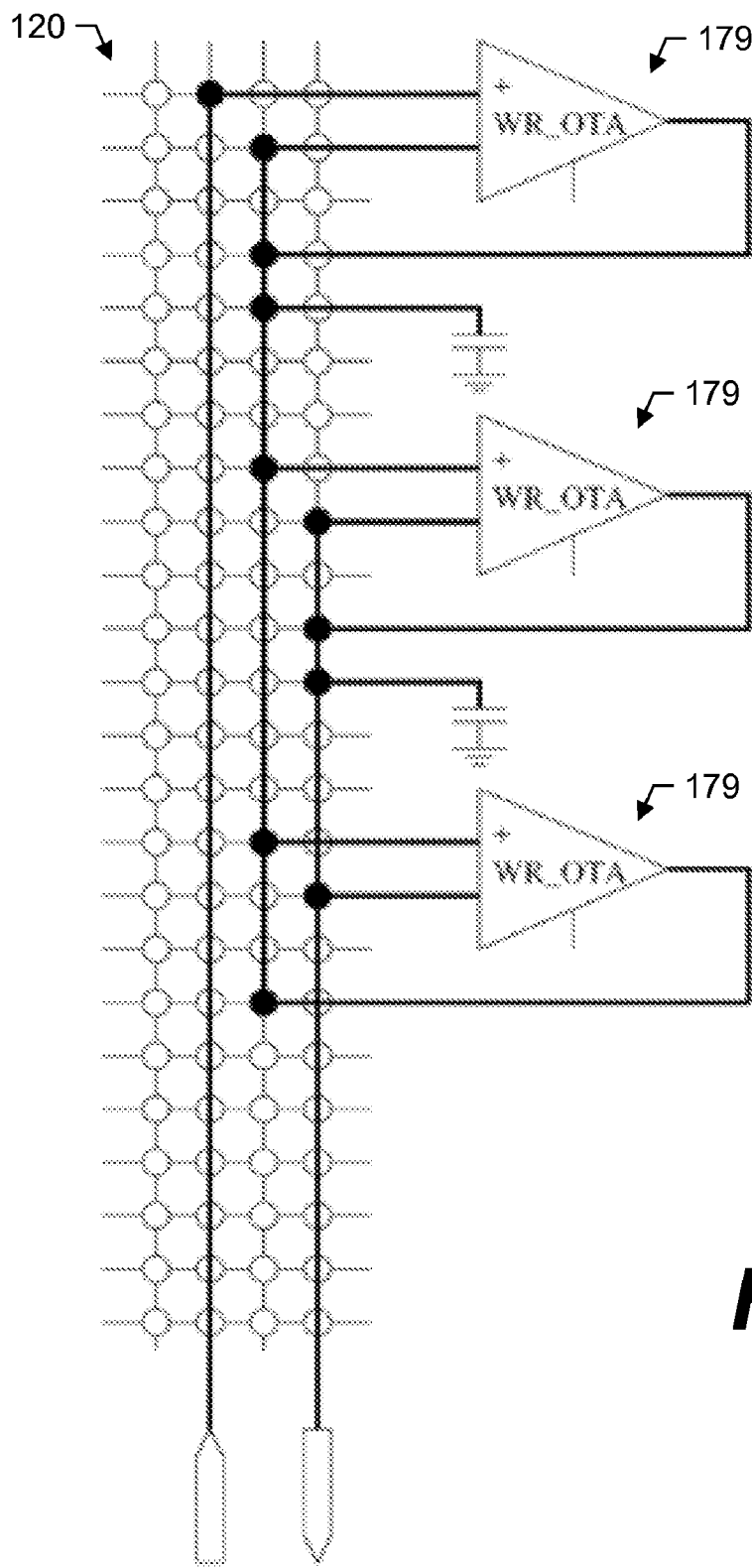
Figure 10C:
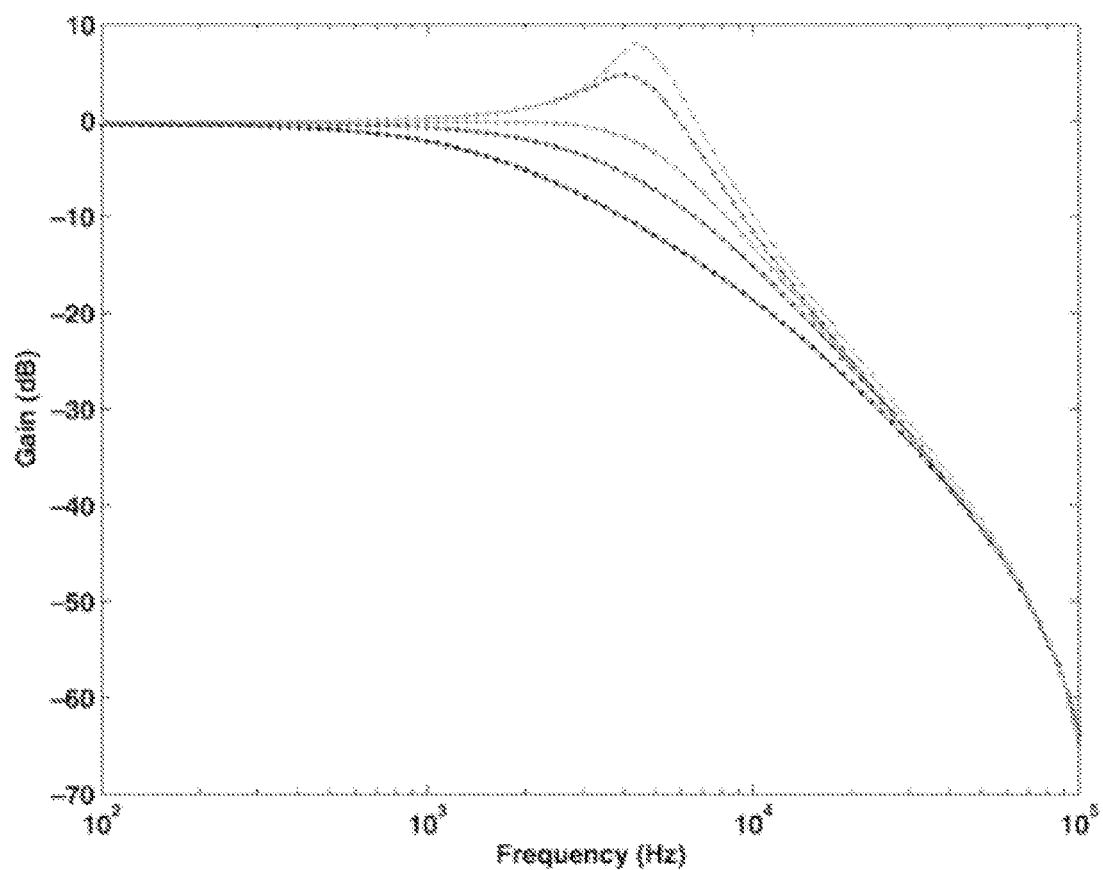

In a second exemplary analog system, a SOS filter may be implemented along side the FPAA 100. Accordingly, FIGS. 10A-10C illustrate a second-order section (SOS) filter together with an FPAA 100 and associated frequency. The chart in FIG. 10 is for exemplary purposes only and is provided to better teach the invention, but is not intended to limit the present invention. The fixed-value capacitors and OTAs 179 from a single CAB 170 may be used to synthesize the circuit. Using the floating-gate programmable biases, the two OTAs 179 in a source-follower configuration may be biased to the same level and the third OTAs 179 bias current may be increased to adjust the Q-peak of the system. FIG. 10C illustrates the frequency response for the circuit and, as expected, the Q-peak increases as the third bias current (e.g., conductance) increases.

For second-order functions such as the SOS, reasonable Q-peaks and filter bandwidths should include small bias currents (in the picoampere to femtoampere range). While the floating-gate transistors can set bias currents this low, the constraint becomes the ability to accurately measure these currents while programming the floating-gate transistors 103. An important consideration for such a design is the relative sizing of the transistors that set the bias currents. The floating-gate transistor 103 shown in FIG. 8A sets the current through the nMOS current mirror (the other half of the current mirror is internal to the OTA 179 module). To set small bias currents, it may be preferable to have the nFET and floating-gate transistor 103 sized larger than the current mirror nFET internal to the OTA 179. In this configuration, the current mirror functions as a current divider, and thus, very low bias currents may be set by programming the floating-gate transistor 103 to generate currents in the picoampere range.

Generally, the OTAs 179 for the exemplary large-scale FPAA 100 are standard nine-transistor wide-range OTAs 179 with W/L=1.8/1.8, and a bias transistor W/L of 8.1/1.8. Although the OTAs 179 used in this example are fairly generic, the FPAA fabric may be designed to be highly flexible, and the CABs 170 may be enhanced with any OTA 179 type desired. Thus, the overall architecture may remain fixed, while the specific components and their respective performance characteristics (e.g., signal-to-noise ratio, dynamic range, distortion, input linear range, etc.) may be modified for different target markets. Additionally, the use of floating-gate transistors to set the bias currents allows a large degree of freedom in adjusting the circuit characteristics. Floating-gate transistors 103 similar to those that set the bias current in the OTAs 179 may be programmable over at least three and a half orders of magnitude to over over seven orders of magnitude.

Figure 11A:
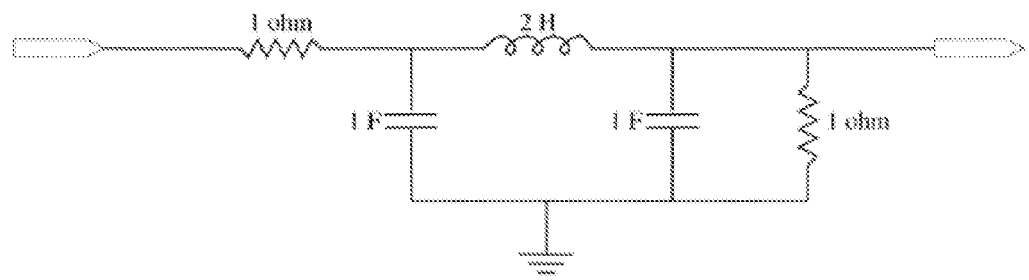
FIGS. 11A-11C, collectively known as FIG. 11, are schematic diagrams and charts illustrating a third-order Butterworth double-resistance terminated low-pass input filter and the $G_m$-C implementation of the same filter in accordance with an exemplary embodiment of the present invention.
Figure 11B:
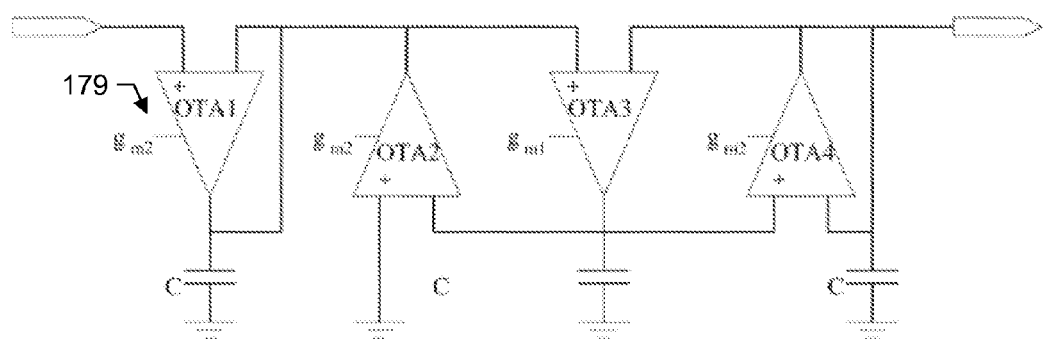
Figure 11C:
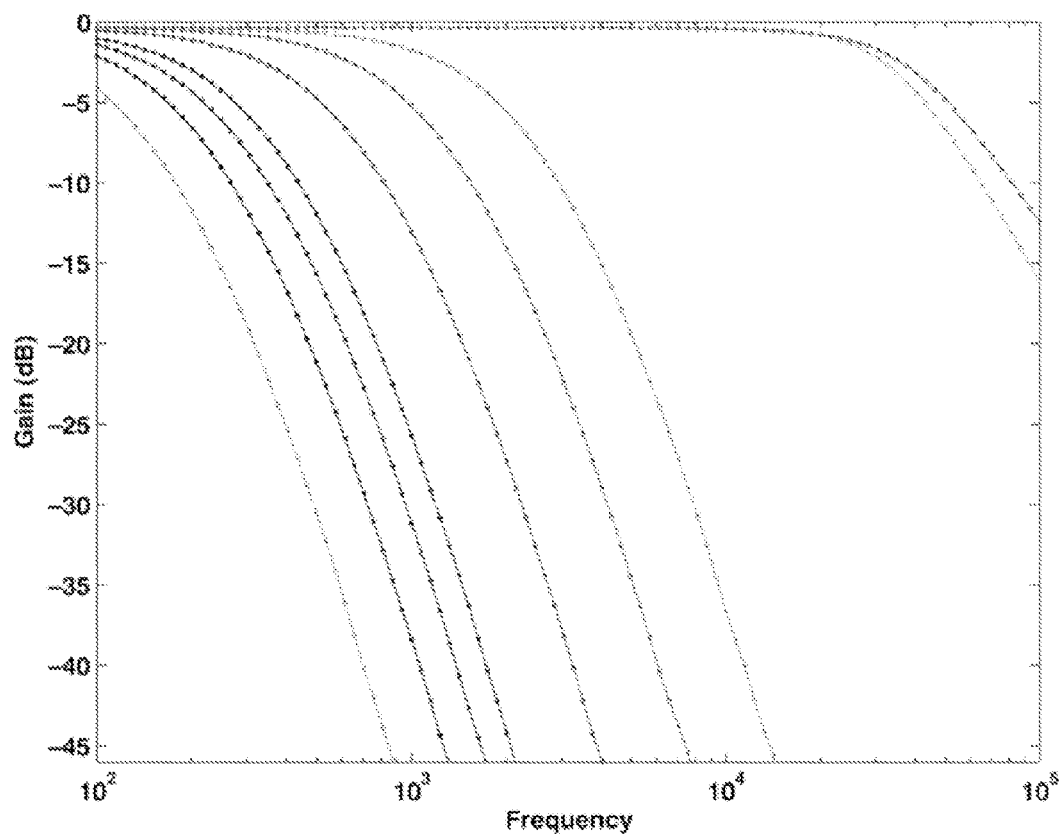

As illustrated in a third exemplary analog design, the availability of OTAs 179 and grounded capacitors makes the large-scale FPAA 100 ideal for implementing $G_m$-C filters. One way to realize a particular filter is by modeling it with resistors, inductors, and capacitors, and then synthesizing the design using $G_m$-C filters. In this example, a third-order Butterworth filter may be implemented. FIG. 11A illustrates the canonical prototype of the filter, a double-resistance terminated LC filter. FIG. 11B illustrates a $G_m$-C filter generated by using a signals emulation method. In order to maintain a maximally flat response, the $2*g_{m1}$ should equal $g_{m2}$. Accordingly, the bias current of OTA-3, as shown in FIG. 11B, may be set to half of the other OTA 179 bias currents. FIG. 11C illustrates a frequency response created by using a range of bias currents. As expected, the corner frequency of the filter may be proportional to the bias currents of the OTAs 179. The lower corners may be obtained by using a bias current in the range of hundreds of pico-amps, while the highest corners may require currents of up to 1 μA.

As described above, the CABs 170 on the exemplary FPAA 100 may have several special-purpose components that have been designed to optimize specific functions. In particular, the CABs 170 may include programmable peak detectors 188 and programmable bandpass filter modules 182 ($C^4$ SOS circuits).

Advantageously, a wide range of analog systems may be implemented and configured on a large-scale FPAA 100 having multiple CABs 170 contained thereon. In particular, differentiators, cascaded SOSs, bandpass filters, matrix transforms (including discrete cosine transforms and wavelet transforms), and frequency decomposition may be all well suited for such an architecture. In the audio arena alone, designs may be prototyped to implement forms of noise suppression, audio enhancement, feature extraction, auditory modeling, and simple audio array processing. Other potential interest areas include communications signal conditioning (modulation, mixing, etc.), transform coding, and neural networks (with external training). Many of these systems rely on efficient subband processing and, therefore, each CAB 170 may be designed with a $C^4$ SOS bandpass filter module to optimize this operation.

Figure 12A:
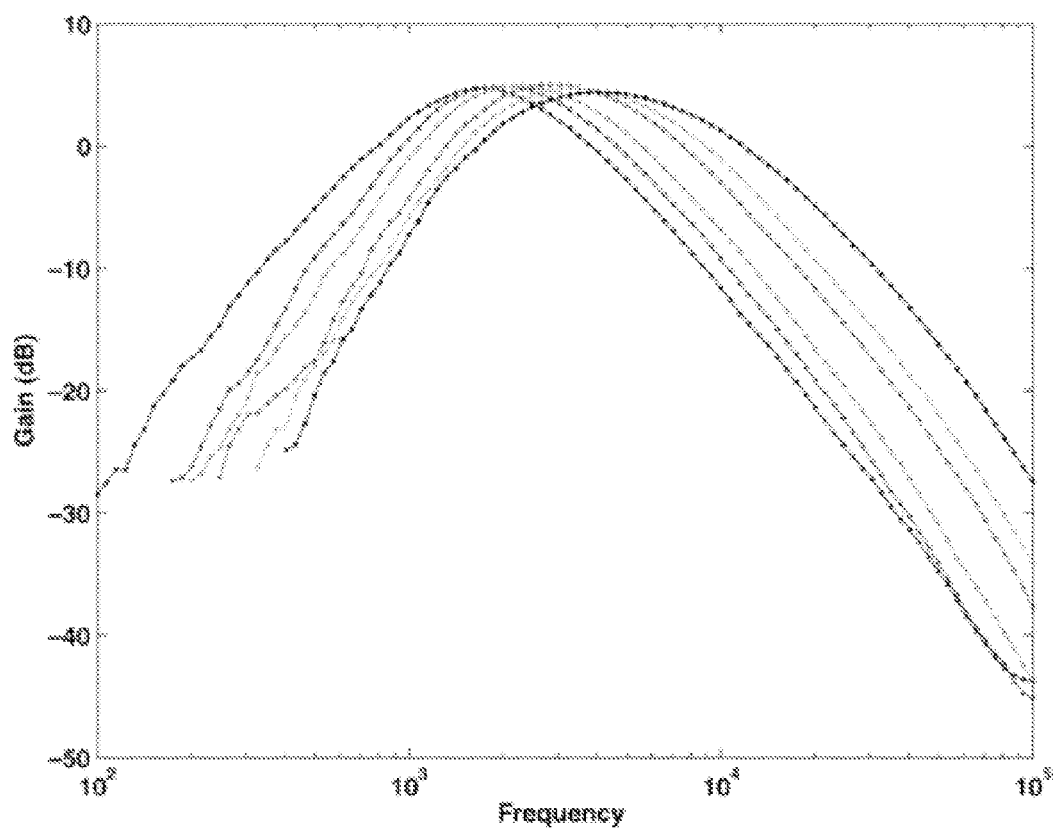
FIGS. 12A-12C, collectively known as FIG. 12, are charts illustrating various measurements of frequency for a $C^4$ SOS block in accordance with an exemplary embodiment of the present invention.
Figure 12B:
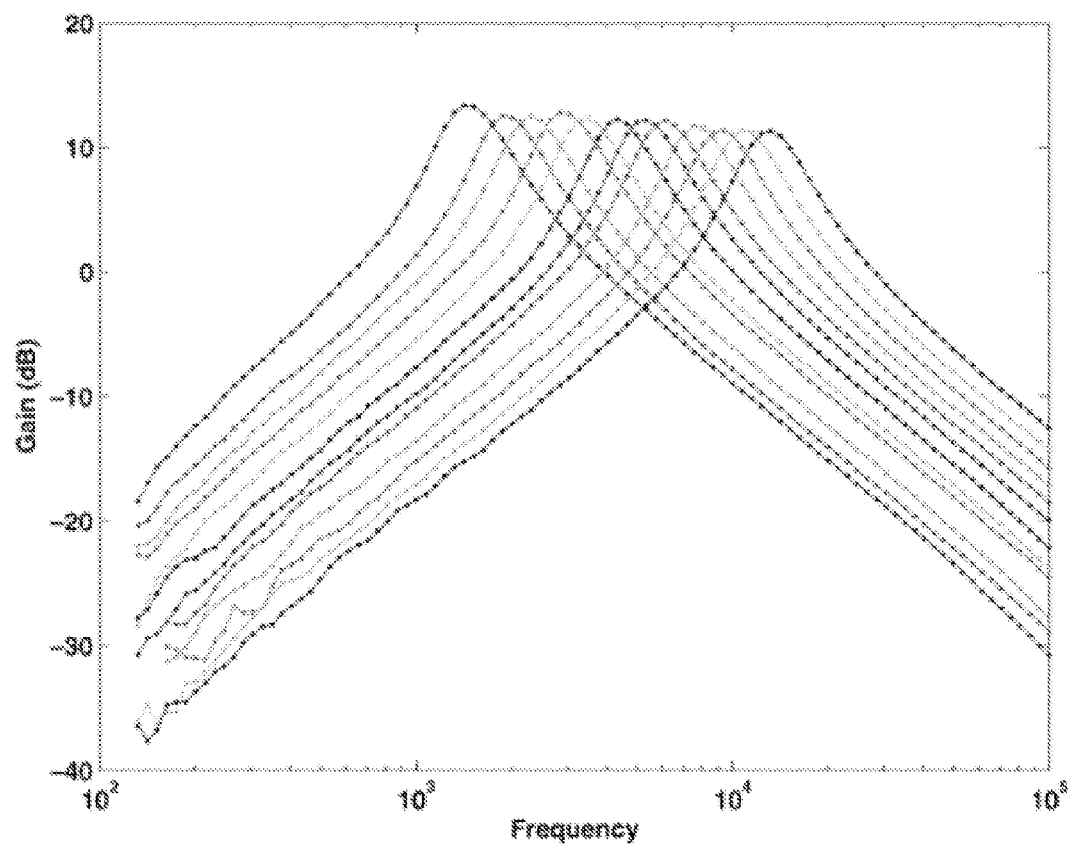

Moreover, the $C^4$ SOS module may comprise two $C^4$ modules cascaded with a buffer in-between them. Either $C^4$ module may be used separately by spreading apart the corner frequencies of the other module. FIG. 12A-12B illustrate the frequency response plots of each of the individual $C^4$ modules. The frequency data provided in FIG. 12, however, is for exemplary purpose only and is not intended to limit the scope of the invention. The bandwidth and Q-peak of the $C^4$ modules may be quite different. This is due to the difference in output capacitance of each module. The output of the first C4 may be tied to the input of a buffer, which results in a relatively small capacitance. The output of the second $C^4$, however, may be tied into the switch network. Therefore, the output load capacitance for this device will be much higher due to the parasitics of the switches and the capacitance of the next circuit in the path.

Figure 12C:
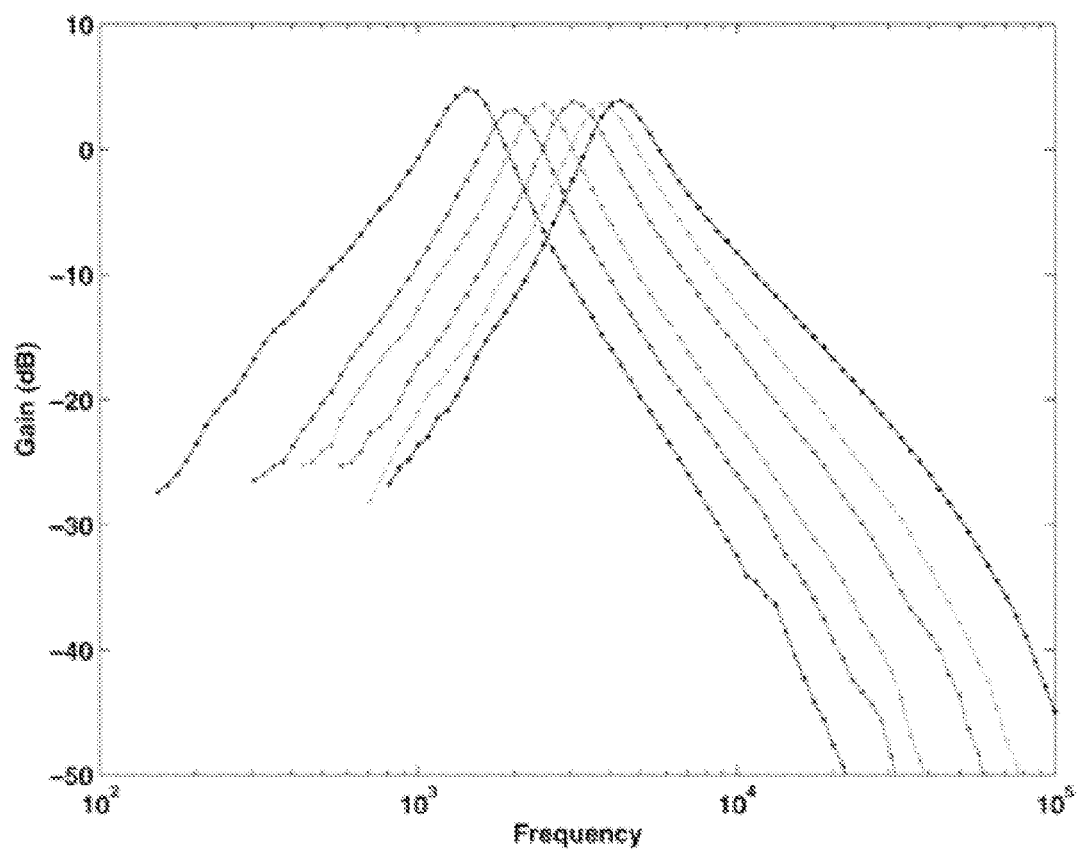

FIG. 12C illustrates a desired second order roll-off from the output of the module, when each cascaded $C^4$ is set to the same corner frequencies. In all of these plots, the corner frequencies may be shown to be programmable over a wide range of frequencies. The bias current to corner frequency correlation may be different for each of the cascaded devices. All of the bias currents for these plots, however, may be within the range of 25 pA to 200 nA.

Figure 13A:
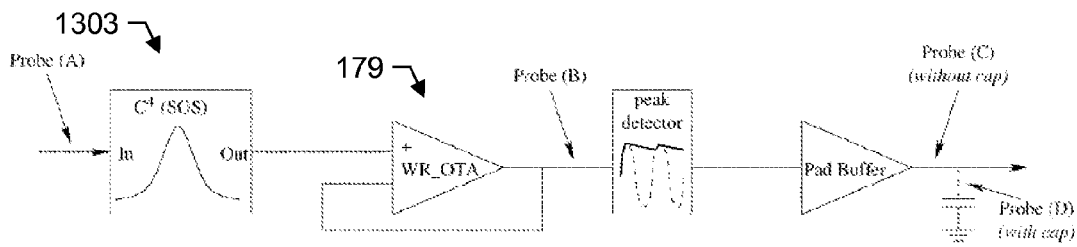
FIGS. 13A-13B, collectively known as FIG. 13, are a schematic diagram and chart illustrating circuitry for a typical subband system and experiment data from an FPAA utilizing the subband system in accordance with an exemplary embodiment of the present invention.

The coarse-grain components are most useful when they can be combined to form a larger system. Indeed, larger systems may be compiled into a two CAB 170 system. FIG. 13A illustrates an exemplary circuit using a $C^4$ SOS block 1303, an OTA 179, and a peak detector 188 in series. Such a configuration may be very powerful when it is replicated 64, 128, or more times on the FPAA 100, with the center frequencies of the bandpass filters varying over the desired frequency range. The outputs of the different subbands may be analogous to the magnitudes of the discrete Fourier transform.

Figure 13B:
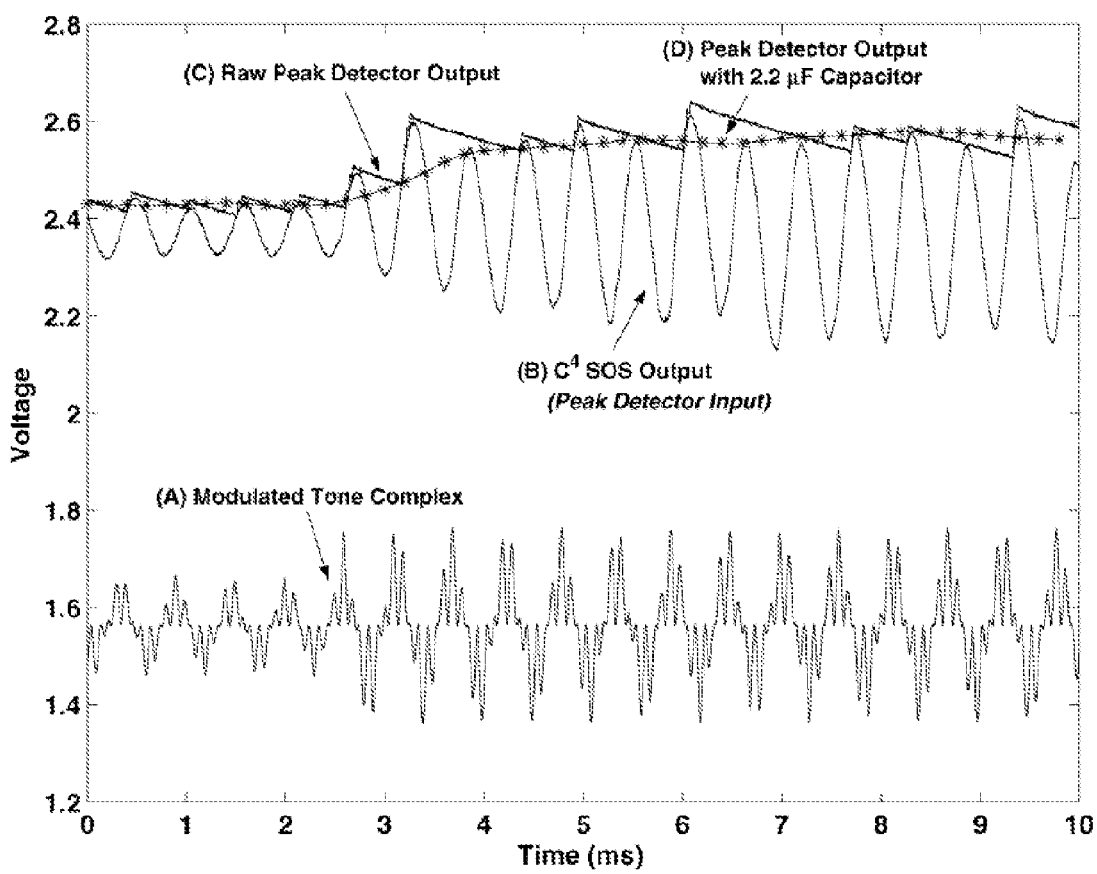

FIG. 13B illustrates that the signal for single subband may be an amplitude-modulated signal with 1.8 and 10.0 kHz frequency components. The $C^4$ SOS module 1303 may be biased to have a center frequency near 1.8 kHz, and the OTA 179 may be configured to be a noninverting buffer. Also, as shown in FIG. 13B, the output of the system may be smoothened by adding an external 2.2 μF capacitor at the output of the FPAA 100. The smoothing (i.e., low-pass filtering) of the output may create a longer effective time constant for the system.

Very complicated systems may be implemented using the present invention. For example, large-scale FPAAs 100 may be composed of multiple input translinear elements (MITEs), which enable direct programmable synthesis of algebraic differential equations. Further, systems as complicated as adaptive filters for chaotic systems (Lorenz systems) may be compiled into a large-scale FPAA 100 as provided by the present invention.

Given the great potential of programmable analog technology, particularly as instantiated in the large-scale FPAA 100 approaches described above, the present invention may also be used in systems requiring a significantly large range of signals and that include extreme environmental conditions. For example, applications utilized in space exploration simultaneously provide difficult signal ranges (100 MHz to GHz operation), as well as difficult environmental conditions (e.g., large temperature changes and radiation).

Figure 14:
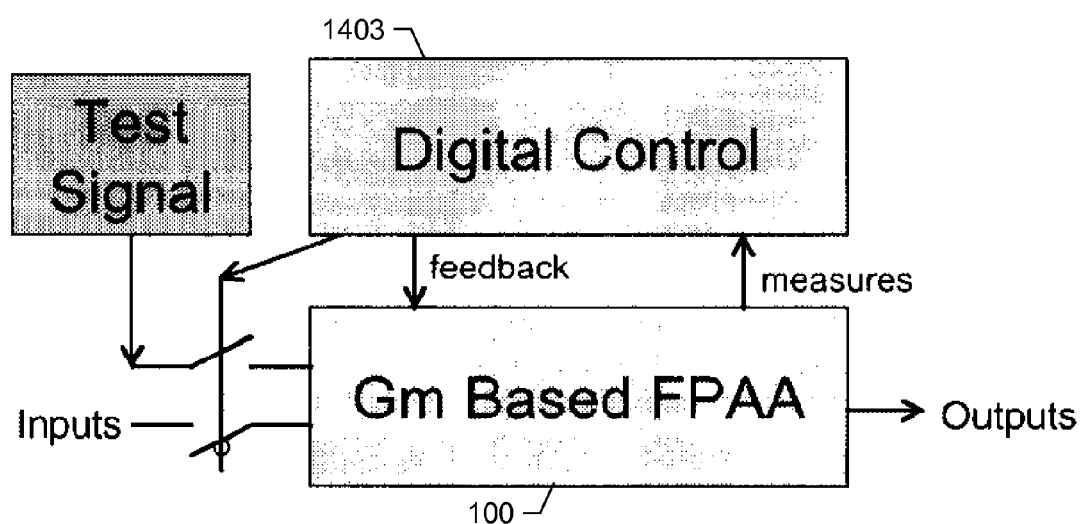
FIG. 14 is a block diagram illustrating top level architecture of a self-recovering system utilizing a programmable OTA-based FPAA in accordance with an exemplary embodiment of the present invention.

For such a demanding system, a reconfigurable FPAA 100 may require some form of digital control to measure the results of the FPAA block, compute any errors from ideal operation, and then reprogram the structure, if necessary. FIG. 14 illustrates the top-level architecture of a self-recovering system utilizing a programmable OTA-based FPAA 100 under the control of a digital control system to adapt the system based on a range of environmental and process conditions.

The FPAA design provided in FIG. 14 may be limited by the number of extra switching elements to implement a particular function. Indeed, the bandwidth of an array is inversely proportional to the number of switches connected on a given line, and inversely proportional to the number of switches needed to make a connection. The present invention may utilize banks of parallel OTAs 179, each having programmable bias currents, to provide high-speed operation of the FPAA 100. In order to switch topologies within the large-scale FPAA 100, the desired OTAs 179 may be programmed for the particular configuration. Although one could design an FPAA 100 where all switching elements are OTAs 179 or other amplifiers, the tradeoff may be higher power dissipation.

Figure 15:
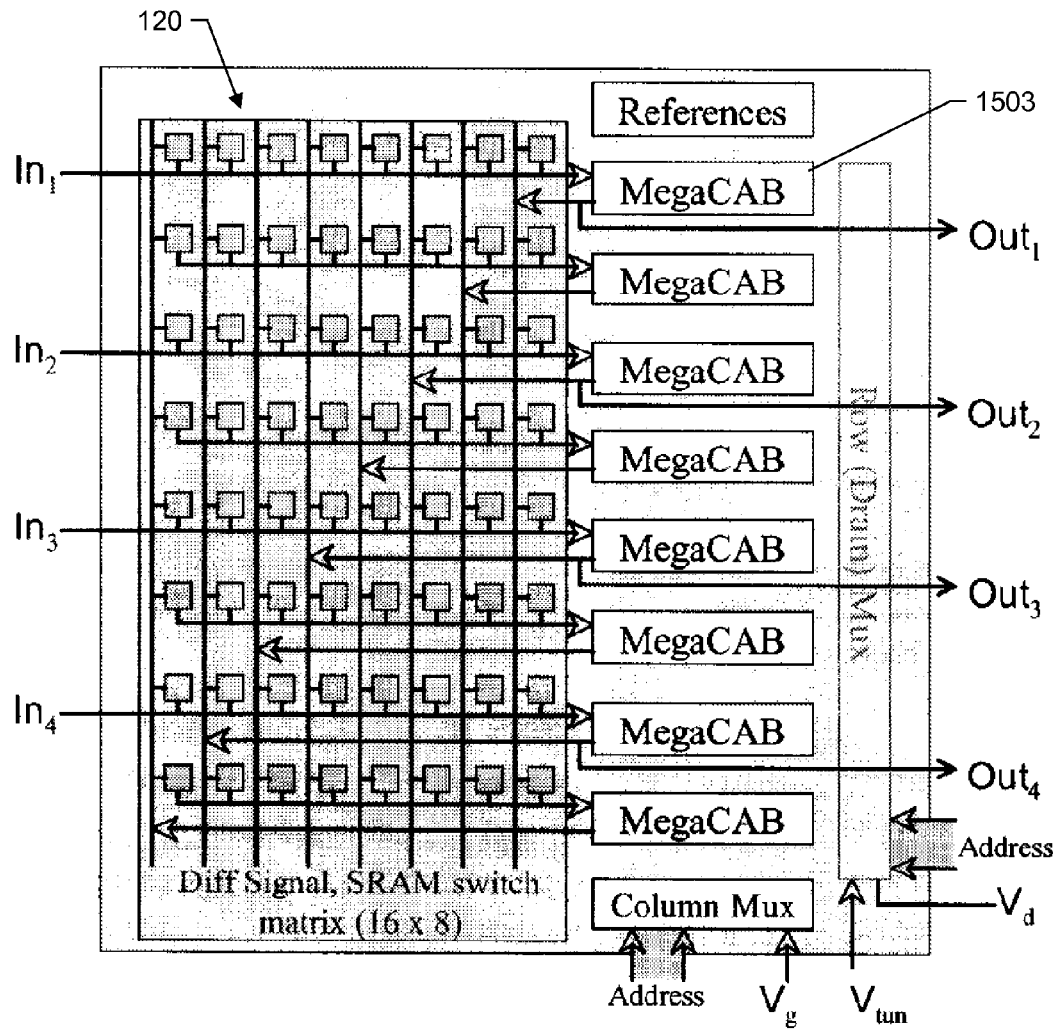
FIG. 15 is a block diagram illustrating an OTA based FPAA architecture in accordance with an exemplary embodiment of the present invention.

FIG. 15 illustrates a top-level diagram for a basic OTA-based FPAA 100 of the present invention. This particular configuration may utilize an array of CABs 170, which is referred to herein as a MegaCAB 1503. Each MegaCAB 1503 may include five CABs 170 (having multiple OTAs 179) per block. The inputs and outputs for these blocks may be different to allow in cleaner, power-supply immune signals having low-distortion. One skilled in the art will recognize that although the diagram in FIG. 15 provides for a 16×8 switch matrix having eight MegaCABs 1503, the present invention may include any number of MegaCABs 1503 and, therefore, may support a smaller or larger switch matrix.

The use of eight MegaCAB 1503 $G_m$-C filters in the present example provides for a straightforward architecture allowing full-interconnection between elements. Each MegaCAB 1503 may be associated with a row of digital switches, which may be set either as SRAM blocks controlling transmission-gate switches or floating-gate switch elements. The complexity in each CAB 170 may be reduced to allow for potentially higher-frequency operation and a more environmentally tolerant design. This exemplary architecture may be expanded to multiple routing depths by increasing the number of Mega-CABs 1503 used, and may be expanded to multiple levels of granularity. Table 1 provides a summary of parameters for the exemplary OTA-based FPAA integrated circuit design.

TABLE 1

| Parameter | Value | Parameter | Value |
|---|---|---|---|
| MegaCABs | 8 (5 CABs each) | Programmable Elements | <1024 (analog) |
| CABs | 40 (8 OTAs each) | | 128 (digital, SRAM) |
| Estimated Die Area | 6 mm × 6 mm | Program Time | ~1 s (with proper Ammeter) |

Programming the OTA-based FPAA 100 may be accomplished by programming the current-source floating-gate pFET transistors at each OTA 179. The small number of used OTAs (240) keeps the floating-gate programming complexity relatively low and, therefore, utilizes less complicated programming techniques.

Using a proper off-chip current measurement, the entire FPAA 100 may be programmed in approximately one second. Further, the signal frequency operating range may range from 1 MHz to 10 MHz and potentially up to 100 MHz. Each MegaCAB 1503 may be configured as an array of five OTA CABs 170 capable of implementing any second-order section (SOS) and, therefore, no additional switches are necessary to modify the topology of the filters. Generally, the capacitor associated with the MegaCAB 1503 blocks may be set utilizing the desired signal-to-noise ratio (SNR) and power dissipation for the elements.

Figure 16A:
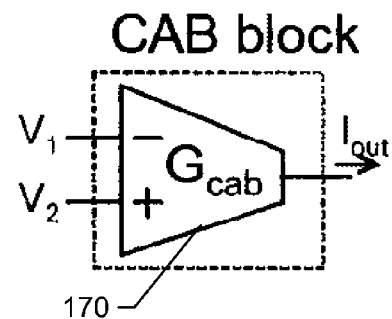
FIGS. 16A-16B, collectively known as FIG. 16, are schematic diagrams illustrating a definition of a CAB block for an OTA-based FPAA architecture in accordance with an exemplary embodiment of the present invention.
Figure 16B:
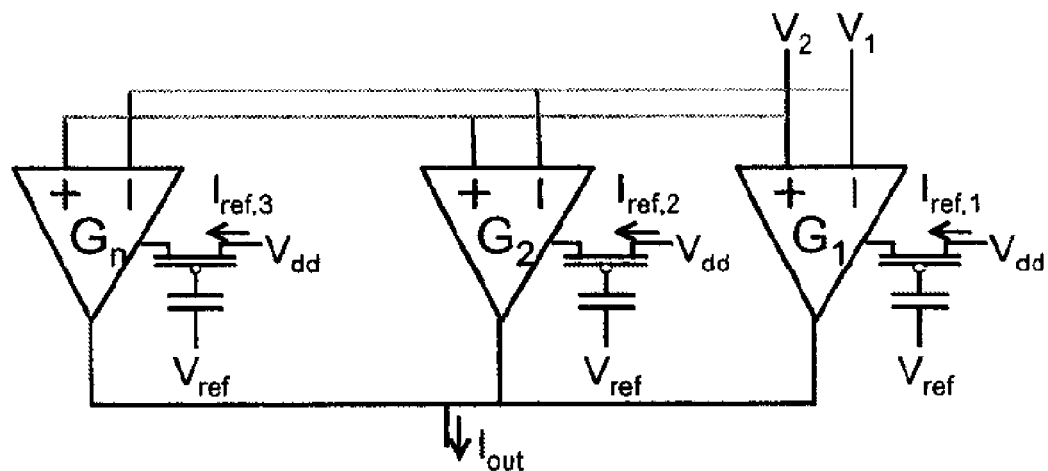

FIG. 16 illustrates an exemplary CAB 170 block for the OTA-based FPAA 100 architecture. The basic CAB 170 block may be represented as a single $G_m$ stage. The basic CAB 170 block may also be composed of multiple parallel $G_m$ stages, where each bias may be programmed using a floating-gate element. Such a topology eliminates the need for switches in the CAB 170, while allowing for potentially higher operating frequencies and performance. Further, each of the $G_m$ stages could be designed for different linearity, noise, and SNR specifications.

For exemplary purposes only, Table 2 shows the pinouts required for a 40 pin (ceramic package) version for the proposed integrated circuit design. The same design could be bonded to a larger package for more I/O and test points. The size of the capacitors in each CAB block should be related to the desired SNR of the CAB 170.

TABLE 2

| Differential inputs | 4 (8 pins) | Test Pins | 3 |
|---|---|---|---|
| Differential outputs | 4 (8 pins) | Shift Reg for SRAM | 3 (Input, clock, data) |
| Vdd/GND | 4 | Program control lines | Drain, Gate, Tunnel, Prog |
| | | FG Prog Addresses | 10 |

Within this embodiment, the present invention provides a large-scale FPAA 100 integrated circuit having an array of floating-gate devices driving OTA 179 elements, such that the array is relatively temperature insensitive over a range of −180° C. to 120° C. (approximately a 50% change in temperature from normal operational conditions). The resulting voltage store on a capacitor is generally insensitive to temperature (assuming an ideal capacitor), because floating-gate circuit approaches are based on charge storage. As a result, typical temperature insensitive floating-gate designs use voltage-mode circuits. Further, using floating-gate pFET devises as switch elements results in an on-switch resistance, which is most often better than the resistance of T-gate switches.

For OTA 179 elements, however, the resulting transconductance is set by a current, which requires a relatively clean current reference, and therefore poses a challenging problem for temperature insensitive FPAA designs.

Generally, the temperature dependence for a MOSFET device depends upon the region of operation. For example, subthreshold current operation gives an exponential dependence on current, while above-threshold operation gives a polynomial dependence on the current. The dependence comes from the shift in threshold voltage with temperature, as well as the change in mobility with temperature. A current source transistor for subthreshold currents biased with a constant gate voltage may easily vary by a factor of 10 over a 0° C. to 40° C. range. To achieve temperature resistant circuits with current outputs, the present invention utilizes current mirror topologies based around one temperature insensitive current reference, like a bootstrap current source. For example, in subthreshold operation, a current mirror may be described as $$I_{out}=I_{in}W, W=\exp(\kappa(V_{T2}-V_{T1})/U_T), \tag{1}$$

where the other temperature effects may be drastically reduced by matching physics of the two-paired transistors for the current mirror. If the two transistors have different (W/L) values, then W may be related to the ratio of these values, which is also temperature independent. By utilizing floating-gate circuit techniques, the difference in threshold voltages may be directly programmed, therefore giving two options.

First, the two threshold voltages may be programmed to be substantially identical, independent of process variations, and therefore W is constant with respect to temperature. In this method, any gain comes from changes in (W/L) values or by switching various floating-gate transistors 103 "on" or "off."

Second, the two threshold voltages may be programmed to be different in order to get a continuous change in W. The further the two threshold voltages apart, however, the larger the potential temperature dependence. For example, a 300° C. degree temperature change for a baseline W of 2 results in an approximate 25% error or 2-bit accuracy.

Both techniques may be utilized for design where temperature is an important issue. Above threshold operation has less of a shift with temperature, where the shift with temperature will result in a nonlinear gain function with a threshold shift.

The correct temperature dependence of the reference circuit should be determined. For an OTA-based implementation, the resulting transconductance ($G_m$) temperature should be independent. For subthreshold operation, $G_m$ is generally inversely proportional to $U_T$, therefore, the bias current should be proportional to $U_T$, which may be achieved using a bootstrap current source and a temperature insensitive resistor. When operating with either subthreshold currents or above-threshold currents, the approach results in a transconductance that is proportional to 1/R, where R is the bias resistor in the bootstrap current source (but not the transistor parameters). Temperature insensitive bias resistors are possible either externally or by using a combination of two resistive materials, where the resistance changes in different directions as a function of temperature.

Figure 17:
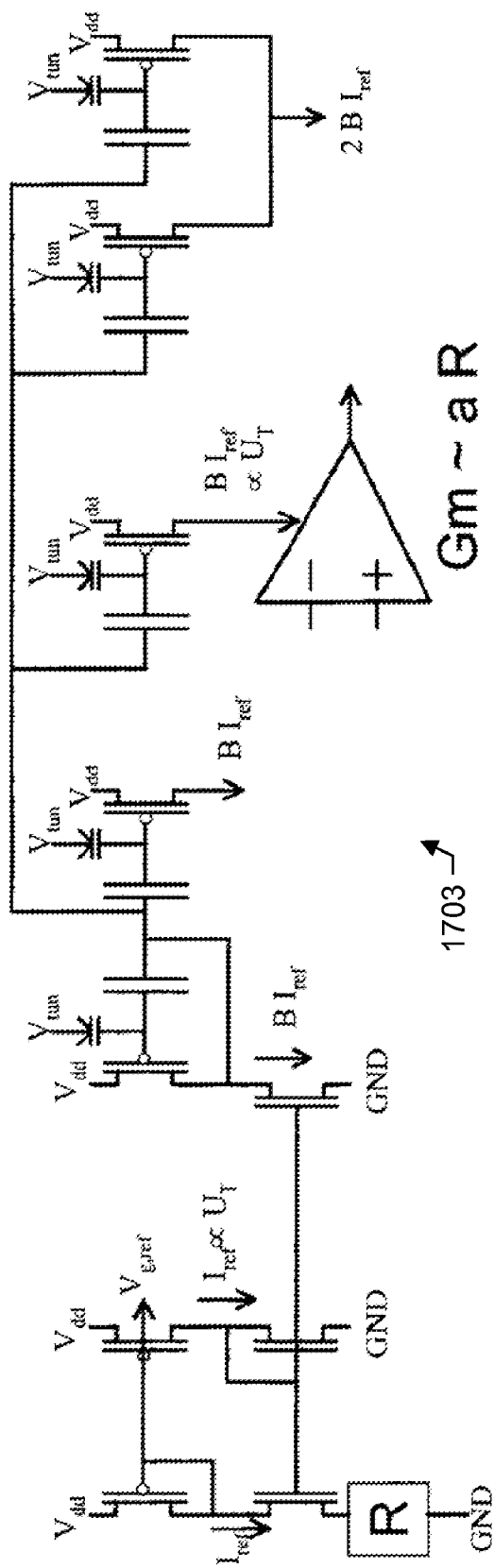
FIG. 17 is a schematic diagram illustrating a circuit for a temperature sensitive biasing scheme for an FPAA in accordance with an exemplary embodiment of the present invention.

FIG. 17 shows an exemplary circuit for a temperature sensitive biasing scheme. The reference current may be built using a bootstrapped current source (generator) 1703, which may be ratioed by a bias (B) for a particular circuit. The current may set the front-end of multiple floating-gate current mirrors. For temperature insensitivity, all transistors may be programmed to be equal, including their relevant threshold voltage shifts. Multiple floating-gate elements may be used to get a power of the reference circuit. This approach requires a temperature insensitive R, which should be a combination of on-chip and off-chip resistors.

Figure 18:
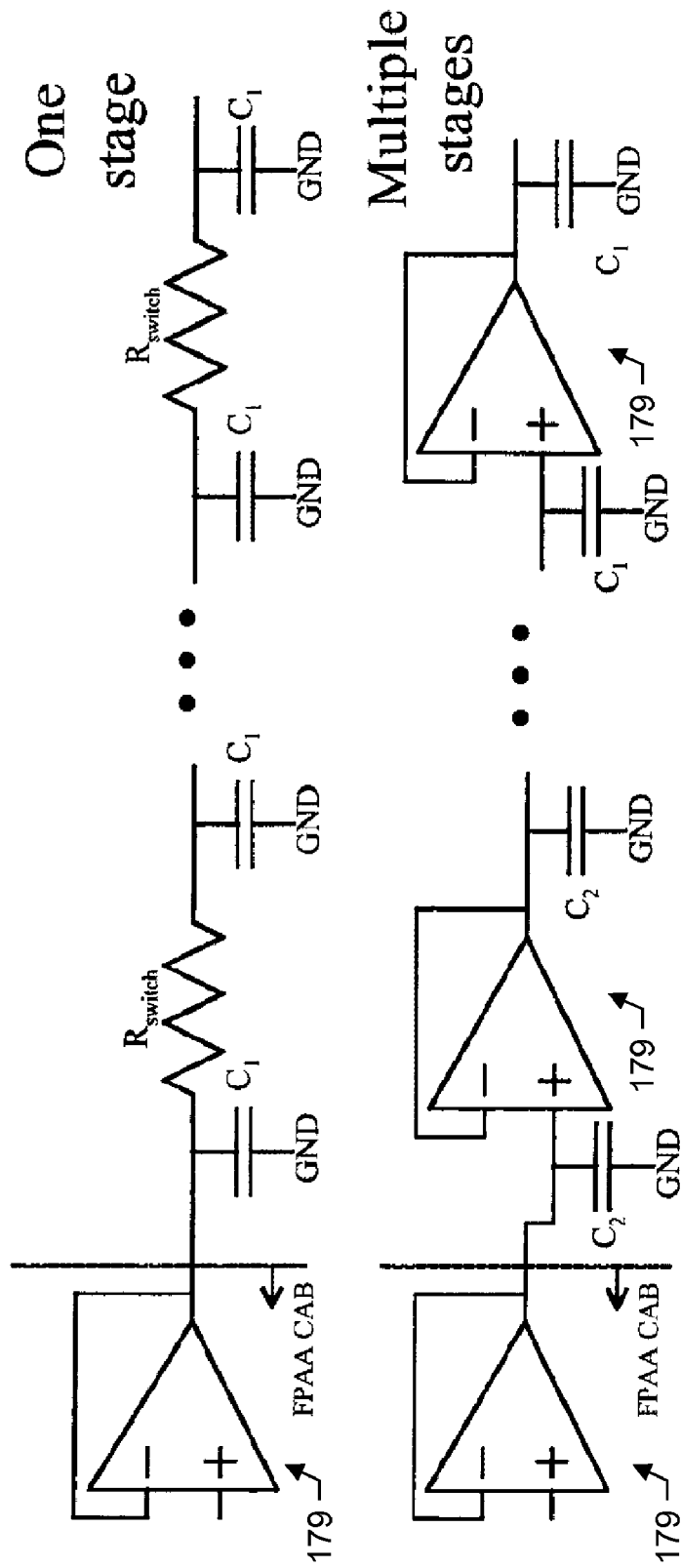
FIG. 18 is a schematic diagram illustrating two different routing schemes in accordance with an exemplary embodiment of the present invention.

FIG. 18 illustrates a solution for temperature insensitivity by activating a path through a sequence of programmed amplifiers (i.e., an OTA 179) to make a connection. Two different routing schemes exist: one stage and multiple stage OTAs 179. These approaches, like their digital counterpart, result in a faster signal transmission typically at the expense of additional power consumed. The OTA 179 approaches result in lower network capacitances, thereby further increasing the signal speed. The OTA 179 switches may require a larger area than floating-gate switches or T-gate switches, resulting in more conservative routing architectures.

These approaches are consistent with the precision current programming schemes. Switch matrices may be most effective at low frequencies, particularly below 10 MHz, and result in significantly lower power dissipation (by the factor of the number of switches). The OTA 179 approaches, however, are better for signals in the 10 MHz to 30 MHz range, but consume higher power. For signals at 100 MHz and beyond, the OTA 179 approaches may be faster and consume lower power. Even with a faster switch matrix, one must make careful choices of the routing architectures to minimize the number of switches between two critical paths, as well as the number of switches along a given line.

The FPAA operating frequency may also be set by the performance of the on-chip OTA 179 blocks, as well as the off-chip interfacing circuitry. Further, more specialized blocks may be added into the OTA fabric, including dense bandpass elements (i.e., $C^4$ elements). Further, floating-gate elements may be added to the OTAs 179 to cancel any offsets, as well as allow for wide-input-linear range devices.

Current sources may be built that are insensitive to temperature for a particular current, or for a discrete set of currents (resulting in more complexity), but it is necessary to build a current source that may be continuously tuned over a wide range of currents (i.e. between 1 nA and 100 nA). In general, floating-gate techniques set a charge, which does not change with temperature. Depending upon the temperature sensitivity of the capacitor (typically <0.2% change from −180° C. to 120° C., and much less when used in pair or differential configurations), the resulting voltage changes are very small. Accordingly, temperature insensitive voltage sources may be accomplished by matching electrostatics, even though the bias current may change through this process, although the voltage remains constant.

Figure 19:
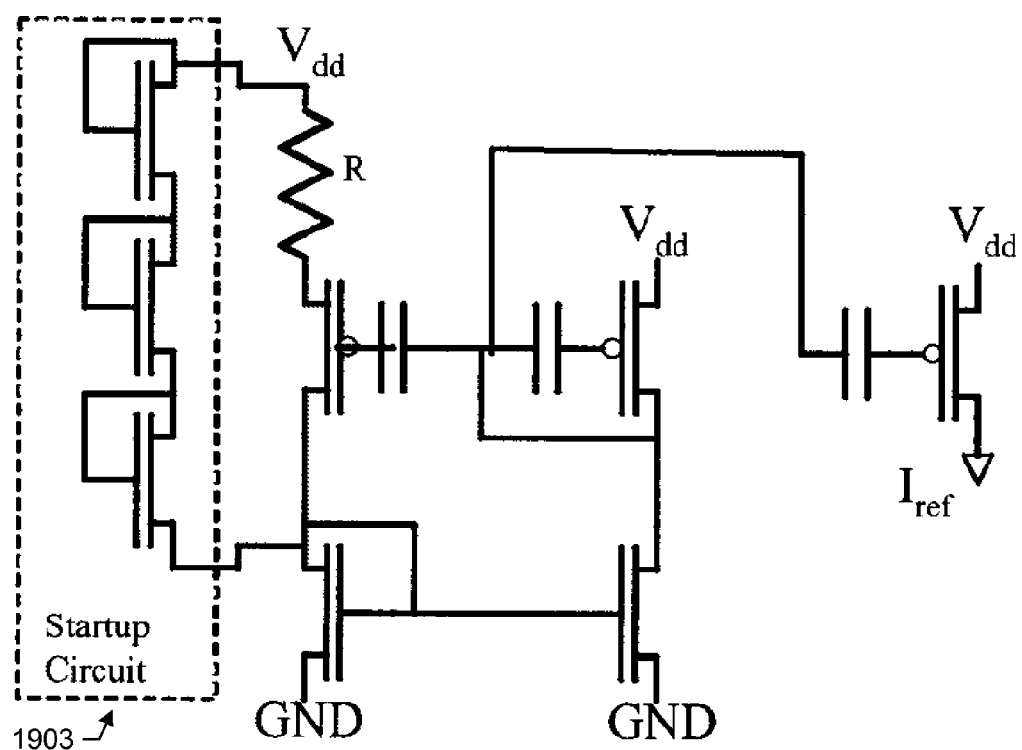
FIG. 19 is a schematic diagram of a floating-gate bootstrap current source that is nearly independent of temperature in accordance with an exemplary embodiment of the present invention.

FIG. 19 illustrates a circuit diagram of a floating-gate bootstrap current source 1903 that results in a reference current that is nearly independent of temperature (depending upon R), and allows for a tunable current range. The circuit gives a voltage that may be insensitive to temperature. Using a temperature insensitive R, the current may also be insensitive of temperature. The temperature effect may be set by the resistive element used. Often, two resistors may be used to compensate for the individual temperature coefficients. High-resistance elements in a given IC process are desirable in the circuit, but are not required. The resulting output current can be tuned over two orders of magnitude, and the accuracy may be dependant upon the programming scheme used (e.g., could be greater than 12 bits SNR, depending upon the capacitor sizes used).

One of the building blocks that would enable multiple analog signal processing applications is a programmable analog waveform generator 2003. An intermediate frequency (IF) band signal processing system generally requires the use of an array of digital signal processors (DSPs) operating in parallel to meet speed requirements. This is a power intensive approach and makes use of certain communication schemes impractical in portable applications. The front-end analog-to-digital converter (ADC) and back-end digital-to-analog converter (DAC) required in these systems become expensive when the signal is of wideband nature and when greater resolution is required.

To address these issues, the present invention provides a programmable waveform generator 2003, thereby providing one of the building blocks needed to enable multiple analog signal processing applications. More specifically, the present invention provides a single-chip analog programmable arbitrary waveform generator 2003 that may be used for a variety of signal processing applications, such as, but not limited to, analog direct digital synthesis (DDS) systems, synchronous orthogonal frequency division multiplexing (OFDM), and built-in self testing for analog systems.

Figure 20A:
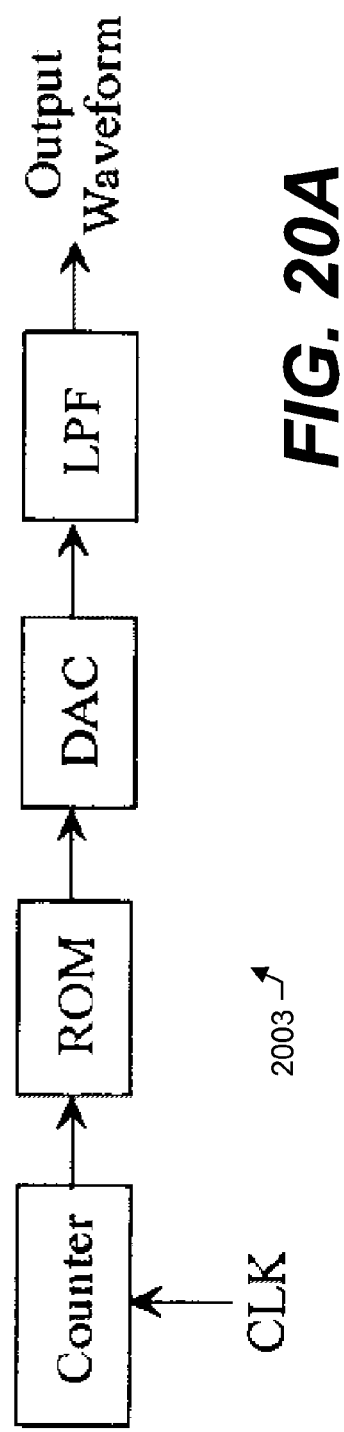
FIGS. 20A-20C, collectively known as FIG. 20, are block diagrams illustrating a programmable waveform generator in accordance with an exemplary embodiment of the present invention.
Figure 20B:
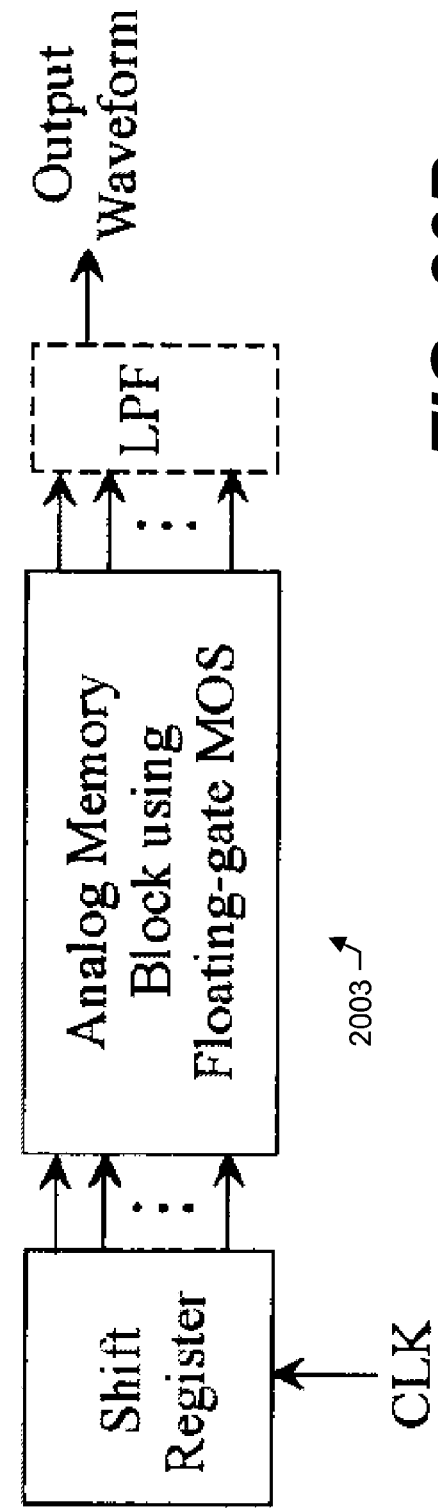
Figure 20C:
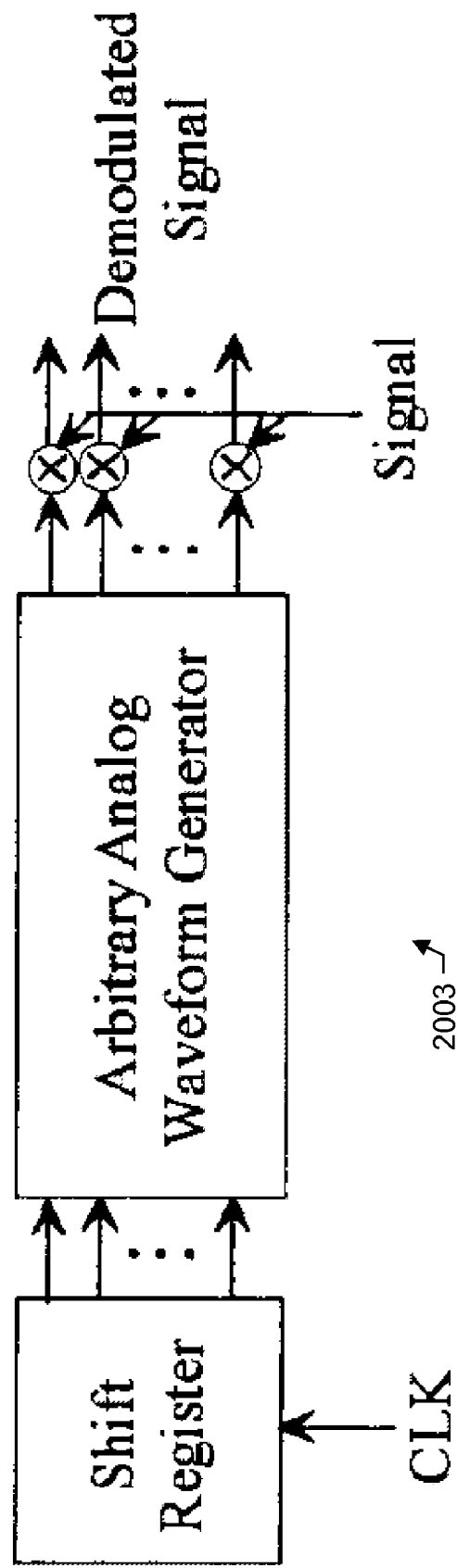

Using an exemplary DDS architecture, as illustrated in FIGS. 20A-B, the proposed analog waveform generator (AWG) 2003 may be fully programmable through the use of floating-gate MOS transistors arranged in an array structure. In one embodiment of the present invention, the AWG 2003 may be implemented using a large-scale FPAA 100, as described above. Alternatively, the AWG may be implemented separately from the large-scale FPAA 100, such that the AWG utilizes its own array of floating-gate transistors.

The basic idea in the DDS architecture is to generate the signal in the digital domain and then utilize digital-to-analog conversion and filtering to reconstruct the waveform in the analog domain. The utilization of an array of floating-gate elements that may be programmed accurately provides multiple advantages over conventional processing.

The AWG 2003, in accordance with the present invention, does not require a digital-to-analog converter as typically used in DDS systems, and may use one floating-gate MOS transistor 103 for each analog value to be stored. Floating-gate MOS transistors 103 may include modified EEPROM elements in a standard CMOS process that may be programmed accurately. Each column, row, or combination thereof, in the floating-gate array of the analog waveform generator 2003 may be programmed to generate an individual arbitrary waveform. Differential waveforms may be generated using two columns of floating-gate elements within the floating-gate array.

For example, an important application where the programmable arbitrary waveform generator 2003 may be used as a building block for a programmable analog modulator/demodulator (PAMD). The PAMD may be one of the fundamental blocks in a transceiver, thereby enabling a significant number of other signal processing functions in the analog domain. The present invention provides a power and area efficient approach, as compared to complex DSPs, and relaxes the requirement on the design of converter specifications. The proposed PAMD implementation may be used in various communication schemes such as, but not limited to, orthogonal frequency division multiplexing (OFDM) and radar signal processing. Advantageously, the arbitrary waveform generator 2003 of the present invention allows the generated waveforms to be arbitrary, yet programmable.

Indeed, floating-gate transistors may be effectively used for storing charges, which may be used to generate a desired waveform. Generally, as illustrated in FIGS. 22A-22D a floating-gate may be a MOS gate surrounded by silicon-dioxide with no direct current path to ground; hence, the name floating-gate. The charge on the floating-gate is stored permanently, because it is completely surrounded by a high-quality insulator. Accordingly, the floating-gate may be used as long-term memory. The floating-gate PMOS is very similar to the one used in digital EEPROM memories. The floating-gate voltage, determined by the charge stored on the floating gate, may modulate a channel between a source and drain, and therefore, may be used in computation.

The charge on a floating-gate device may be modified using any of the following methods: UV photo injection, hot-electron injection, and electron tunneling. The current through each floating-gate device is generally given as $$I = I_o e^{-\kappa V_{charge}/U_T},\quad (2)$$

where $I_o$ is the DC bias current in an entire column and $V_{charge}$ depends on the charge offset programmed on each floating-gate MOS 103.

Figure 22A:
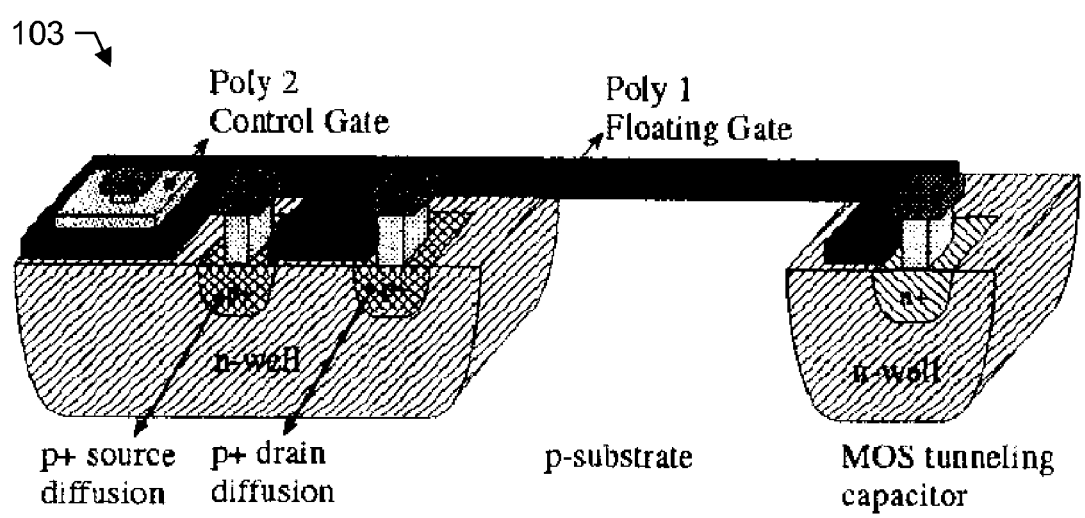
FIGS. 22A-22D, collectively known as FIG. 22, are a diagram and charts illustrating a floating-gate MOS device in accordance with an exemplary embodiment of the present invention.
Figure 22B:
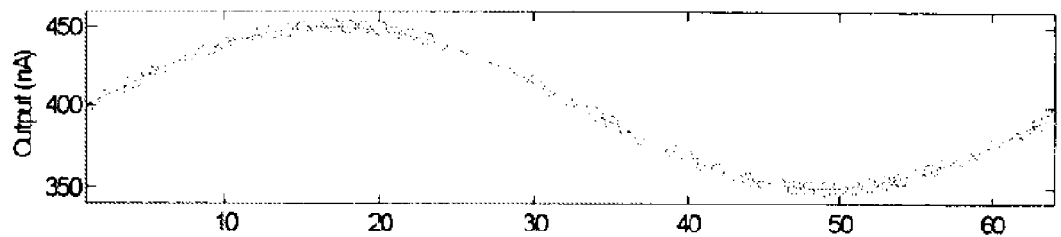
Figure 22C:
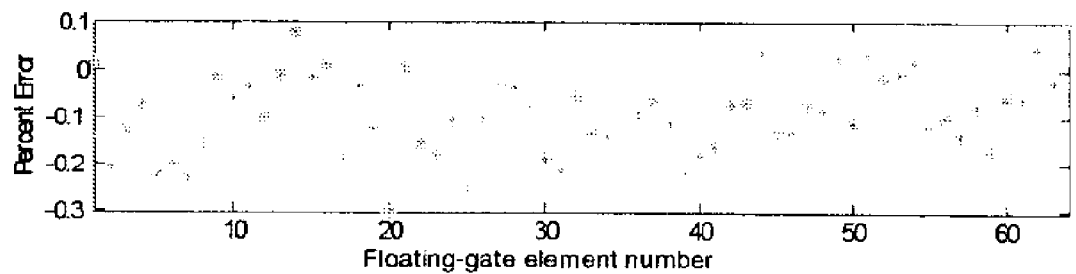
Figure 22D:
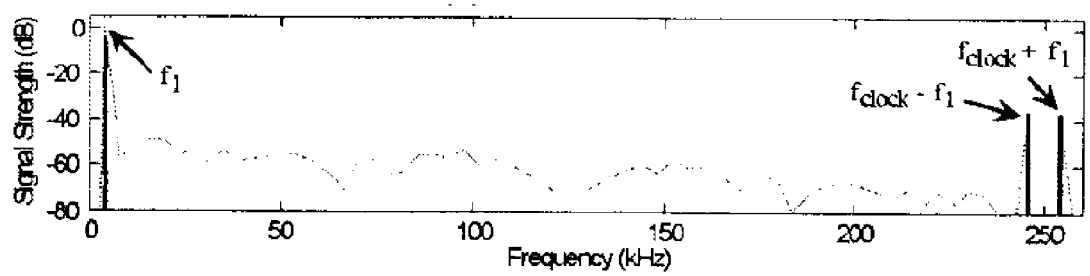

One notable aspect of the programmable waveform generator is programming accuracy. Accordingly, the programming scheme of the present invention is based on using both hot-electron injection and electron tunneling. As no special oxide or extra gate is needed to program these devices, easy integration is possible for typical CMOS processes. The adaptive programming method of the present invention enables accurate and fast programming. The algorithm computes the drain-to-source voltage ($V_{ds}$) based on the device current and target current. This value may be adjusted automatically as the device current approaches the target current. FIGS. 22B-D show a measurement of a programmed 100nA$_{pp}$ sine wave riding on a 400 nA DC current for a 64 element column. As evident from equation (2), the programmed current shown in FIGS. 22B-D may be proportional to the charge stored on each floating-gate node. Preferably, a programming error of no more than 0.2% is obtained, and programming is achieved using about 10 pulses of 100 us for each floating-gate.

The fast Fourier transform (FFT) of this waveform is also shown in FIGS. 22B-D and is clearly limited by the quantization noise. In the exemplary data provided in FIG. 22, the FFT was performed assuming a 256 us time-period for the entire programmed sine-wave to compare performance with the measured result, as provided below.

The AWG 2003 of the present invention does not require a digital-to-analog converter (DAC) and uses floating-gate MOS transistors 103 as analog ROM. All columns (or rows) in the waveform generator 2003 may consist of floating-gate MOS transistors 103 that may be programmed to any analog value. In practice, a predetermined column (or row) of a floating-gate transistor array 120 may be programmed to hold sampled portions of the desired waveform, such that the entire waveform may be represented within a portion of the column (or row). To generate the waveform, a shift register scans through the column (or row) of programmed floating-gates, thereby outputting the stored sampled portions of the waveform. The result of the scan is the generation of the sampled waveform at the output. Using this architecture, any arbitrary waveform may be programmed and outputted when needed.

Figure 21A:
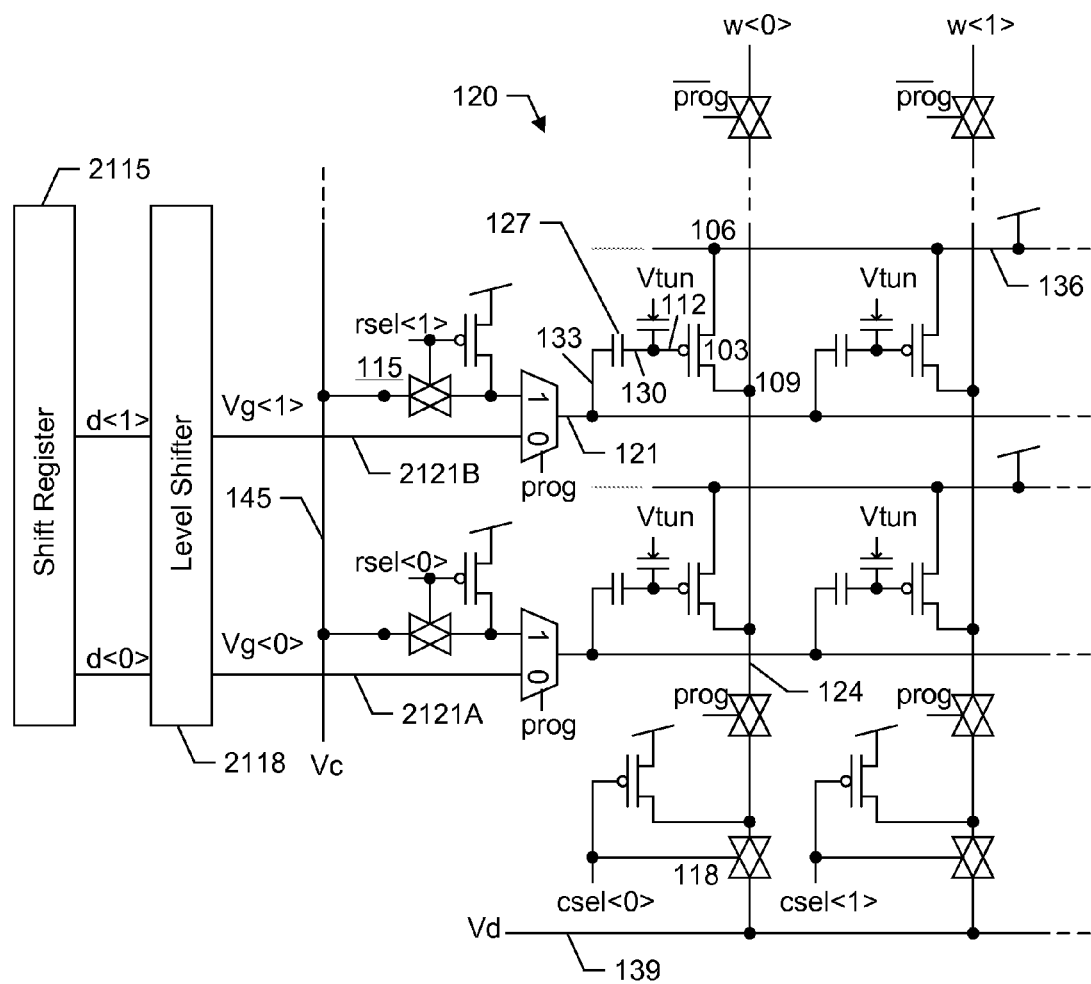
FIGS. 21A-21E, collectively known as FIG. 21, are schematic diagrams illustrating the implementation of an arbitrary analog waveform generator in accordance with an exemplary embodiment of the present invention.

FIGS. 21A-21D provide diagrams illustrating the implementation of an arbitrary analog waveform generator 2003. As illustrated in FIG. 21A, the floating-gate transistor array 120 utilized in the analog waveform generator 2003 may comprise a plurality of transistors 103, such that each transistor 103 includes a source 106, a drain 109, and a floating-gate 112. Generally, the floating-gate transistor array 120 may be configured to include at least two rows and at least two columns of transistors 103, thereby forming a traditional array configuration. Although FIG. 21A provides a floating-gate transistor array 120 having two columns of transistors 103 and two rows of transistors 103 (e.g., a 2×2 array of transistors 103), the analog waveform generator 2003 of the present invention may include an array having many additional rows and columns of transistors 103 or, alternatively, may include a two column, one row (2×1) or one column, two row (1×2) transistor configuration. Indeed, the dashed lines in FIG. 21A indicate that the illustrated floating-gate transistor array 120 is only a portion of a larger, more complete floating-gate transistor array 120.

The floating-gate transistor array 120 may also include a plurality of row programming switches 115 and a plurality of column programming switches 118, such that a row programming switch 115 exists for each row of transistors 103 within the floating-gate transistor array 120 and a column programming switch 118 exists for each column of transistors 103 within the floating-gate transistor array 120. Each row programming switch 115 includes an output 121 in communication with each transistor 103 of the corresponding row. Similarly, each column programming switch 118 includes an output 124 in communication with each transistor 103 of the corresponding column. More specifically, each drain 109 of each transistor 103 within a specific column is coupled to the output 124 of the corresponding column programming switch 118.

Further, the floating-gate transistor array 120 of the FPAA 100 may include a plurality of capacitors 127, for coupling the floating-gate 112 to the programming selection switch. Each capacitor 127 includes a first terminal 130 and a second terminal 133. The first terminal 130 of a capacitor 127 may be coupled with the floating-gate 112 of a corresponding transistor 103, while the second terminal 133 of the capacitor 127 may be coupled with the output 121 of the corresponding row programming switch 115. Accordingly, each floating-gate 112 of each transistor 103 within a specific row may be in communication with the output 121 of the corresponding row programming switch 115 via a capacitor 127.

The floating-gate transistor array 120 may additionally include a plurality of source lines 136, such that a source line 136 exists for each row of transistors 103. The source 106 of each transistor 103 within a specific row may be coupled to the corresponding source line 136, thereby connecting all of the sources 106 of the transistors 103 within a row.

An external voltage source, such as the voltage applied to the drain 109 of the transistor 103 (i.e., $V_D$), includes an output 139 coupled with the input of each column programming switch 118. Providing a pulse to this output 139 line is the usual method of programming, when given a fixed source voltage 106 and gate voltage 121. Accordingly, the drain 109 for each transistor 103 may be pulled to the external voltage source for selection purposes during programming. Selection and programming of the floating-gate transistors 103 in the array is similar to that described above with reference to FIG. 1.

A level shifter 2118 and shift register 2115 may be coupled to each row programming switch 115, such that the row switch 115 may be used during run mode for the selection of floating-gate transistors 103 used to generate a waveform (based on the analog signal previously programmed on the floating-gate transistors 103). The level shifter 2118 provides the switch logic necessary for selecting the desired floating-gate transistors 103 within a column (or row) during run mode. After the desired floating-gate transistors 103 have been selected, the shift register scans through the column (or row), causing the stored signals to be driven to an output. The combination of analog signals effectuates the generation of the desired waveform.

Figure 21B:
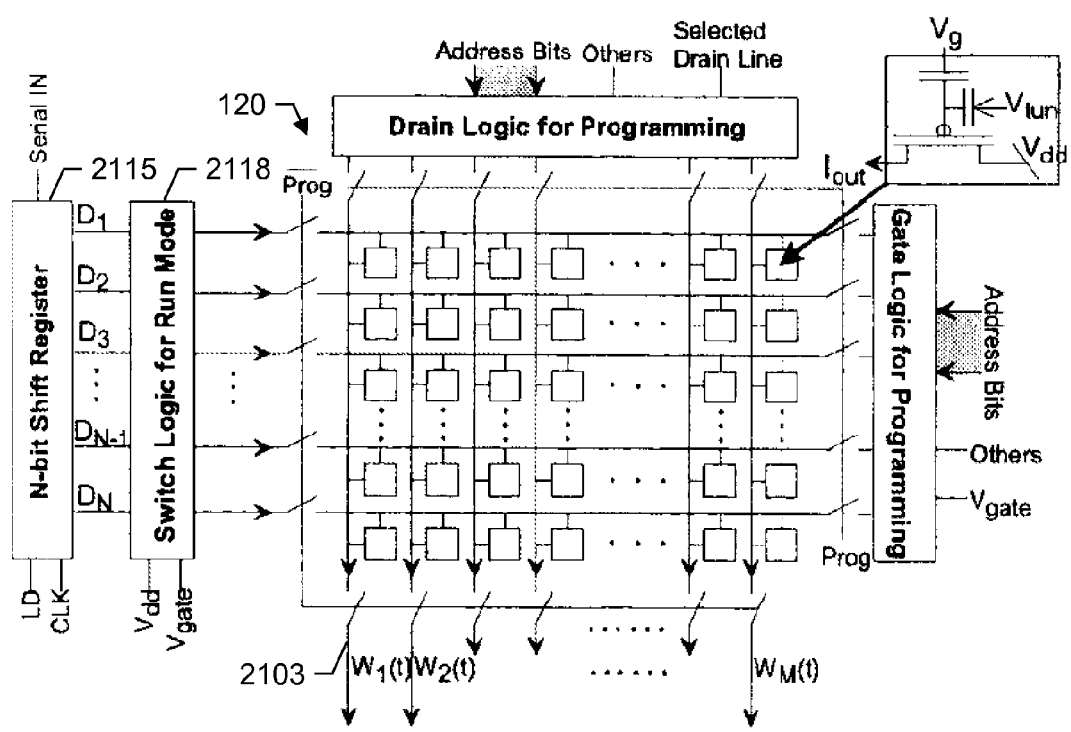

As illustrated in FIG. 21B, $W_1$ to $W_M$ may be any arbitrary set of current waveforms 2103 that are programmed and may be used to modulate or demodulate any input signal. As described above, this analog implementation eliminates the need for an adder at the output as the addition of currents may be accomplished by connecting the output of each floating-gate together. The generated waveforms may be sampled in a time-domain and may need to be cleaned by performing low-pass filtering to suppress any higher-order frequency components. In order to measure the performance of the waveform generator, simple current-amplifiers may be used at the output along with I-V converters to reliably measure the output, especially with lower current amplitudes.

The frequency of the generated waveforms may depend on the clock frequency and the number of floating-gate devices in each column. Frequency of the output waveform ($f_{out}$) with N floating-gate devices may be given by $Mf_{clk}/N$, where $f_{clk}$ is the clock frequency and M is the number of periods programmed in a particular column. Thus, the output frequency may either be elevated by increasing the clock frequency, $f_{clk}$ or by programming more than one period of the waveform on a single column of floating-gate devices. The latter will govern the low-pass filter (LPF) rejection requirements for getting clean output waveforms. Thus, the frequency of such a system may be a trade-off between the frequency of clock that may be generated cleanly and the complexity of the LPF acceptable at the output. Phase noise may be generated when the samples are randomly shifted off from the ideal output waveform. Any jitter in clock should be the major source of such noise and, thus, emphasizes the need for a clock signal with low jitter for better performance.

Figure 21C:
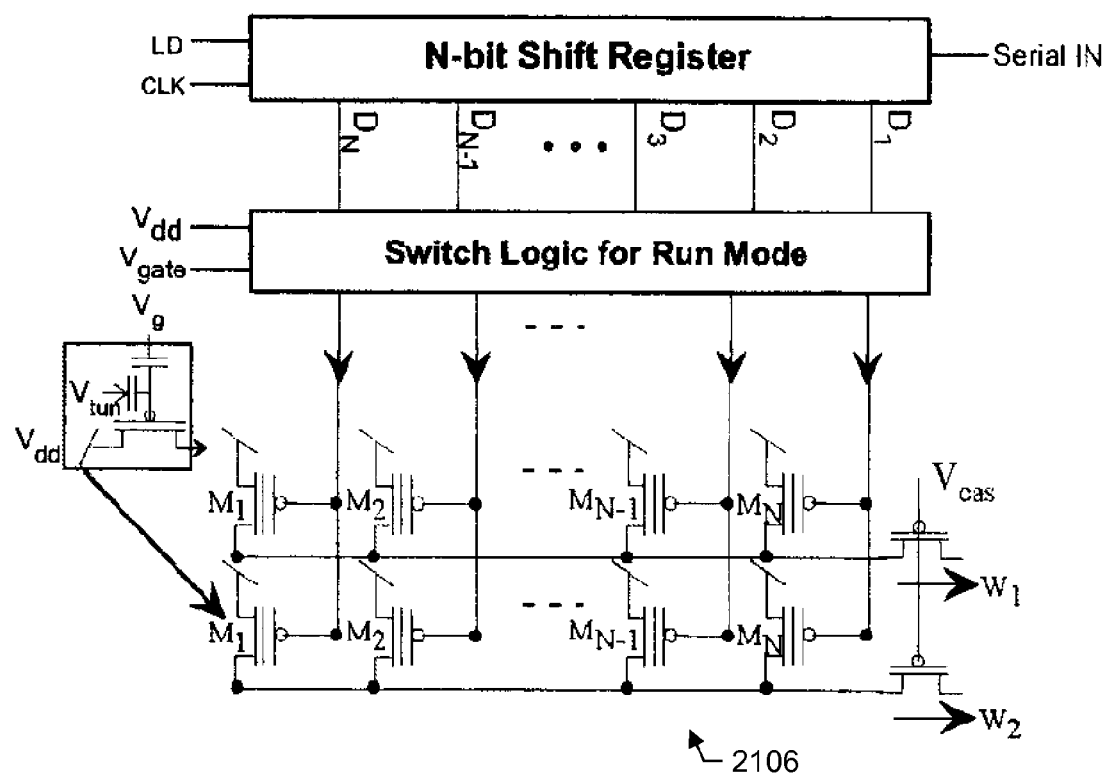

FIG. 21B shows the schematic of a single column of the exemplary AWG 2003 system with the $W_1$ and $W_2$ as the generated output current signal. The shift register 2106 that scans through the column of floating-gate transistors may be designed for appropriate frequency performance and may use dynamic logic for fast response. FIG. 21C illustrates the schematic of the D-flip flop (DFF) 2109 that is used to implement the shift register. The output of each DFF 2109 may be buffered to drive the floating-gate capacitance. The time constant for this DFF 2109 driving the floating-gate transistor 103 may be given by $$\tau_1 \approx R_{on} C_{in}, \quad (3)$$

where $R_{on}$ is the total series "on" resistance given by the buffers and $C_{in}$ is the capacitance looking into the gate and is approximately $C \| C_{gate}$. With a typical value of 20 fF for $C_{in}$ and 100 k for $R_{on}$, the time constant $\tau_1$ may be given as 2nS. This delay is much smaller than the time-constant caused by the line capacitance of the floating-gate column. Table 1 provides cut-off frequencies for various bias currents.

To reduce the effect of the line capacitance on the frequency response, a cascode may be added at the end of each column. The cascode lowers the impedance at the drain node of the floating-gates and isolates it from any variations at the output. Adding the cascode also helps improve the distortion due to the isolation from the output signal variations. The time constant at the drains of the floating-gate column may be given by, $$\tau_{-3\,dB} \approx \frac{nC_p + C_{cas}}{g_{m,cas}}, \quad (4)$$

where $C_p$ is the parasitic drain-to-bulk capacitance for each floating-gate device in an n element column, $C_{cas}$ is the parasitic source-to-bulk capacitance for the cascode device, $g_{m,cas}$ is approximately the conductance looking into the source node of the cascode device and is the transconductance of the cascode device. In general, $C_{cas}$ should be small compared to $nC_p$ for similar sized devices. This simplifies the time-constant for sub-threshold operation as, $$\tau_{-3\,dB} \approx \frac{nC_p U_T}{\alpha I_{bias}}, \quad (5)$$

where a is the ratio, $$\frac{C}{C + C_{gate}}$$

and $I_{bias}$ is the average bias current for the output waveform. Programming of floating-gate allows the time-constant for subthreshold operation to be set to any desired value. For a $C_p$ of 10 fF, Table 1 summarizes the $f_{-3dB}$ values for various bias currents.

TABLE 1

| n/$I_{bias}$ | 100 pA | 10 nA | 1 μA |
| --- | --- | --- | --- |
| 64 | 0.96 kHz | 96 kHz | 9.6 MHz |
| 256 | 0.24 kHz | 24 kHz | 2.4 MHz |
| 1024 | 60 Hz | 6 kHz | 0.6 MHz |

The frequency of the system may be increased by programming all the floating-gates at a higher bias current and also by supplying an auxiliary bias current to the cascode at all times. The performance may also be improved significantly by using an active cascode structure, but this would result in an increase in the total power consumption. The performance should now depend on the input stage, which may be a function of the number of parallel columns being driven and resistance of the switches. High speed operation of the complete system puts a design constraint on the clock speed as well. The quality of clock in terms of rise-time, fall-time, and jitter along with coupling of the clock will affect the quality of the generated signal. Thus, generating a clean clock signal for high frequency applications is preferable.

Figure 23A:
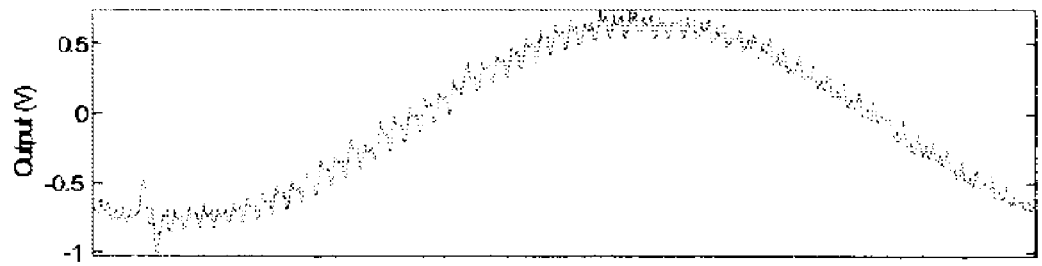
FIGS. 23A-23E, collectively known as FIG. 23, are charts illustrating frequency and time measurements of an analog waveform generator in accordance with an exemplary embodiment of the present invention.
Figure 23B:
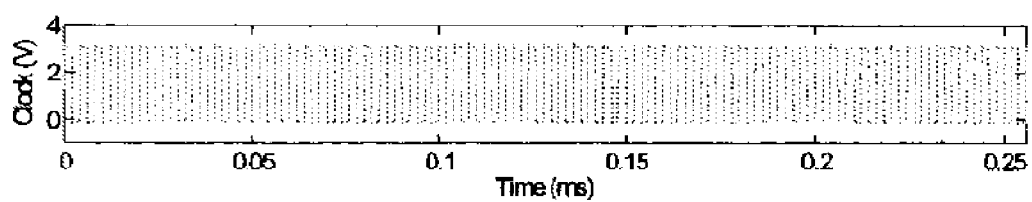
Figure 23C:
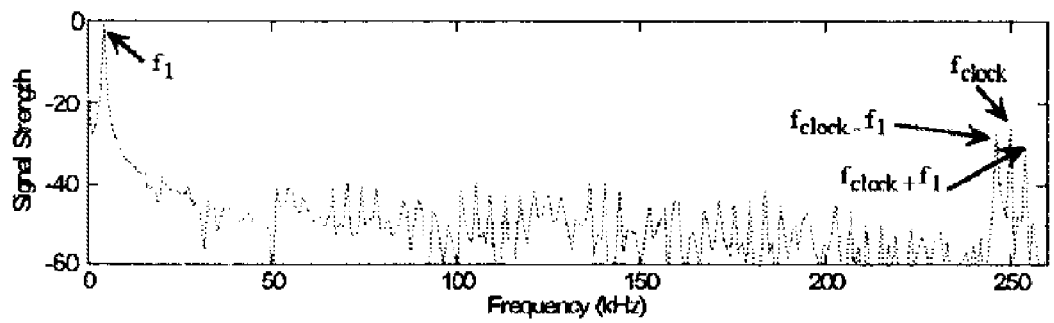

FIGS. 23A-23E illustrate frequency and time measurements of an analog waveform generator 2003. One skilled in the art will recognize that the provided data is for exemplary purposes only and, therefore, is not intended to limit the present invention. Moreover, FIGS. 23A-C show the measured output waveform as it may look when the clock (250 KHz) of the shift register is turned "on." As may be observed from the FFT of the programmed charges and the output waveform, a clean frequency may be generated without any observable higher-order harmonics. The broadening of the output spectrum in the form of phase noise may be due to the jitter of the clock used for the measurement. The FFT also provides the clock frequency and images of the signal around the clock frequency. Thus, the present invention should include a clean clock signal and a programmable lowpass filter at the output to filter out anything outside the bandwidth of the desired output waveform.

Figure 23D:
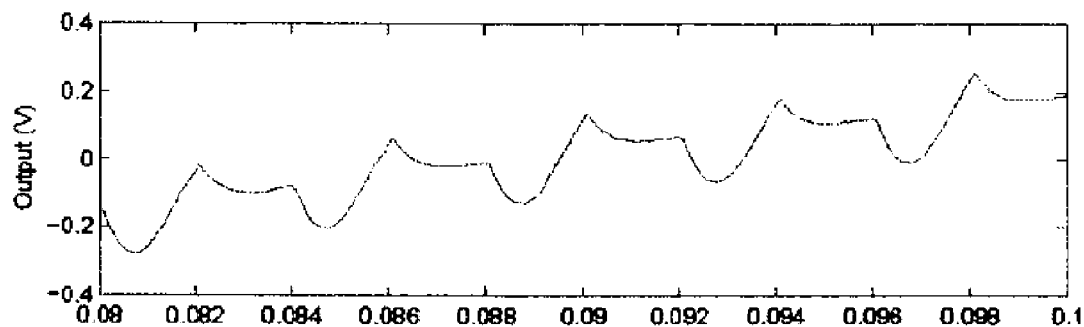
Figure 23E:
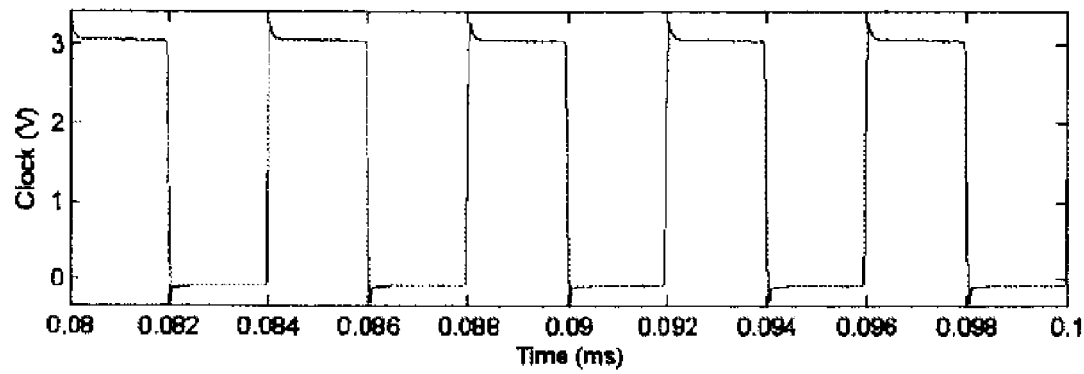

FIGS. 23D-E shows the zoomed-in plot for FIGS. 23A-C for a single-ended sine waveform. The edges in the generated waveform may be synchronized with the clock edges, which may also be determined from the FFT of the waveform. On the upward edge of clock, a dip may be encountered, followed by recovery to the new value. At the clock edge, one current source may be turning "off," while the second current source may be turning "on." The dip seems to be the first current source turning "off" before the second source turns "on." This may be minimized through improved layout of the clock signal as discussed below. There may be a slight overshoot on the downward edge before settling. This may be due to the overshoot in the clock edge at the downward edge that causes this settling overshoot. Accordingly, these components should also be suppressed by the LPF at the output along with any noise components outside the bandwidth.

FIG. 24 illustrates the measurement of the waveform generator block when programmed to ω and 2ω. Based on the measurement provided by FIG. 24, the waveform generator 2003 may clearly be used to synthesize any arbitrary waveform such as a chirp or any other modulating waveform. One skilled in the art will recognize, however, that the date provided in FIG. 24 is for exemplary purposes only, and is not intended to limit the scope of the invention.

The signal-to-noise ratio (SNR) of the AWG 2003 system depends on the bias current. Assuming the maximum signal swing is $I_{bias}/2$, SNR may be given by $$SNR(in\, amplitude) = \frac{I_{bias}}{2I_{noise}}, \quad (6)$$

where $I_{noise}$ is the noise current over the operating bandwidth of the element and is set by the bias current, $I_{bias}$. The noise bandwidth should be clock frequency, $f_{clk}$ but since the output is filtered, the SNR should be estimated by the cut-off frequency. Noise current, $I_{noise}$, and the SNR may be estimated using the noise bandwidth (f−3dB/2) for sub-threshold operation as $$I_{noise}(in\, amplitude) \approx \sqrt{\frac{2qI_{bias}^2}{2\pi \cdot nC_p U_T}}, \quad (7)$$

$$SNR(in\, amplitude) = \sqrt{\frac{\pi \cdot nC_p U_T}{4q}}. \quad (8)$$

Table 2 summarizes the values of SNR per $\sqrt{n}$ for various values of $C_p$. The system, therefore, is clearly noise limited. The performance may be elevated by increasing the total capacitance, which results in an increase in power, to get the same time constant.

TABLE 2

|  | $C_p$(1F) | | |
| --- | --- | --- | --- |
|  | 5 | 20 | 50 |
| SNR√n(dB) | 29.6 | 35.6 | 39.6 |
| SNR (n = 1024)(dB) | 59.7 | 65.7 | 69.7 |

Figure 21D:
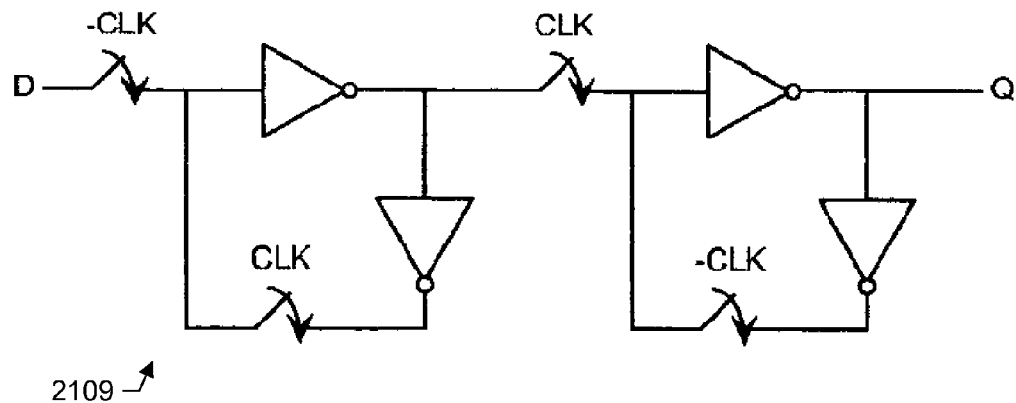
Figure 21E:
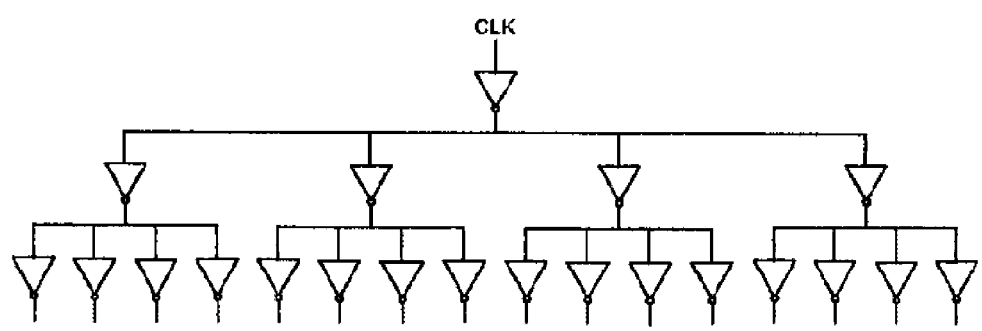

As shown in FIG. 21D, Clock and −Clock signals should be generated with equal delays such that there may be no time difference at zero-crossing in order to minimize any phase noise generation. The distribution of Clock and −Clock to the entire shift register in the layout is preferred to improve for the performance of such a system. A tree layout 2112, as shown in FIG. 21E, may be used with a chain of inverter buffers to minimize any such delays. Along with these sources, any error in the programmed value of the floating-gate charge may also be modeled as phase noise in the output spectrum. Minimizing the error will further improve the phase noise performance. One other source of error in sampled systems is quantization error. The number of floating-gate devices 103 in each column determines the quantization error in the output waveform. As in a DDS system, the quantization error appears as a periodic additive term rather than a random noise as long as the ratio of $f_{clk}$ and $f_{out}$ is a rational number. Thus, the resulting error and its harmonics occur as spurs in the output spectrum. The amplitude of these spurs may be determined by the programming accuracy of the floating-gate charge and may be suppressed by the LPF at the output.

The power dissipation may have an analog and a digital component. Assuming only one floating-gate element is effectively "on" for each period of clock cycle, the analog power dissipated in the floating-gate elements for differential operation may be given by $2 I_{bias} V_{dd}$. The digital component depends on the clock frequency and may be given by approximately as $$\frac{C_{in}V_{dd}^2 f_{clk}}{2}.$$

The minimum power supply for sub-threshold operation of the system in a particular technology may be limited by the speed of digital logic of the system as opposed to the analog block.

Figure 25A:
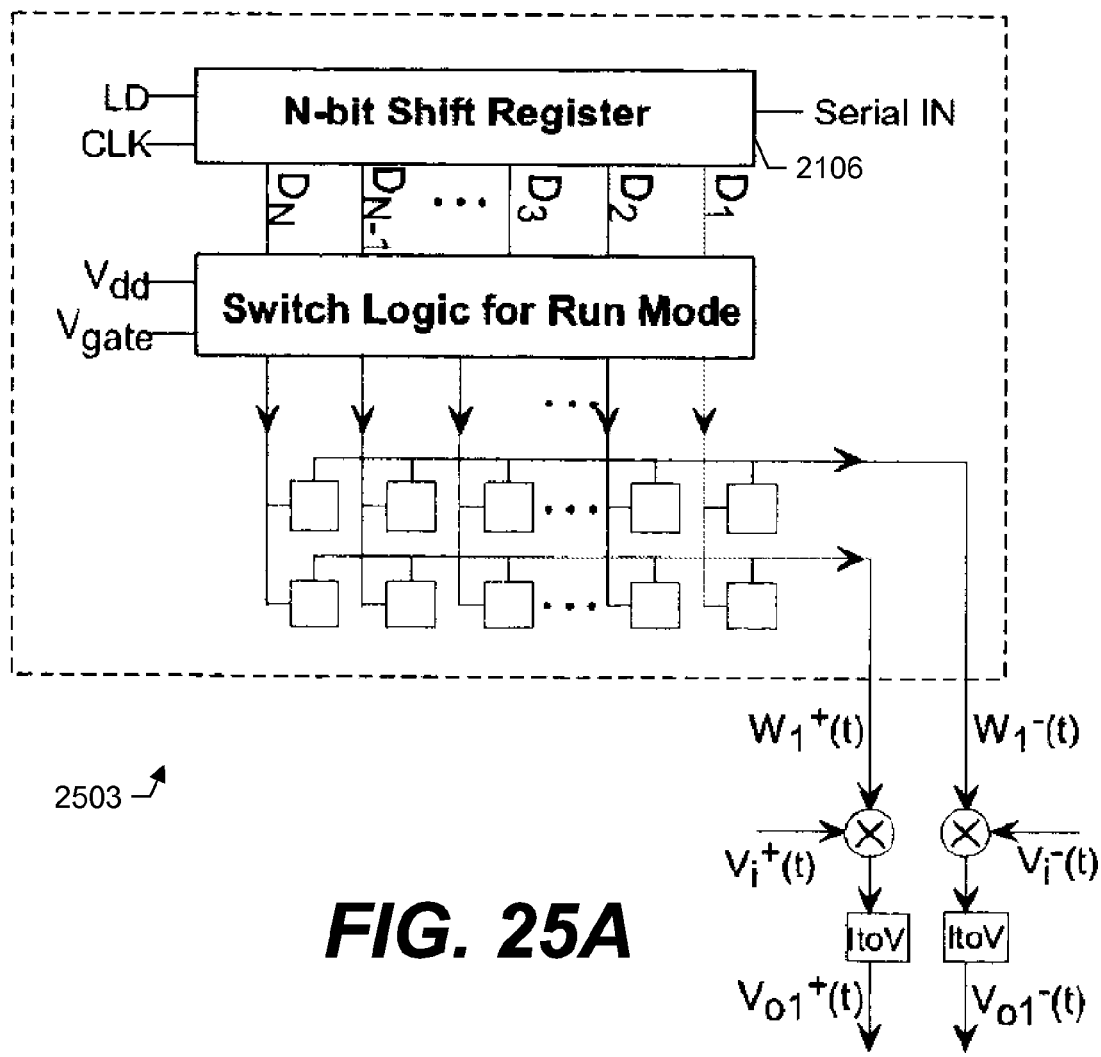
FIGS. 25A-25D, collectively known as FIG. 25, are schematic diagrams illustrating a modulation/demodulation integrated circuit implementation in accordance with an exemplary embodiment of the present invention.
Figure 25B:
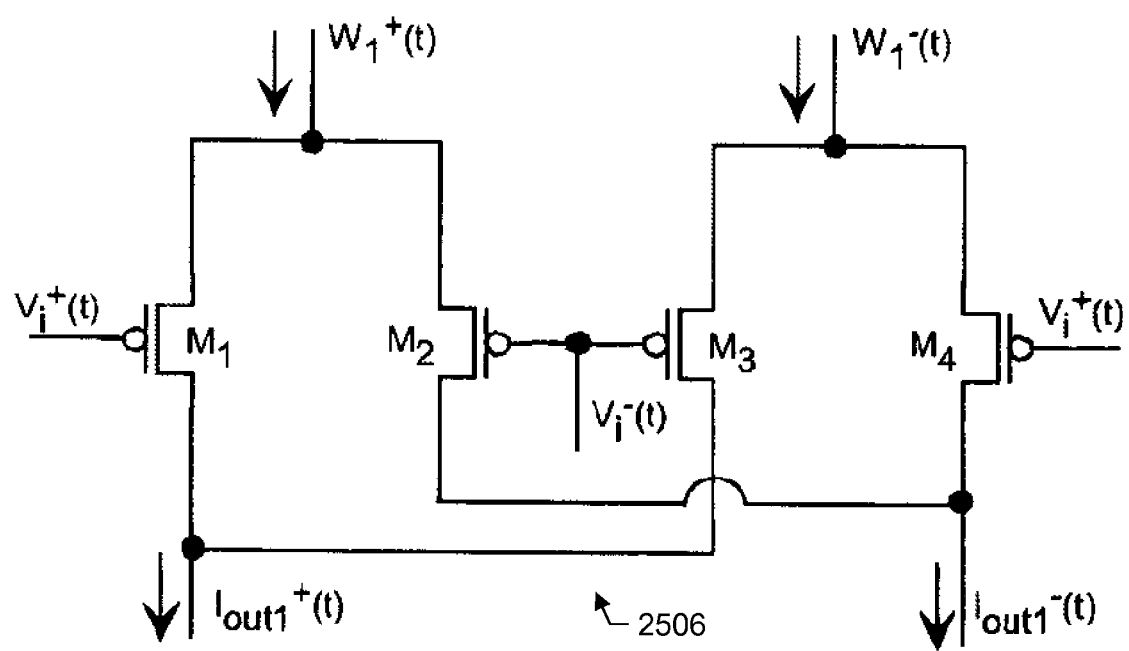
Figure 25C:
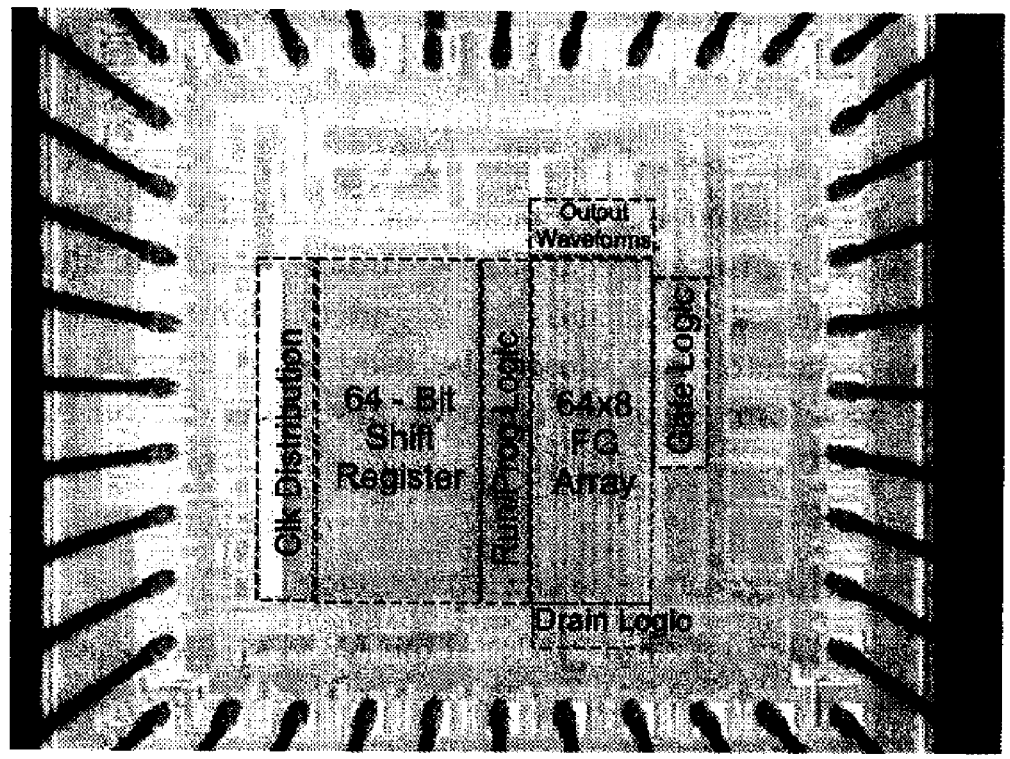

FIG. 25A illustrates a block diagram of the programmable analog modulator/demodulator (PAMD) system 2503 using the floating-gate waveform generator 2003 of the present invention. The system may be easily extended for multi-channel system implementation by adding more rows to the waveform generator. The PAMD system 2503 may have differential gilbert-cell mixers 2506, as shown in FIG. 25B, at the output to modulate or demodulate the differential input signal. FIG. 25C provides a die photograph of the PAMD IC prototype 2503 utilizing the arbitrary waveform generator. The number of outputs may be easily increased without having to significantly increase the area. Indeed, the total area occupied by the system may be approximately 0.8 mm². The fabricated integrated circuit may generate four fully-differential arbitrary analog waveforms. Generally, the IC prototype of FIG. 25C is fabricated in 0.5 μm standard CMOS technology.

Figure 26A:
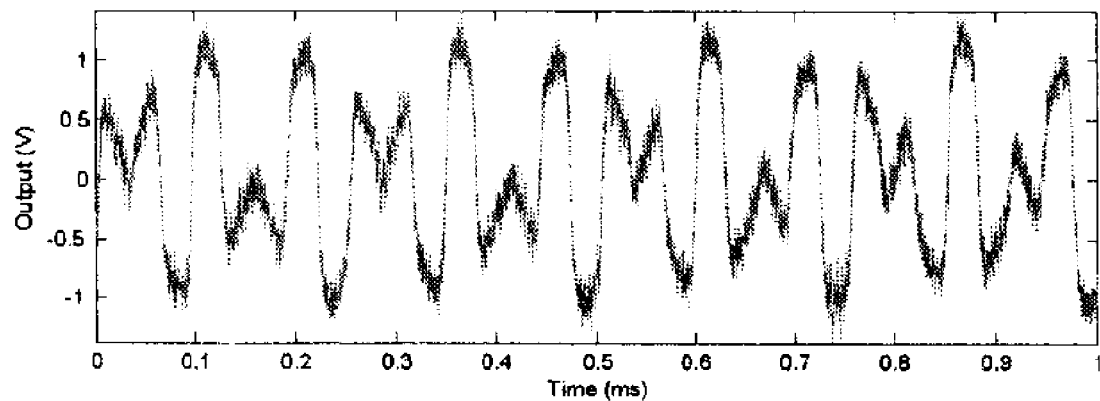
FIGS. 26A-26D, collectively known as FIG. 26, are charts illustrating various measurements of modulation and demodulation using an analog modulator/demodulator (PAMD) in accordance with an exemplary embodiment of the present invention.
Figure 26B:
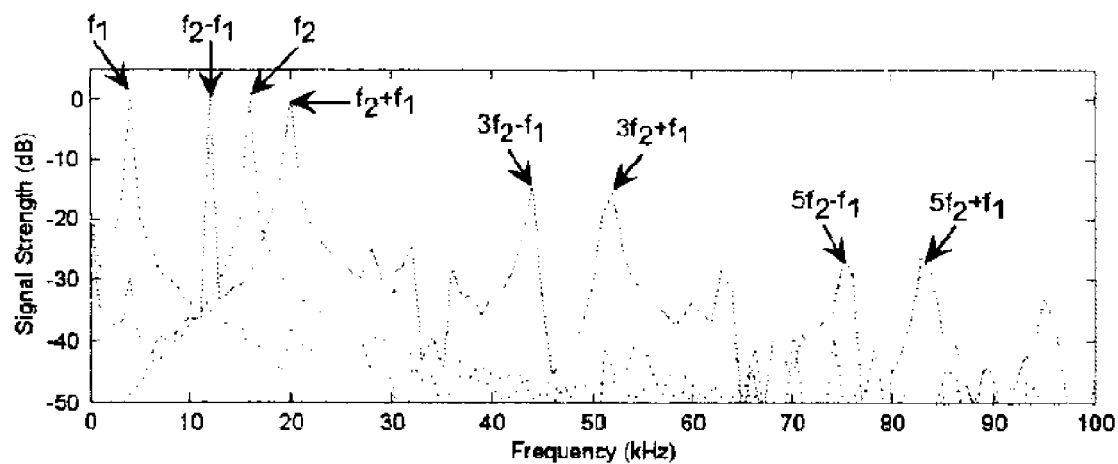

FIGS. 26A-26D illustrates various measurements of modulation and demodulation using an analog modulator/demodulator (PAMD) 2503. More specifically, FIGS. 26A-B show the output when a 15.9 kHz input signal is modulated with the 3.9 kHz signal generated by the modulator. The input signal source may have a limited phase noise performance. In an exemplary embodiment of the present invention, the 3.9 kHz signal may be generated with a sine wave programmed on a row of 64 floating-gates and using a clock speed of 250 kHz. FIGS. 26A-B illustrates the basic modulation operation and shows the FFT of the output spectrum. The output spectrum signal may be appropriately filtered to select the desired signal. One skilled in the art will recognize that the data provided in FIG. 26 is for exemplary purposes only and is not limiting.

Figure 26C:
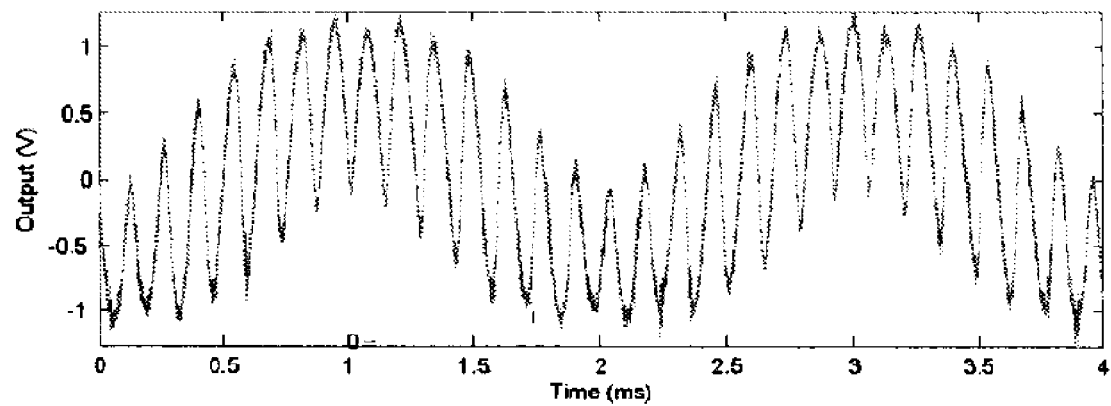
Figure 26D:
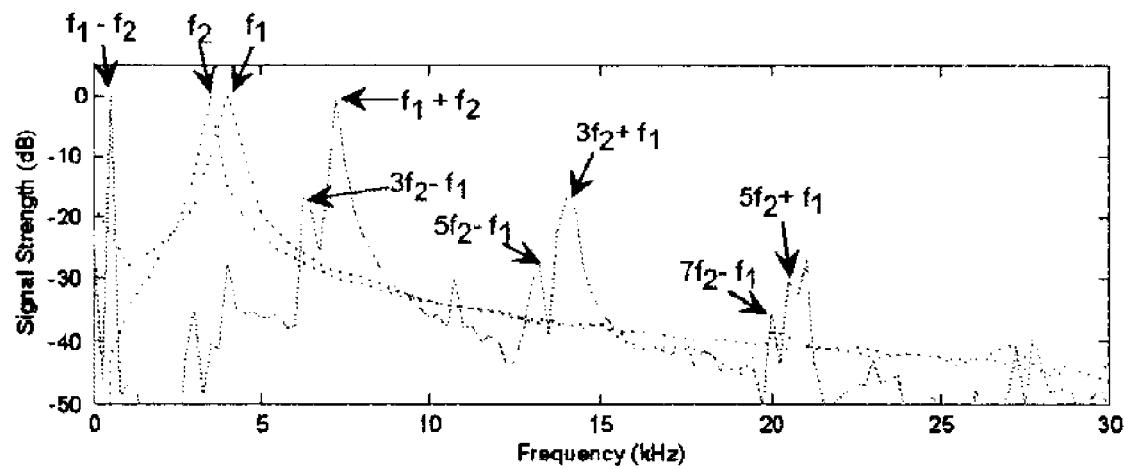
Figure 27A:
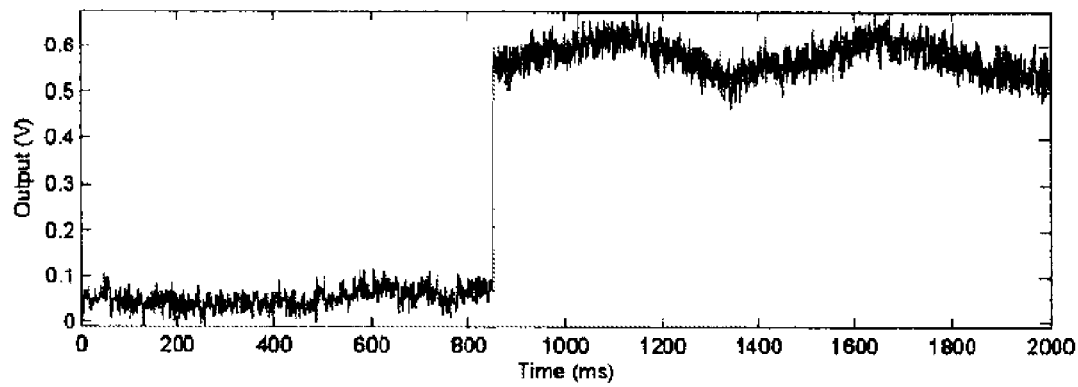
FIGS. 27A-27B, collectively known as FIG. 27, are charts illustrating frequency and time measurements of a demodulated input signal in accordance with an exemplary embodiment of the present invention.
Figure 27B:
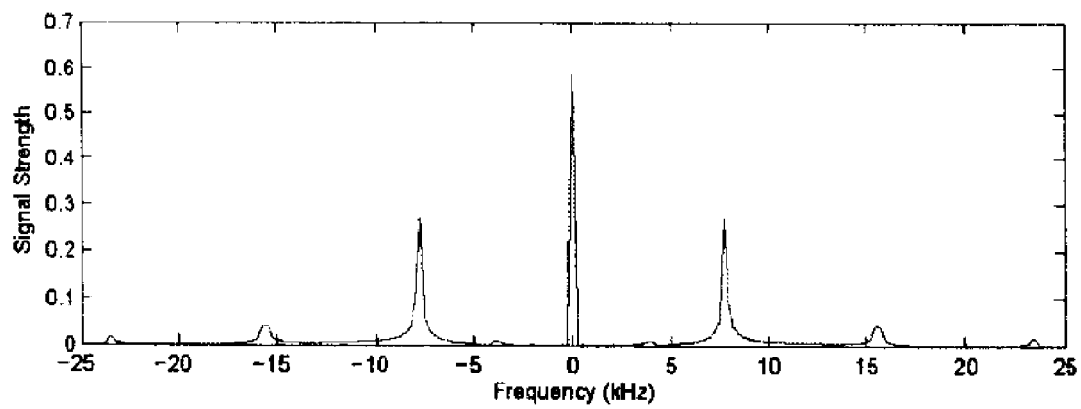

FIGS. 27A-27B provide frequency and time measurements of a demodulated input signal. Together, FIGS. 26B and 27 show the demodulation operation to near DC and at DC for the input signal, respectively. FIGS. 26C-D provide the measurement when a 3.4 KHz input signal is demodulated to 500 Hz using the generated waveform, 3.9 KHz. This signal may be easily filtered from the spectrum to reject the high frequency spurious signal at 7.3 KHz. FIGS. 27A-27B provide the demodulation to extract the DC signal strength of the input signal by demodulating it to DC. In the current embodiment, the input signal may be left running and output of the modulator may be turned "on" after some time to see the transition in the DC level of the output signal. The output waveform may still have a very slow AC component of approximately 1.5 Hz. This may be attributed to the limited precision of the function generator used to provide the input signal (i.e. 3.9015 kHz as opposed to 3.9 kHz). As is clearly evident, this may be used to extract the spectral content of an input signal at desired frequencies by demodulating them with the desired frequencies and filtering the DC signal out. One skilled in the art will recognize that the frequency and time measurements are for exemplary purposes only and, therefore, the charts in FIGS. 27A-27B provide a better understanding of the invention, without limiting the scope of the invention.

Table 3 summarizes the performance of an exemplary, fabricated PAMD IC prototype. The exemplary prototype used a 3.3 V power supply for operation. The proposed PAMD architecture may be used for a variety of other applications along with the described modulator/demodulator. The key advantage for the presented architecture is due to the ability to generate programmable arbitrary waveforms. One such application may be generating arbitrary waveforms to perform on-chip testing of other circuits and systems. This may be easily made as part of a built-in self test circuit with a control loop to test various designs.

TABLE 3

| Parameter | PAMD Performance |
|---|---|
| Power Supply | 3.3 V |
| Array Size | 64 × 8 |
| FG Transistor Dimension | 24/4 |
| Chip Area | 0.8 mm$^2$ |
| Clock Speed | <500 MHz |
| Analog Power/cell | 16.5 μW @ 500 MHz |
| Digital Power/cell | 0.9 mW @ 500 MHz |
| Programming % error | <±0.2% |
| Programming Time | 1 mSec |
| Programming mechanism | Hot-electron injection and Fowler-Nordheim tunneling |
| Tunneling Voltage (V) | 15 |

Figure 24A:
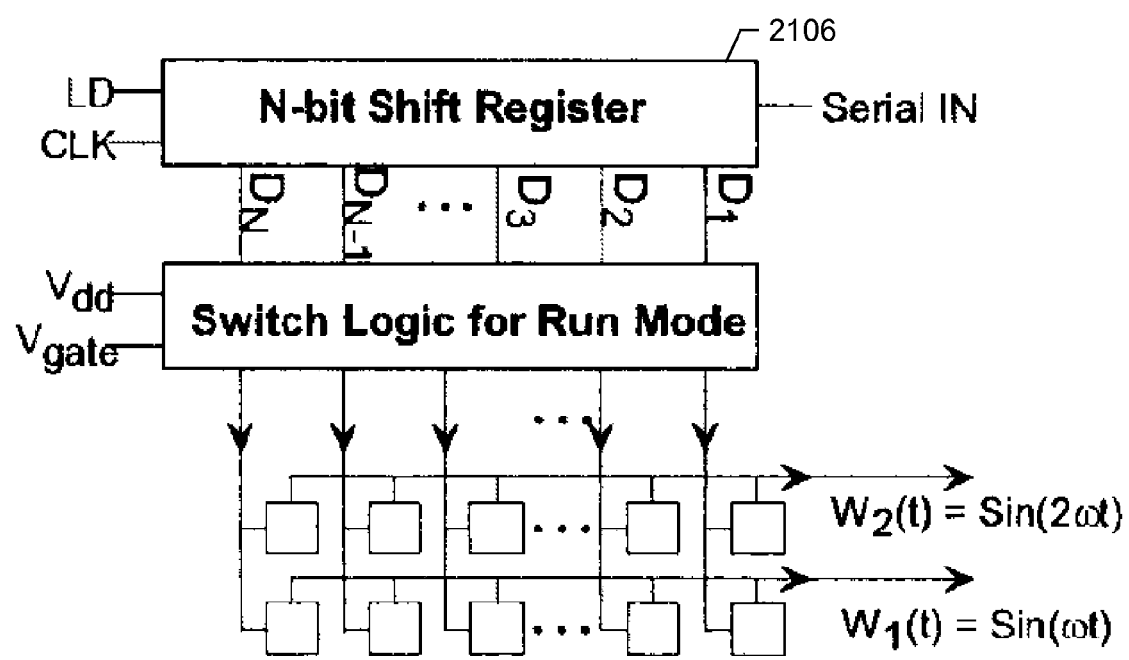
FIGS. 24A-24D, collectively known as FIG. 24, are a block diagram and charts illustrating a generated output waveform from an analog waveform generator in accordance with an exemplary embodiment of the present invention.
Figure 24B:
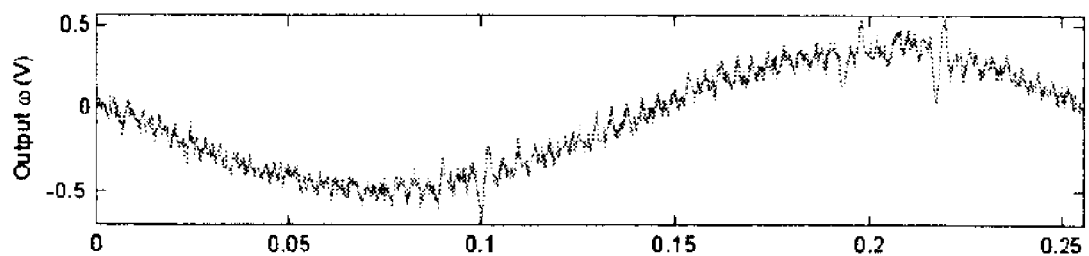
Figure 24C:
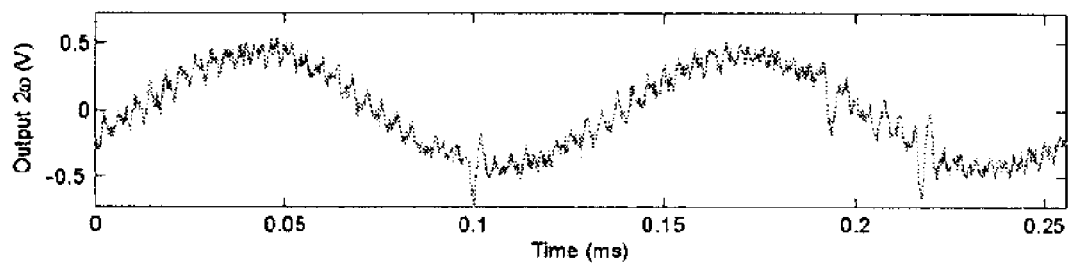
Figure 24D:
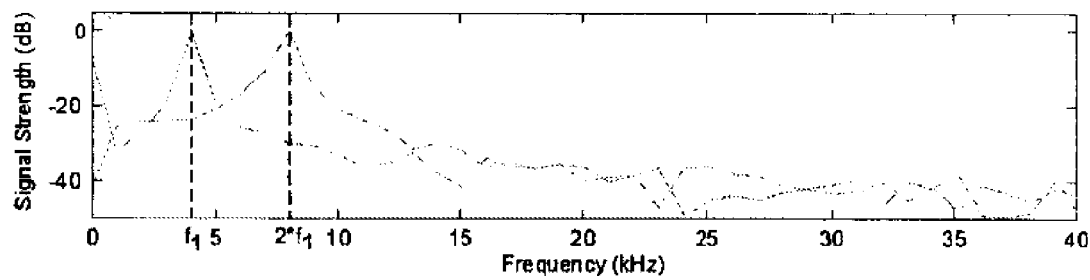
Figure 25D:
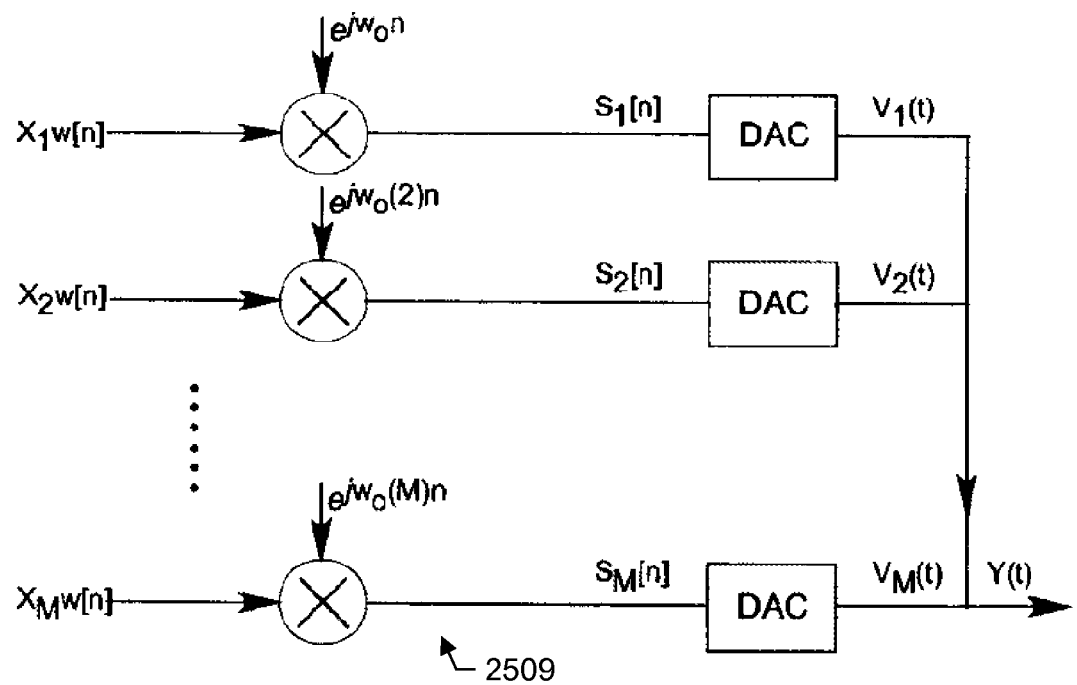

FIG. 25D provides a digital implementation of an OFDM transmitter 2509 requiring DACs for each channel and an FFT computation block. Such a system may be easily implemented as an analog system using the PAMD and, thus, eliminates the need for wideband data converters. FIG. 25A and FIG. 24A illustrates how the PAMD 2503 may be used for OFDM-based communication schemes, where multiples of fundamental frequencies are used to orthogonally modulate different channels. The same waveforms may be used to demodulate the input signal for different channels at the receiver end. Traditionally, these operations are performed as FFT/IFFT in digital domain, which are power intensive and spatially expansive. The implementation of the OFDM transmitter 2509 using PAMD 2503 also eliminates the need for a wideband DAC for each channel. The presented waveform generator may be used as a part of an adaptive equalizer system. The present invention may be programmed to generate any waveform that may be used to then perform equalization. The compact nature of the architecture and low power consumption makes the present invention suitable for multiple-channel processing and array signal processing.

The present invention provides for large-scale FPAAs 100 based on floating-gate technologies including the necessary levels of programmability and functionality to implement complex signal processing systems. The floating-gate transistors 103 are shown to provide a compact switch that exhibits relatively flat resistance characteristics across the full operating voltage and can be programmed to be an active circuit element (variable resistor). Systems implemented on these FPAAs 100 are programmable over a wide range of frequencies, Q-peaks, bandwidths, and/or time constants. With orders of magnitude power consumption savings over traditional digital approaches, this reconfigurable analog technology offers an attractive alternative for implementing advanced signal processing systems in low-power embedded systems.

The present invention also provides for an analog modulator/demodulator (PAMD) 2503 using an arbitrary analog waveform generator 2003 that can be used for various communication schemes and array signal processing applications. This approach may be both power and area efficient compared to existing implementations using DSPs. The PAMD 2503 consists of a programmable arbitrary waveform generator 2003 using floating-gate MOS devices. The present invention, with proper design, may be used for a variety of complex analog applications, including large-scale FPAAs.

Further, the present invention demonstrates that a floating-gate pFET 103 may be used as a viable switch and computational element in an FPAA 100. The floating-gate pFETs 103 are capable of transmission-gate resistance levels with a capacitance on the order of a single pass-FET. As a result, FPAAs 100 using floating-gate pFETs 103 may have a significant bandwidth advantage over traditional transmission gate architectures. The present invention also removes the isolation switch components generally coupled with each transistor 103 and provides a single switch for each row and each column of an array, thereby greatly decreasing the amount of die space required to implement the FPAA system 100. Programming a particular transistor 103, a row or column of transistors 103, or a subset of transistors 103 may be accomplished through selection programming.

Moreover, the present invention provides a unique method of programming the transistor 103 by utilizing saturation techniques, instead of conventional pulse and measure methodology. The present invention uses the relationship between the gate voltage and the saturation point of the transistor 103 to accurately program the desired current to the programmer transistor 103, and, accordingly, to the operational transistor 103.

Numerous characteristics and advantages have been set forth in the foregoing description, together with details of structure and function. While the invention has been disclosed in several forms, it will be apparent to those skilled in the art that many modifications, additions, and deletions, especially in matters of shape, size, and arrangement of parts, can be made therein without departing from the spirit and scope of the invention and its equivalents as set forth in the following claims. Therefore, other modifications or embodiments as may be suggested by the teachings herein are particularly reserved as they fall within the breadth and scope of the claims here appended.

What is claimed is:

1. A field programmable analog array comprising:
a first transistor having a first source, a first drain, and a first floating gate;
a second transistor having a second source, a second drain, and a second floating gate;

a first capacitor having a first terminal and a second terminal, wherein the first terminal of the first capacitor is coupled to the first floating gate of first transistor;

a second capacitor having a first terminal and a second terminal, wherein the first terminal of the second capacitor is coupled to the second floating gate of the second transistor;

a first row programming switch having a first output, wherein the first output of the first row programming switch is coupled to the second terminal of the first capacitor and the second terminal of the second capacitor;

a third transistor having a third source, a third drain, and a third floating gate;

a third capacitor having a first terminal and a second terminal, wherein the first terminal of the third capacitor is coupled to the third floating gate of the third transistor;

a second row programming switch having a first output, wherein the first output of the second row programming switch is coupled to the second terminal of the third capacitor;

a first column programming switch having a first output, wherein the first output of the first column programming switch is coupled to the first drain of the first transistor and the third drain of the third transistor;

a second column programming switch having a first output, wherein the first output of the second column programming switch is coupled to the second drain of the second transistor; and a computational analog block having a first terminal coupled to the first source of the first transistor and a second terminal coupled to the third source of the third transistor.

2. The field programmable analog array of claim 1, wherein the first source line of the first transistor and the second source line of the second transistor are coupled to a common source node.

3. The field programmable analog array of claim 1, wherein the first drain line of the first transistor and the third drain line of the third transistor are coupled to a common drain node.

4. The field programmable analog array of claim 1, wherein the computational analog block further has a third terminal, the field programmable analog array further comprising:
a fourth transistor having a fourth source, a fourth drain, and a fourth floating gate, the fourth source being coupled to the third terminal of the computational analog block.

5. The field programmable analog array of claim 1, wherein the computational analog block comprises:
a first analog component having high granularity; and
a second analog component having low granularity.

6. The field programmable analog array of claim 1, wherein the computational analog block comprises:
a plurality of operational transconductance amplifiers;
an nFET; and
a pFET.

7. The field programmable analog away of claim 6, wherein the computational analog block further comprises a plurality of programmable bandpass elements.

8. The field programmable analog away of claim 6, wherein the computational analog block further comprises a programmable min/max amplitude detector.

9. The field programmable analog away of claim 6, wherein the computational analog block further comprises a plurality of capacitors, wherein at least two of the plurality of capacitors are connected to ground.

10. A method of producing a variable analog wave, the method comprising the steps of:
storing a first analog charge representative of a first portion of an analog waveform on a first floating gate transistor;
storing a second analog charge representative of a second portion of the analog waveform on a second floating gate transistor;
outputting the first analog charge; and
outputting the second analog charge.

11. The method of claim 10, wherein the steps of outputting the first analog charge and outputting the second analog charge occur substantially simultaneously.

12. The method of claim 11, wherein the first analog charge and the second analog charge are output on a common output line thereby combining the first analog charge and the second analog charge.

13. A system for producing a variable analog wave, the system comprising:
a first transistor having a first source, a first drain, and a first floating gate;
a second transistor having a second source, a second drain, and a second floating gate;
a first capacitor having a first terminal and a second terminal, wherein the first terminal of the first capacitor is coupled to the first floating gate of first transistor;
a second capacitor having a first terminal and a second terminal, wherein the first terminal of the second capacitor is coupled to the second floating gate of the second transistor;
a first row programming switch having a first output, wherein the first output of the first row programming switch is coupled to the second terminal of the first capacitor and the second terminal of the second capacitor;
a second row programming switch having a first output, wherein the first output of the second row programming switch is coupled to the second terminal of the third capacitor;
a first column programming switch having a first output, wherein the first output of the first column programming switch is coupled to the first drain of the first transistor and the third drain of the third transistor;
a level shifter having a first output coupled to the first row programming switch, wherein the level shifter selects the first transistor coupled to the first row programming switch; and
a shift register having a first output coupled to the first row programming switch, wherein the shift register drives current from the selected transistor to a waveform output.

14. The system of claim 13 further comprising:
a third transistor having a third source, a third drain, and a third floating gate; and
a third capacitor having a first terminal and a second terminal, wherein the first terminal of the third capacitor is coupled to the third floating gate of the third transistor.

15. The system of claim 14 further comprising a second column programming switch having a first output, wherein the first output of the second column programming switch is coupled to the second drain of the second transistor.

* * * * *